United States Patent
McCorquodale et al.

(10) Patent No.: US 7,786,812 B2
(45) Date of Patent: Aug. 31, 2010

(54) OSCILLATORS HAVING REACTANCE-ADJUSTABLE FREQUENCY CONTROL

(75) Inventors: Michael Shannon McCorquodale, Ann Arbor, MI (US); Scott Michael Pernia, Pinckney, MI (US); Sundus Kubba, Saline, MI (US)

(73) Assignee: Mobius Microsystems, Inc., San Jose, CA (US)

( * ) Notice: Subject to any disclaimer, the term of this patent is extended or adjusted under 35 U.S.C. 154(b) by 0 days.

(21) Appl. No.: 12/258,216

(22) Filed: Oct. 24, 2008

(65) Prior Publication Data

US 2009/0167451 A1 Jul. 2, 2009

Related U.S. Application Data

(63) Continuation of application No. 11/232,407, filed on Sep. 20, 2005, now Pat. No. 7,456,699, which is a continuation-in-part of application No. 11/084,962, filed on Mar. 21, 2005, now Pat. No. 7,227,423, and a continuation-in-part of application No. 11/085,372, filed on Mar. 21, 2005, now Pat. No. 7,227,424, said application No. 11/084,962 , said application No. 11/085,372.

(60) Provisional application No. 60/555,193, filed on Mar. 22, 2004, provisional application No. 60/555,193, filed on Mar. 22, 2004.

(51) Int. Cl.
*H03L 7/06* (2006.01)
*H03L 1/00* (2006.01)
*H03L 1/02* (2006.01)

(52) U.S. Cl. .......................................... 331/18; 331/66

(58) Field of Classification Search ................... 331/34, 331/36 R, 36 C, 36 L, 65, 66, 117 R, 117 FE, 331/117 D, 175, 176, 177 R, 177 V, 179, 331/180, 181, 185, 186
See application file for complete search history.

(56) References Cited

U.S. PATENT DOCUMENTS

| 4,978,930 | A | | 12/1990 | Suter |
|---|---|---|---|---|
| 5,182,528 | A | * | 1/1993 | Zuta ............................ 331/1 A |
| 6,154,095 | A | * | 11/2000 | Shigemori et al. ............ 331/16 |
| 6,225,871 | B1 | | 5/2001 | Chien |
| 6,684,065 | B2 | | 1/2004 | Bult et al. |
| 6,803,829 | B2 | | 10/2004 | Duncan et al. |
| 6,898,721 | B2 | * | 5/2005 | Schmidt ..................... 713/322 |
| 7,098,748 | B2 | * | 8/2006 | Schmidt ..................... 331/176 |
| 7,227,423 | B2 | | 6/2007 | McCorquodale et al. |
| 7,227,424 | B2 | | 6/2007 | McCorquodale et al. |
| 7,456,699 | B2 | | 11/2008 | McCorquodale et al. |

* cited by examiner

*Primary Examiner*—David Mis
(74) *Attorney, Agent, or Firm*—Myers, Bigel et al.

(57) ABSTRACT

In various embodiments, the invention provides a frequency controller to control and provide a stable resonant frequency of a clock generator and/or a timing and frequency reference. Such stability is provided over variations in a selected parameter such as temperature and fabrication process variations. The various apparatus embodiments include a sensor adapted to provide a signal in response to at least one parameter of a plurality of parameters; and a frequency controller adapted to modify the resonant frequency in response to the second signal. In exemplary embodiments, the sensor is implemented as a current source responsive to temperature fluctuations, and the frequency controller is implemented as a plurality of controlled reactance modules which are selectively couplable to the resonator or to one or more control voltages. The controlled reactance modules may include fixed or variable capacitances or inductances, and may be binary weighted. Arrays of resistive modules are also provided, to generate one or more control voltages.

56 Claims, 28 Drawing Sheets

300

TEMPERATURE/BIAS DEPENDENCE $$I_{PTAT}^2 \approx \frac{2\beta_{14}^2}{\beta_{13}} V_T^2(T) \left[ \ln\left(\frac{\beta_{11}}{\beta_{12}}\right) \right]^2$$

$\beta = K'(W/L)$

K' UNITS = $(A/V^2)$

OSCILLATORS HAVING REACTANCE-ADJUSTABLE FREQUENCY CONTROL

CROSS-REFERENCE TO RELATED APPLICATIONS

This application is a continuation of and claims priority to U.S. patent application Ser. No. 11/232,407, filed Sep. 20, 2005, inventors Michael Shannon McCorquodale, Scott Michael Pernia, and Sundus Kubba, entitled "Frequency Controller for a Monolithic Clock Generator and Timing/Frequency Reference" (the "first related application"), which is a continuation-in-part of and claims priority to U.S. patent application Ser. No. 11/084,962, filed Mar. 21, 2005, inventors Michael Shannon McCorquodale, Scott Michael Pernia, and Amar Sarbbaseh Basu, entitled "Monolithic Clock Generator and Timing/Frequency Reference" (the "second related application"), which further claims priority to U.S. Provisional Patent Application Ser. No. 60/555,193, filed Mar. 22, 2004, inventor Michael Shannon McCorquodale, entitled "Monolithic and Top-Down Clock Synthesis with Micromachined Radio Frequency Reference" (the "third related application"), all of which are commonly assigned herewith, the contents of all and each of which are incorporated herein by reference with the same full force and effect as if set forth in their entireties herein, and with priority claimed for all commonly disclosed subject matter.

The first related application is also a continuation-in-part of and claims priority to U.S. patent application Ser. No. 11/085,372, filed Mar. 21, 2005, inventors Michael Shannon McCorquodale and Scott Michael Pernia, entitled "Transconductance and Current Modulation for Resonant Frequency Control and Selection" (the "fourth related application"), which is commonly assigned herewith, the contents of which are incorporated herein by reference with the same full force and effect as if set forth in its entirety herein, and with priority claimed for all commonly disclosed subject matter, and further claims priority to the second related application.

FIELD OF THE INVENTION

The present invention, in general, relates to oscillation or clocking signal generation, and more particularly, relates to a frequency controller for a clock signal generator and timing/frequency reference to provide frequency control in response to variation in ambient or operating temperature or variation in other parameters such as voltage, frequency, age, and fabrication process.

BACKGROUND OF THE INVENTION

Accurate clock generators or timing references have generally relied upon crystal oscillators, such as quartz oscillators, which provide a mechanical, resonant vibration at a particular frequency. The difficulty with such crystal oscillators is that they cannot be fabricated as part of the same integrated circuit ("IC") that is to be driven by their clock signal. For example, microprocessors such as the Intel Pentium processor require a separate clock IC. As a consequence, virtually every circuit requiring an accurate clock signal requires an off-chip clock generator.

There are several consequences for such non-integrated solutions. For example, because such a processor must be connected through outside circuitry (such as on a printed circuit board (PCB)), power dissipation is comparatively increased. In applications which rely on a finite power supply, such as battery power in mobile communications, such additional power dissipation is detrimental.

In addition, such non-integrated solutions, by requiring an additional IC, increase space and area requirements, whether on the PCB or within the finished product, which is also detrimental in mobile environments. Moreover, such additional components increase manufacturing and production costs, as an additional IC must be fabricated and assembled with the primary circuitry (such as a microprocessor).

Other clock generators which have been produced as integrated circuits with other circuits are generally not sufficiently accurate, particularly over fabrication process, voltage, and temperature ("PVT") variations. For example, ring, relaxation and phase shift oscillators may provide a clock signal suitable for some low-sensitivity applications, but have been incapable of providing the higher accuracy required in more sophisticated electronics, such as in applications requiring significant processing capability or data communications. In addition, these clock generators or oscillators often exhibit considerable frequency drift, jitter, have a comparatively low Q-value, and are subject to other distortions from noise and other interference.

As a consequence, a need remains for a clock generator or timing reference which may be integrated monolithically with other circuitry, as a single IC, and which is highly accurate over PVT variations. Such a clock generator or timing reference should be free-running and self-referencing, and should not require locking or referencing to another reference signal. Such a clock generator or timing reference should exhibit minimal frequency drift and have comparatively low jitter, and should be suitable for applications requiring a highly accurate system clock. Such a clock generator or timing reference should also provide multiple operating modes, including a clock mode, a reference mode, a power conservation mode, and a pulsed mode. Lastly, such a clock generator or timing reference should provide for control over output frequency, to provide a stable and desired frequency in response to variation in ambient or junction temperature or variation in other parameters such as voltage, fabrication process, frequency, and age.

SUMMARY OF THE INVENTION

In various exemplary embodiments, the invention provides a frequency controller and a temperature compensator for use in providing open-loop frequency control and selection for a low-jitter, free-running and self-referencing clock generator and/or a timing and frequency reference which is highly accurate over PVT and aging (time) variations and which can be integrated monolithically with other circuitry, to form a singular integrated circuit. No separate reference oscillator is required. The various exemplary embodiments of the invention include features for highly accurate frequency generation over fabrication process, voltage, and temperature ("PVT") variations. These features include frequency tuning and selection, and compensation for frequency variations which may be caused due to temperature and/or voltage fluctuations, fabrication process variations, and variations due to aging of the integrated circuitry.

The exemplary embodiments of the frequency controller of the present invention also provide several different levels and types of control. For example, both discrete and continuous control are provided, in real time, for control over output frequency of the free-running oscillator in light of such variations. In addition, such control is provided generally as an open-loop, without requiring or necessitating a feedback connection and without requiring continuous locking of the oscillator to another reference signal.

In addition, the various exemplary embodiments of the invention provide a clock generator and/or a timing and frequency reference having multiple operating modes, including modes such as a power conservation mode, a clock mode, a reference mode, and a pulsed mode. In addition, the various embodiments provide multiple output signals at different frequencies, and provide low-latency and glitch-free switching between these various signals.

Significantly, the various exemplary embodiments of the invention generate a significantly and comparatively high frequency, such as in the hundreds of MHz and GHz range, which is then divided to a plurality of lower frequencies. Each such division by "N" (a rational number, as a ratio of integers) results in a significant noise reduction, with phase noise reduced by N and phase noise power reduced by $N^2$. As a consequence, the various exemplary embodiments of the invention result in significantly less relative period jitter than other oscillators that generate their output directly or through frequency multiplications.

The various apparatus embodiments include a resonator, an amplifier, and a frequency controller, which may include various components or modules such as a temperature compensator, a process variation compensator, a voltage isolator and/or voltage compensator, an age (time) variation compensator, a frequency divider, and a frequency selector. The resonator provides a first signal having a resonant frequency. A temperature compensator adjusts the resonant frequency in response to temperature, and the process variation compensator adjusts the resonant frequency in response to fabrication process variation. In addition, the various embodiments may also include a frequency divider to divide the first signal having the resonant frequency into a plurality of second signals having a corresponding plurality of frequencies which are substantially equal to or lower than the resonant frequency; and a frequency selector to provide an output signal from the plurality of second signals. The frequency selector may further include a glitch-suppressor. The output signal may be provided in any of various forms, such as differential or single-ended, and substantially square-wave or sinusoidal.

The exemplary embodiments of the present invention provide an apparatus for frequency control of an integrated, free-running harmonic oscillator, comprising a resonator adapted to provide a first signal having a resonant frequency; a sensor adapted to provide a second signal, such as a control voltage, in response to at least one parameter of a plurality of parameters; and a frequency controller coupled to the sensor and couplable to the resonator, with the frequency controller adapted to modify a reactance element coupled to the resonator in response to the second signal to modify the resonant frequency. The plurality of parameters are variable and comprise at least one of the following parameters: temperature, fabrication process, voltage, frequency, and age (i.e., elapsed time).

In the exemplary embodiments, the frequency controller is further adapted to modify an effective reactance or impedance element coupled to the resonator in response to the second signal, such as modifying a total capacitance of the resonator in response to the second signal, coupling to the resonator or decoupling from the resonator a fixed or variable capacitance, modifying an effective reactance of the resonator by varying or switching a varactor to a selected control voltage, or equivalently, modifying an inductance or resistance of the resonator in response to the second signal, such as by coupling to the resonator or decoupling from the resonator a fixed or variable inductance or resistance. In other embodiments, differentially weighted or sized reactances, such as variable capacitors (varactors), may be switched to or from the resonator, switched to or from a plurality of different, selectable control voltages, or both. For example, in selected embodiments, the reactance of one or more variable capacitors which are coupled to the resonator may be varied by switching the one or more variable capacitors to a selected control voltage, of a plurality of control voltages, resulting in differently or differentially-weighted effective reactances coupled to the resonator.

For example, a plurality of fixed capacitances (having different, binary weighted or otherwise differentially-weighted capacitances), may be coupled to the resonator to provide a discrete level of frequency control, and a varactor coupled to the resonator may be provided with a selected control voltage, of a plurality of control voltages, which varies in response to temperature, which may be utilized to maintain a constant frequency over such temperature fluctuations, and which provides a continuous level of frequency control. In addition, any of such control voltages may either vary in response to a selected parameter, such as temperature, or may be constant with respect to such a parameter. The differing weights of the various reactances utilized may be embodied in a plurality of forms, such as binary weighted, linearly weighted, or weighted utilizing any other desirable scheme, all of which are considered equivalent and within the scope of the present invention.

It should be noted that the terms "fixed" and "variable" are utilized as known in the art, with "fixed" being understood to mean configured generally to be non-varying with respect to a selected parameter, and "variable" meaning configured generally to be varying with respect to the selected parameter. For example, a fixed capacitor generally means that its capacitance does not vary as a function of an applied voltage, while a variable capacitor (varactor) will have a capacitance which does vary as a function of applied voltage. Both, however, may have and generally will have capacitances which vary as a function of fabrication process variation. In addition, a fixed capacitor may be formed as a varactor coupled to a constant voltage, for example. Those of skill in the art will recognize these various circumstances and contexts, as illustrated and as discussed below, and what is meant when such terms are utilized.

In the exemplary embodiments, the frequency controller may further comprise: a coefficient register adapted to store a first plurality of coefficients; and a first array having a plurality of switchable capacitive modules coupled to the coefficient register and couplable to the resonator, each switchable capacitive module having a fixed capacitance and a variable capacitance, each switchable capacitive module responsive to a corresponding coefficient of the first plurality of coefficients to switch between the fixed capacitance and the variable capacitance and to switch each variable capacitance to a control voltage. The plurality of switchable capacitive modules may be binary-weighted. The frequency controller may further comprise a second array having a plurality of switchable resistive modules coupled to the coefficient register and further having a capacitive module, the capacitive module and the plurality of switchable resistive modules further coupled to a node to provide the control voltage, with each switchable resistive module responsive to a corresponding coefficient of a second plurality of coefficients stored in the coefficient register to switch the switchable resistive module to the control voltage node. In selected embodiments, the sensor further comprises a current source responsive to temperature, wherein the current source is coupled through a current mirror to the second array to generate the control voltage across at least one switchable resistive module of the plurality of switchable resistive modules. Also in selected embodiments, the current source has at least one complementary to absolute temperature ("CTAT") configuration, proportional to absolute temperature ("PTAT") configuration, proportional to absolute temperature squared ("PTAT$^2$") configuration, or combinations of these configurations. In addition, each switchable resistive module of the plurality of switchable resistive modules has a different temperature response for a selected current.

In other exemplary embodiments, the sensor is a parameter (temperature, process, voltage, age, etc.) sensor and varies the second signal in response to variation of the selected parameter; for example, the sensor may be a temperature or voltage sensor and varies the second signal in response to temperature or voltage variation. The selected embodiments may also include an analog-to-digital converter coupled to the sensor to provide a digital output signal in response to the second signal, and a control logic block to convert the digital output signal to the first plurality of coefficients.

In other exemplary embodiments, the frequency controller further comprises a process variation compensator couplable to the resonator and adapted to modify the resonant frequency in response to a fabrication process parameter of the plurality of parameters. The process variation compensator may further comprise a coefficient register adapted to store a plurality of coefficients; and an array having a plurality of binary-weighted switchable capacitive modules coupled to the coefficient register and to the resonator, each switchable capacitive module having a first fixed capacitance and a second fixed capacitance, with each switchable capacitive module responsive to a corresponding coefficient of the plurality of coefficients to switch between the first fixed capacitance and the second fixed capacitance. In other exemplary embodiments, the process variation compensator may further comprise a coefficient register adapted to store a plurality of coefficients; and an array having a plurality of switchable variable capacitive modules coupled to the coefficient register and to the resonator, each switchable variable capacitive module responsive to a corresponding coefficient of the plurality of coefficients to switch between a first voltage and a second voltage, such as switching to a selected control voltage.

In other exemplary embodiments, frequency controller further comprises a coefficient register adapted to store a first plurality of coefficients; and a first array having a plurality of switchable, capacitive modules coupled to the coefficient register and couplable to the resonator, each switchable capacitive module having a variable capacitance, each switchable capacitive module responsive to a corresponding coefficient of the first plurality of coefficients to switch the variable capacitance to a selected control voltage of a plurality of control voltages. In other exemplary embodiments, the process variation compensator may further comprise a coefficient register adapted to store at least one coefficient; and at least one switchable variable capacitive module coupled to the coefficient register and to the resonator, which is responsive to the at least one coefficient to switch to a selected control voltage. The sensor may comprises a current source responsive to temperature, and the frequency controller may also include a second array having a plurality of resistive modules coupled through a current mirror to the current source, the plurality of resistive modules adapted to provide the plurality of control voltages, and wherein each resistive module of the plurality of resistive modules has a different response to temperature and is adapted to provide a corresponding control voltage, of the plurality of control voltages, in response to a current from the current source.

In other exemplary embodiments, an apparatus for frequency control of a resonator comprises a coefficient register adapted to store a first plurality of coefficients; and a first array having a plurality of switchable reactance or impedance modules coupled to the coefficient register and to the resonator, each switchable reactance module responsive to a corresponding coefficient of the first plurality of coefficients to switch a corresponding reactance to modify the resonant frequency. The corresponding reactance or impedance may be a fixed or variable inductance, a fixed or variable capacitance, a fixed or variable resistance, or any combination thereof. The corresponding reactance may be switched to the resonator or, when coupled to the resonator, may be switched to a control voltage, a power supply voltage or a ground potential, and the control voltage may be determined by a current source responsive to temperature. For example, the corresponding reactance is variable and is coupled to the resonator and switched to a selected control voltage of a plurality of control voltages. In selected embodiments, the first plurality of coefficients are calibrated or are determined by a sensor responsive to at least one parameter of a plurality of variable parameters, such as temperature, fabrication process, voltage, frequency and age.

In other exemplary embodiments, an apparatus for frequency control of an integrated, free-running harmonic oscillator comprises: a plurality of resistive modules adapted to generate a plurality of control voltages; a plurality of controlled reactance modules coupled to the harmonic oscillator; and a plurality of switches coupled to the plurality of resistive modules and to the plurality of controlled reactance modules, with the plurality of switches responsive to a control signal to couple a first control voltage of the plurality of control voltages to a first controlled reactance module of the plurality of controlled reactance modules to modify a resonant frequency of the harmonic oscillator.

As illustrated above, the apparatus may also include a current source coupled to the plurality of resistive modules, with the current source adapted to provide a parameter-dependent current to at least one resistive module of the plurality of resistive modules to generate at least one control voltage, of the plurality of control voltages, which is parameter-dependent. In other embodiments, the current source is adapted to provide a substantially parameter-independent current to at least one resistive module of the plurality of resistive modules to generate at least one control voltage, of the plurality of control voltages, which is substantially parameter-independent. Depending upon the exemplary embodiment, each switchable resistive module of the plurality of switchable resistive modules may have a different temperature response for a selected current. As a consequence, when the parameter is temperature, at least one control voltage of the plurality of control voltages is temperature-dependent and at least one control voltage of the plurality of control voltages is substantially temperature-independent.

The exemplary apparatus may also comprise a coefficient register coupled to the plurality of switches and adapted to store a first plurality of coefficients, wherein the control signal is provided by at least one coefficient of the first plurality of coefficients. The plurality of controlled reactance modules may further comprise a plurality of differentially (e.g., binary) weighted fixed capacitances and variable capacitances, and wherein the plurality of switches are responsive to the first plurality of coefficients to couple a fixed capacitance to the harmonic oscillator and to couple a first control voltage of the plurality of control voltages to a variable capacitance coupled to the harmonic oscillator. The plurality of resistive modules may further comprise a plurality of switchable resistive modules coupled to the coefficient register and a capacitive module, the capacitive module and the plurality of switchable resistive modules further coupled to a node to provide the first control voltage, with each switchable resistive module responsive to a corresponding coefficient of a second plurality of coefficients stored in the coefficient register to switch the switchable resistive module to the control voltage node.

In exemplary embodiments, an analog-to-digital converter may be coupled to the plurality of switchable resistive modules to provide a digital output signal in response to the first control voltage, to, for example, convert a temperature-dependent current (as a sensor) to a digital form; and a control logic block to convert the digital output signal to the first plurality of coefficients or to the control signal.

Also in exemplary embodiments, the plurality of controlled reactance modules further comprise: a plurality of switchable capacitive modules coupled to the coefficient register and couplable to the harmonic oscillator, with each switchable capacitive module having a variable capacitance, and with each switchable capacitive module responsive to a corresponding coefficient of the first plurality of coefficients to switch the variable capacitance to a selected control voltage of the plurality of control voltages. Depending upon the embodiment, a current source which is responsive to a parameter of a plurality of variable parameters is coupled through a current mirror to the plurality of resistive modules; wherein each resistive module of the plurality of resistive modules has a different response to the parameter and is adapted to provide a corresponding control voltage, of the plurality of control voltages, in response to a current from the current source. Depending upon the embodiment, at least one control voltage of the plurality of control voltages is substantially parameter-dependent and at least one control voltage of the plurality of control voltages is substantially parameter-independent.

Also in exemplary embodiments, the plurality of controlled reactance modules further comprise: a plurality of differentially-weighted switchable capacitive modules coupled to the coefficient register and to the harmonic oscillator, each switchable capacitive module having a first fixed capacitance and a second fixed capacitance, each switchable capacitive module responsive to a corresponding coefficient of the plurality of coefficients to switch between the first fixed capacitance and the second fixed capacitance. In other embodiments, the plurality of controlled reactance modules further comprise: a plurality of switchable variable capacitive modules coupled to the coefficient register and to the harmonic oscillator, each switchable variable capacitive module responsive to a corresponding coefficient of the plurality of coefficients to switch between a first voltage and a second voltage of a plurality of control voltages. And in other embodiments, the plurality of controlled reactance modules further comprise: a plurality of switchable variable capacitive modules coupled to the coefficient register and to the harmonic oscillator, each switchable variable capacitive module responsive to a corresponding coefficient of the plurality of coefficients to switch to a selected control voltage of a plurality of control voltages, the plurality of control voltages comprising a plurality of different magnitude voltages, and wherein the selected control voltage is substantially constant over temperature variations.

Also in exemplary embodiments, the apparatus may further comprise: a plurality of switchable resistors responsive to a control signal to switch a corresponding resistance to the harmonic oscillator to modify the resonant frequency. The apparatus may include a voltage divider coupled to the plurality of controlled reactance modules and adapted to provide a selected control voltage responsive to voltage variations. In addition, an age variation compensator may be coupled to the resonator and adapted to compare a current value of a selected parameter of the plurality of parameters to an initial value of the selected parameter and to modify the resonant frequency in response to a difference between the current value and the initial value of the selected parameter.

Numerous other exemplary embodiments are illustrated and described in detail below, and include additional modulators and compensators for voltage variations and age (IC lifetime) variations The present invention may also include a mode selector coupled to the frequency selector, wherein the mode selector is adapted to provide a plurality of operating modes, which may be selected from a group comprising a clock mode, a timing and frequency reference mode, a power conservation mode, and a pulsed (or pulse) mode.

For a reference mode, the invention may also include a synchronization circuit coupled to the mode selector; and a controlled oscillator coupled to the synchronization circuit and adapted to provide a third signal; wherein in the timing and reference mode, the mode selector is further adapted to couple the output signal to the synchronization circuit to control timing and frequency of the third signal. Such a synchronization circuit may be a delay-locked loop, a phase-locked loop, or an injection locking circuit.

These and additional embodiments are discussed in greater detail below. Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings and examples which form a portion of the specification, wherein like reference numerals are used to identify identical or similar components in the various views, in which.

DETAILED DESCRIPTION OF THE EXEMPLARY EMBODIMENTS

Figure 1:
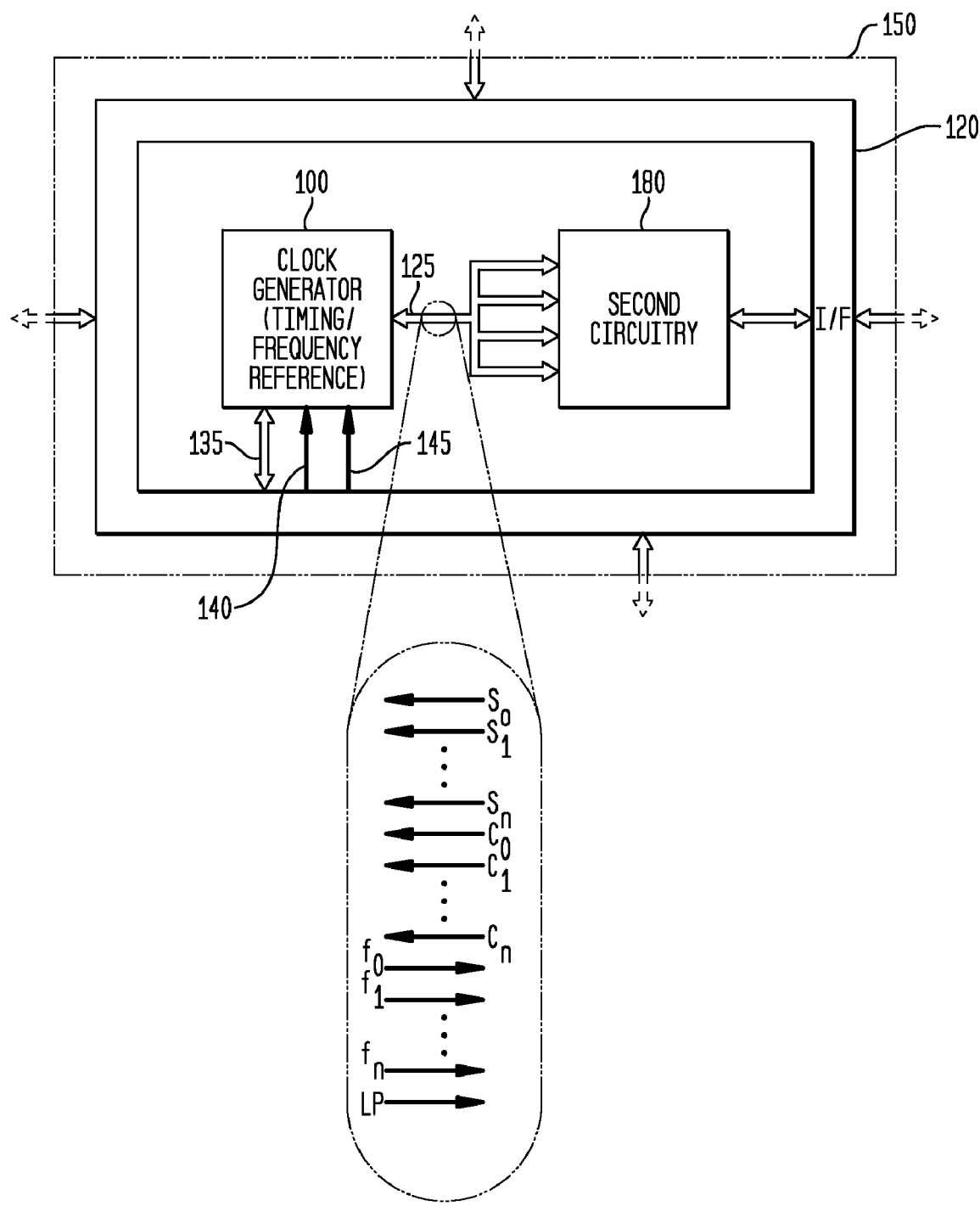
FIG. 1 (or "FIG. 1") is a block diagram illustrating an exemplary system embodiment in accordance with the teachings of the present invention.

While the present invention is susceptible of embodiment in many different forms, there are shown in the drawings and will be described herein in detail specific examples and embodiments thereof, with the understanding that the present disclosure is to be considered as an exemplification of the principles of the invention and is not intended to limit the invention to the specific examples and embodiments illustrated.

As indicated above, the various embodiments of the invention provide numerous advantages, including the ability to integrate a highly accurate (over PVT and age), low-jitter, free-running and self-referencing clock generator and/or a timing and frequency reference with other circuitry, such as illustrated in FIG. 1. FIG. 1 is a block diagram illustrating an exemplary system embodiment 150 in accordance with the teachings of the present invention. As illustrated in FIG. 1, the system 150 is a single integrated circuit, having a clock generator and/or timing/frequency reference 100 of the present invention integrated monolithically with other, or second, circuitry 180, together with interface (I/F) (or input/output (I/O) circuitry) 120. The interface 120 will generally provide power, such as from a power supply (not illustrated), ground, and other lines or busses to the clock generator 100, such as for calibration and frequency selection. As illustrated, one or more output clock signals are provided on bus 125, as a plurality of frequencies, such as a first frequency ($f_0$), a second frequency ($f_1$), and so on, through an $(n+1)^{th}$ frequency ($f_n$). In addition, a power conservation mode (or low power mode (LP)) is provided (also on bus 125). The second circuitry 180 (or the I/F 120) may also provide input into the clock generator 100, such as through selection signals ($S_0$, $S_1$, through $S_n$), and one or more calibration signals ($C_0$, $C_1$, through $C_n$). Alternatively, the selection signals ($S_0$, $S_1$, through $S_n$) and one or more calibration signals ($C_0$, $C_1$, through $C_n$) may be provided directly to the clock generator 100 through the interface 120, such as on bus 135, along with power (on line 140) and ground (on line 145).

The clock generator and/or timing/frequency reference 100, in addition to a low power mode, has additional modes discussed in greater detail below. For example, in a clock mode, the apparatus 100 will provide one or more clock signals, as output signals, to the second circuitry 180. The second circuitry 180 may be any type or kind of circuitry, such as a microprocessor, a digital signal processor ("DSP"), a radio-frequency circuit, for example, or any other circuit which could utilize the one or more output clock signals. Also for example, in a timing or frequency reference mode, the output signal from the apparatus 100 may be a reference signal, such as a reference signal for synchronization for a second oscillator. As a consequence, the terminology clock generator and/or timing/frequency reference will be utilized interchangeably herein, with the understanding that the clock generator will also generally provide a square-wave signal, which may or may not be provided with a timing/frequency reference, which may utilize a substantially sinusoidal signal instead. In addition, as discussed in greater detail below, the various embodiments of the invention also provided a pulsed mode, in which the output signal from clock generator and/or timing/frequency reference 100 is provided in bursts or intervals, for increased instruction processing efficiency and lower power consumption, for example.

Figure 15B:
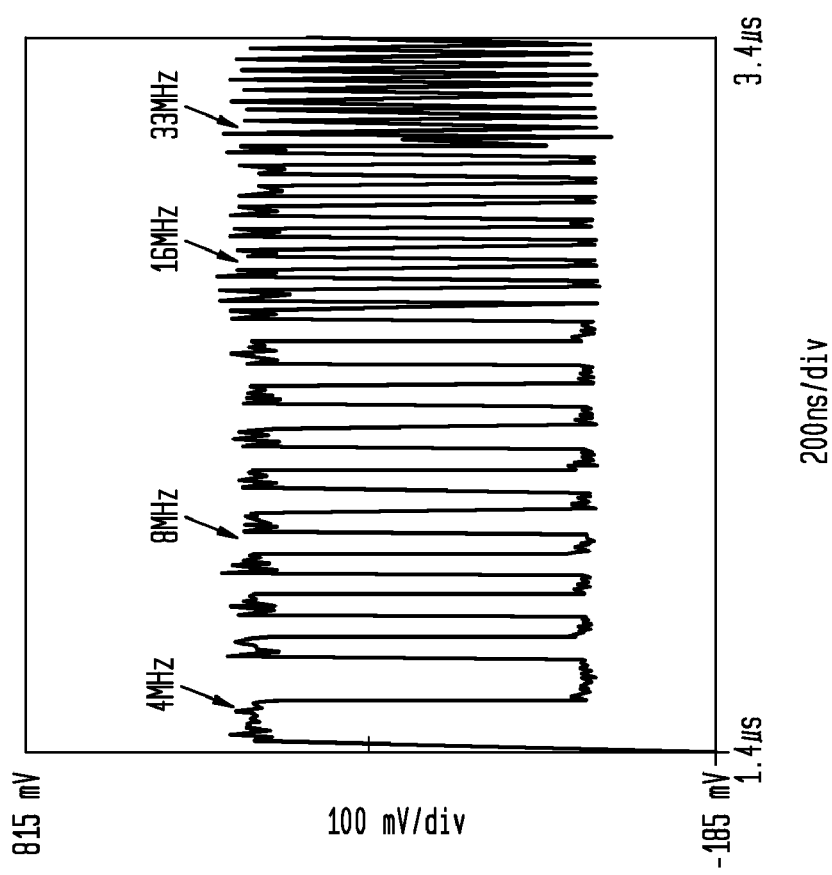
FIG. 15 (or "FIG. 15") is a graphical diagram illustrating exemplary low latency frequency switching in accordance with the teachings of the present invention.
Figure 15A:
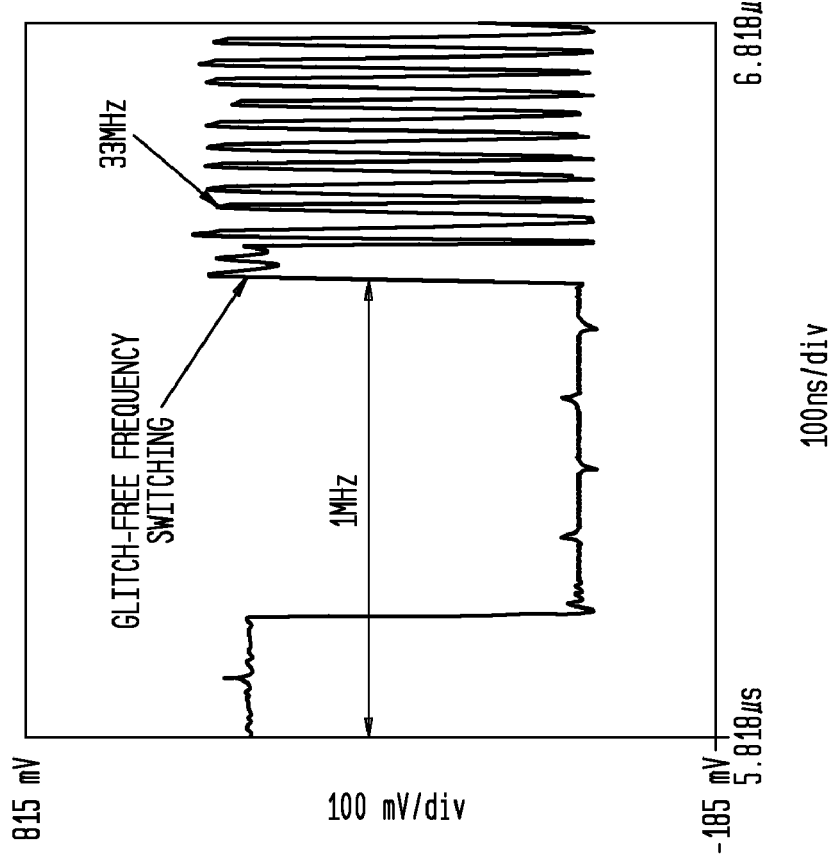

It should be noted that the various signals, voltages, parameter-independent current sources, and so on, are referred to as "substantially" sinusoidal or square-wave signals, substantially constant control voltages, or substantially parameter-independent voltages or currents, for example. This is to accommodate the various fluctuations, noise sources and other distortions introduced which may cause such signals, voltages or currents to differ in practice from the more ideal depictions found in textbooks. For example, as discussed in greater detail below, exemplary "substantially" square-wave signals are depicted in FIGS. 15A and 15B, and exhibit a variety of distortions, such as undershoots, overshoots, and other variations, and are nonetheless considered to be very high quality square-waves in practice.

Several important features of the present invention are in system 150. First, a highly accurate, low-jitter, free-running and self-referencing clock generator 100 is integrated monolithically with other (second) circuitry 180, to form a singular integrated circuit (system 150). This is in sharp contrast with the prior art, in which a reference oscillator is used to provide a clock signal, such as a crystal reference oscillator, which cannot be integrated with other circuitry and is off-chip, as a second and separate device which must be connected through a circuit board to any additional circuitry. For example, in accordance with the present invention, the system 150, including clock generator 100, may be fabricated with other, second circuitry using conventional CMOS (complementary metal oxide semiconductor), BJT (bipolar junction transistor), BiCMOS (bipolar and CMOS), or other fabrication technologies utilized in modern IC manufacturing.

Second, no separate reference oscillator is required. Rather, in accordance with the invention, the clock generator 100 is self-referencing and free-running, such that it is not referenced to or locked to another signal, such as being synchronized in a phase locked loop ("PLL"), delay locked loop ("DLL"), or via injection locking to a reference signal, which is typical of the prior art.

Third, the clock generator 100 provides a plurality of output frequencies and a power conservation mode, such that frequencies may be switched with low latency and in a glitch-free manner. For example, second circuitry 180 may shift to a power conservation mode, such as a battery or lower frequency mode, and request (through selection signals) a lower clock frequency for minimizing power consumption, or request a low power clock signal to enter a sleep mode. As discussed in greater detail below, such frequency switching is provided with substantially negligible latency, with low latency introduced for glitch prevention (in proportion to the number of glitch prevention stages utilized), using a merely a handful of clock cycles, rather than the thousands of clock cycles required to change the output frequency from a PLL/DLL.

In addition, given the significantly high available output frequencies of the clock generator and/or timing/frequency reference 100 discussed below, new operating modes are available. For example, clock start-up times are effectively or substantially negligible, allowing the clock generator and/or timing/frequency reference 100 to be repeatedly started and stopped, such as turned off entirely or to be pulsed for power conservation. For example, rather than running continuously as a clock, the clock generator and/or timing/frequency reference 100 can be operated in comparatively short, discrete intervals or bursts (i.e., pulsed), periodically or non-periodically, for instruction processing by a second circuit 180, such as a processor. As discussed in greater detail below, with the rapid start-up time, such pulsed operation provides a power savings, as more instructions (million instructions per second or MIPS) are processed per milliwatt (mW) of power consumption. In addition, such a pulsed mode may also be utilized to periodically synchronize a second clock or oscillator, in addition to other uses. As a consequence, the clock generator and/or timing/frequency reference 100 (and the other embodiments discussed below) has a plurality of operating modes, including a clock mode, a timing and/or frequency reference mode, a power conservation mode, and a pulsed mode.

Fourth, as discussed in greater detail below, the clock generator and/or timing/frequency reference 100 includes features for highly accurate frequency generation over fabrication process, voltage, temperature ("PVT") and age variations. These features include frequency tuning and selection, and compensation for frequency variations which may be caused due to temperature and/or voltage fluctuations, fabrication process variations, and IC aging.

Fifth, the clock generator and/or timing/frequency reference 100 generates a significantly and comparatively high frequency, such as in the hundreds of MHz and GHz range, which is then divided to a plurality of lower frequencies. Each such division by "N" (a rational number, as a ratio of integers) results in a significant noise reduction, with phase noise reduced by N and phase noise power reduced by $N^2$. As a consequence, the clock generator of the present invention results in significantly less relative period jitter than available with other oscillators that generate their output directly or through frequency multiplication.

Figure 2:
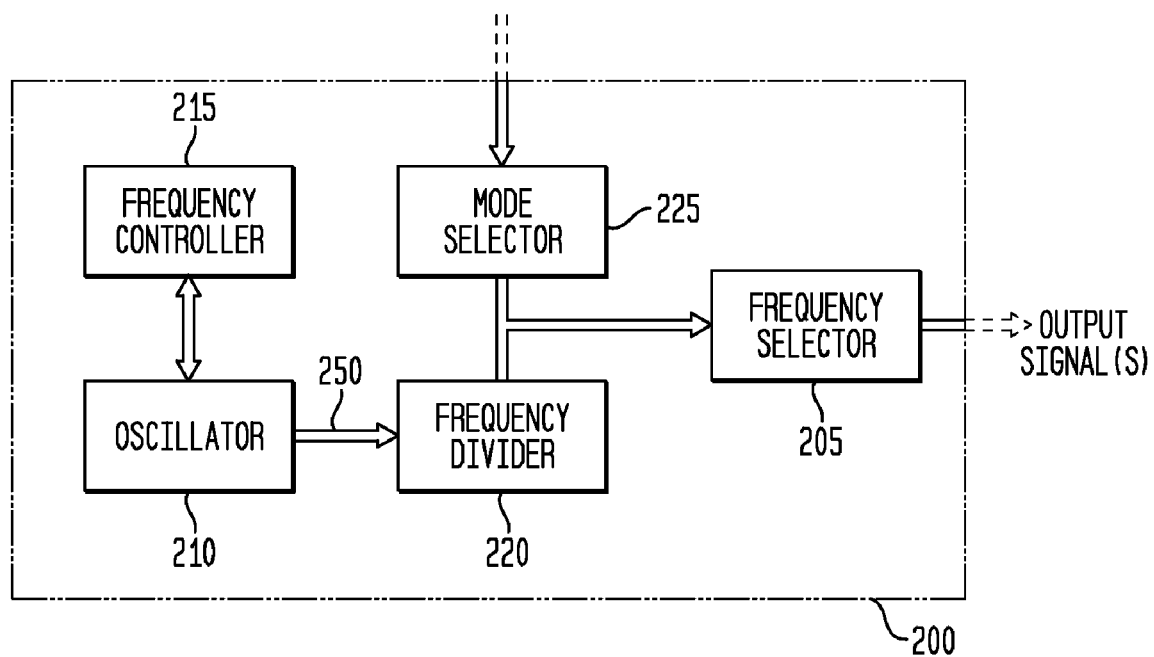
FIG. 2 (or "FIG. 2") is a block diagram illustrating a first exemplary apparatus embodiment in accordance with the teachings of the present invention.

These features are illustrated in greater detail in FIG. 2, which is a block diagram illustrating a first exemplary apparatus 200 embodiment, including a frequency controller 215 in accordance with the teachings of the present invention. As illustrated in FIG. 2, the apparatus 200 is a clock generator and/or timing/frequency reference, providing one or more output signals, such as a clock or reference signal having any of a plurality of frequencies, selected using frequency selector 205. The apparatus (or clock generator) 200 includes an oscillator 210 (having a resonant element), a frequency controller 215, a frequency divider 220, a mode selector 225, and the frequency selector 205 mentioned above. In accordance with the invention, the oscillator 210 generates a signal having a comparatively high frequency, $f_0$. Due to PVT or age variations mentioned above, the frequency controller 215 is utilized to frequency select or tune the oscillator 210, such that the oscillation frequency $f_0$ is selectable from a plurality of potential oscillation frequencies, i.e., the frequency controller 215 provides for output signals having frequencies which are accurate over PVT and age variations.

For example, given these PVT variations, the output frequency from an oscillator, such as oscillator 210, may vary plus or minus 5%. For some applications, such as those utilizing ring oscillators, such frequency variability may be acceptable. In accordance with the present invention, however, greater accuracy for the clock generator 200 is desirable, particularly for more sensitive or complex applications, such as providing clock signals for integrated microprocessors, microcontrollers, digital signal processors, communication controllers, and so on. As a consequence, frequency controller 215 is utilized to adjust for these PVT variations, such that the output frequency from the oscillator is the selected or desired frequency $f_0$ with much less variance by several orders of magnitude, such as ±0.25% or less, and having a comparatively low-jitter.

Various exemplary embodiments of the frequency controller 215, in accordance with the teachings of the present invention, are illustrated in detail below. For example, referring to FIG. 21, which is a block diagram illustrating an exemplary frequency controller 1415 and apparatus 1400 in accordance with the teachings of the present invention, an oscillator (resonator 310 and sustaining amplifier 305) provides a first output signal having a resonant frequency $f_0$. The exemplary frequency controller 1415 is coupled to the oscillator and modifies the resonant frequency $f_0$ in response to a second signal, such as a second signal provided by one or more sensors 1440. The exemplary frequency controller 1415 comprises one of more of the following components: transconductance modulator 1420, variable parameter modulator (or controller) 1425 (such as one or more of the controlled capacitance or controlled reactance modules discussed below), process (or other parameter) modulator (or compensator) 1430, voltage compensator 1455, coefficient register(s) 1435, and potentially also an age variation compensator 1460. Depending upon the selected embodiment, the frequency controller 1415 may also include one or more sensor(s) 1440, analog-to-digital (A/D) converter ("ADC") 1445, and control logic block 1450. For example, a temperature-dependent current source, I(T) (or, more generally, yI(x)) generator 415 illustrated in FIG. 4 effectively functions as a temperature sensor in accordance with the present invention, providing a corresponding output current which varies as a function of ambient or junction temperature. Such a temperature-dependent output current may be converted into a digital signal by A/D converter (ADC) 1445, and utilized to provide corresponding coefficients (stored in registers 1435) utilized by the various modulators or compensators 1420, 1425, 1430, 1455 and 1460 of the frequency controller 1415, to control the resonant (or output) frequency $f_0$ in light of various parameters, such as a variable operating temperature or variable fabrication processes. In other illustrated embodiments, such a temperature-dependent output current is provided directly (as a second signal, without intervening A/D conversion) to the various modulators, such as to transconductance modulator 1420 and to variable parameter modulator (or controller) 1425. These modulators, in turn, modify the resonant frequency $f_0$ through, for example, modifying the current through the resonator 310 and sustaining amplifier 305, or modifying the effective reactance or impedance (e.g., capacitance, inductance or resistance) coupled to and effectively forming part of the resonator 310. For example, the effective reactance (or impedance) may be modified by coupling to or decoupling from the resonator 310 fixed or variable capacitances, or modifying the magnitudes of one or more reactances coupled to the resonator, such as by modifying a control voltage or other continuous control parameter.

In the various illustrated embodiments discussed below, the transconductance modulator 1420 and variable parameter modulator (or controller) 1425 are generally implemented to utilize a temperature parameter, such that a substantially stable resonant frequency $f_0$ is provided over variations in operating temperature. It will be understood by those of skill in the art that these modulators may be implemented to provide a substantially stable resonant frequency $f_0$ as a function or in response to other variable parameters, such as variations due to fabrication process, voltage variations, aging, and other frequency variations.

Referring again to FIG. 2, to improve performance and decrease jitter (noise) and other interference, instead of generating a low frequency output and multiplying it up to a higher frequency, as is typically done using PLLs and DLLs, the present invention generates a comparatively high frequency output, $f_0$, which is then divided to one or more lower frequencies ($f_1$ through $f_n$), using frequency divider 220. Clock signals having one or more of the plurality of frequencies from frequency divider 220 may then be selected, using frequency selector 205. As indicated above, such frequency selection is provided glitch-free and with low latency, providing comparatively and significantly fast and glitch-free frequency switching. In addition, a plurality of operating modes are provided, using mode selector 225.

Figure 3:
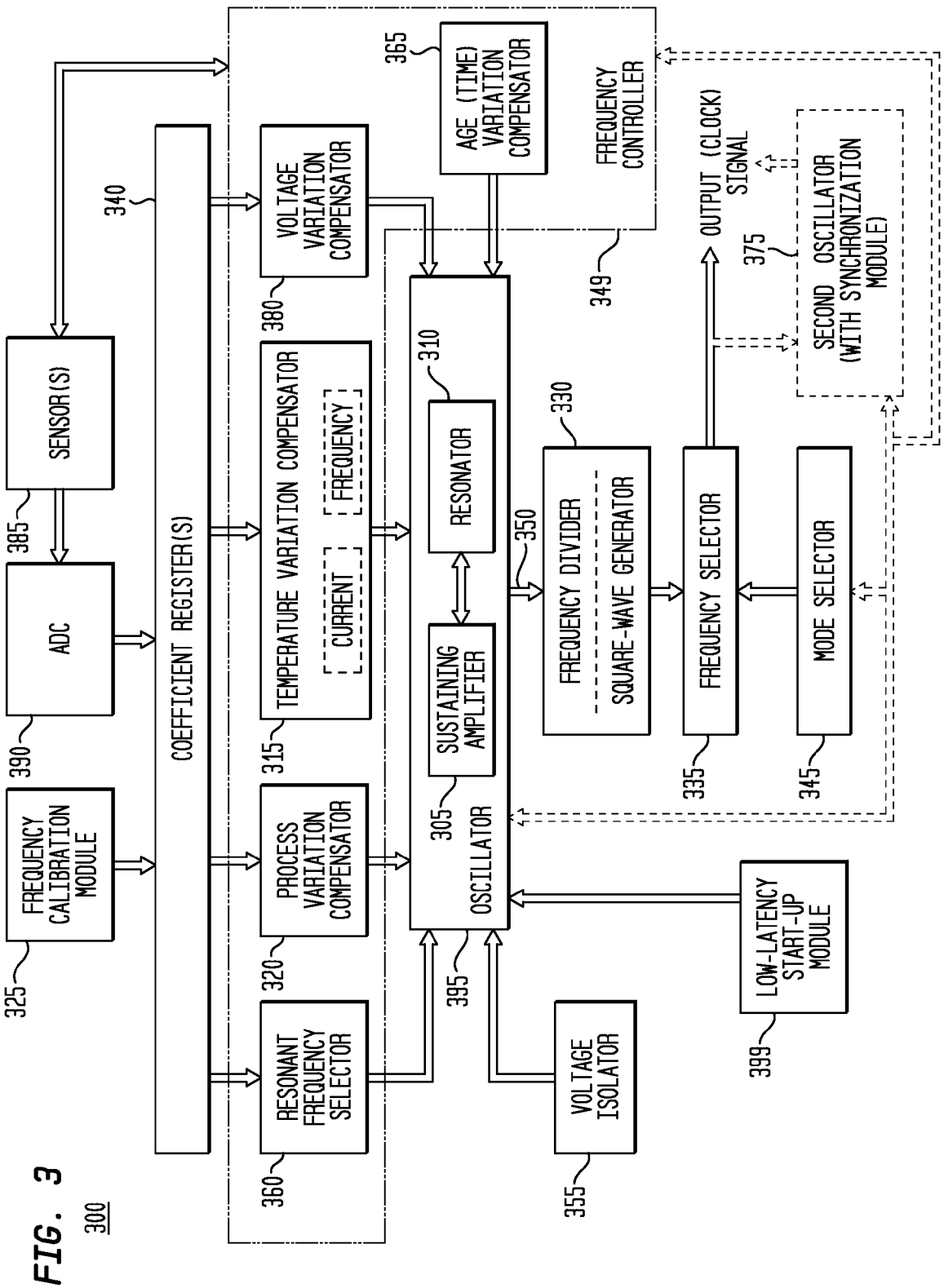
FIG. 3 (or "FIG. 3") is a block diagram illustrating a second exemplary apparatus embodiment in accordance with the teachings of the present invention.

FIG. 3 is a block diagram illustrating in greater detail a second exemplary apparatus embodiment, as clock generator and/or timing/frequency reference 300, in accordance with the teachings of the present invention. Referring to FIG. 3, clock generator and/or timing/frequency reference 300 comprises a resonator 310 and a sustaining amplifier 305 (forming an oscillator 395), a temperature compensator (or modulator) 315, a process variation compensator (or modulator) 320, a frequency calibration module 325, a voltage variation compensator (or modulator) 380, an age (time) variation compensator (or modulator) 365, one or more coefficient registers 340, and depending on the selected embodiments, may also include a sensor(s) 385, an analog-to-digital converter ("ADC") 390, frequency divider and square wave generator 330, a voltage isolator 355, a resonant frequency selector 360, an output frequency selector 335, a mode selector 345, and a low-latency start-up module 399. The sustaining amplifier 305, temperature compensator 315, process variation compensator 320, voltage isolator 355, voltage variation compensator 380, age variation compensator 365, resonant frequency selector 360, and frequency calibration module 325 are often included within a frequency controller, such as frequency controller 349 (or 215 or 1415). Alternatively, the sustaining amplifier 305 and resonator 310 may be considered to comprise an oscillator 395, with one or more of the various controller elements (e.g., temperature compensator 315, process variation compensator 320, voltage isolator 355, voltage variation compensator 380, age variation compensator 365, resonant frequency selector 360, sensor(s) 385, ADC 390, and frequency calibration module 325) included within a frequency controller 349 (or 215 or 1415). It should also be noted that the square-wave generator (of 330) may not be needed in timing or frequency reference embodiments.

The resonator 310 may be any type of resonator which stores energy, such as an inductor (L) and a capacitor (C) coupled to form an LC-tank, where the LC-tank has a selected configuration of a plurality of LC-tank configurations, or is otherwise electrically or electromechanically equivalent to or otherwise typically represented in the art as an inductor coupled to a capacitor. Such an LC-resonator is illustrated as resonator 405 in FIG. 4. In addition to LC resonators, other resonators are considered equivalent and within the scope of the present invention; for example, the resonator 310 may be a ceramic resonator, a mechanical resonator (e.g., XTAL), a microelectromechanical ("MEMS") resonator, or a film bulk acoustic resonator. In other cases, various resonators may be represented by electrical or electromechanical analogy as LC resonators, and are also within the scope of the present invention. In exemplary embodiments, an LC-tank has been utilized as a resonator, to provide for a high Q-value for a completely integrated solution.

The sustaining amplifier 305 provides for both start-up and sustaining amplification for the resonator 310. The temperature compensator 315 provides frequency control for the resonator 310, to adjust the oscillation frequency based on variations due to temperature. In selected embodiments, depending upon the degree of control desired or required, the temperature compensator 315 may include control over both current and frequency, as illustrated below for selected embodiments. For example, the temperature compensator 315 may comprise one or both of a transconductance modulator 1420 and variable parameter modulator 1425 of FIG. 21, with both modulators 1420 and 1425 embodied to be responsive to temperature fluctuations. Similarly, the process variation compensator 320 provides frequency control for the resonator 310, to adjust the oscillation frequency based on process variations inherent in semiconductor fabrication technologies, both process variations within a given foundry (e.g., batch or run variations, variations within a given wafer, and die-to-die variations within the same wafer) and process variations among different foundries and foundry processes (e.g., 130 nm and 90 nm processes)). Voltage variation compensator 380 may be utilized to maintain a stable output frequency over supply voltage variations and other voltage variations. Age variation compensator 365 may be utilized to maintain a stable output frequency as the IC ages, with corresponding variations in circuit elements occurring over time. Frequency calibration module 325 is utilized to fine-tune and select the desired output frequency, $f_0$, from among a plurality of oscillation frequencies which may occur in resonator 310, i.e., to select the output frequency $f_0$ from a plurality of available or potential frequencies. In selected embodiments, coefficient registers 340 are utilized to store coefficient values utilized in the various exemplary compensator and calibration embodiments, discussed in greater detail below.

As mentioned above, the frequency controller 349, in selected embodiments, may also include one of more sensors 385 and analog-to-digital converter (ADC) 390. In addition, many of the other compensators and modulators of the frequency controller include components which function as sensors, such as temperature-dependent current sources and other voltage variation detectors. In addition to being utilized to generate various pluralities of stored coefficients which provide control to various switching elements, to both switch controlled reactance modules (discussed below) to the resonator 310 (as a discrete form of control) and to vary the amount of effective reactance supplied by a coupled or switched reactance to the resonator 310 (a continuous form of control), the various sensors, compensators and modulators may also be utilized to provide other forms of continuous control over the resonant frequency of the resonator 310. The various continuous outputs from sensors, current generators, control voltages, etc., as illustrated and discussed below, function as control signals within the scope of the present invention. For example, the various control voltages, which may vary with a selected parameter (e.g., temperature) or which may be constant with respect to a selected parameter, function as control signals which are used to modify corresponding magnitudes of controlled capacitance modules implemented using varactors.

In addition to the temperature and process compensation, voltage isolator 355 provides isolation from variations in voltage, such as from a power supply, and may be implemented separately or as part of other components, such as part of temperature compensator 315. In addition to frequency adjustment for these PVT and age variations, the resonant frequency may also be selected independently through resonant frequency selector 360, for obtaining a selected frequency from a range of available frequencies.

For clock signal generation, clock generator 300 utilizes a frequency divider (in module 330) to convert the output oscillation frequency $f_0$ to a plurality of lower frequencies ($f_1$ through $f_n$) and to convert a substantially sinusoidal oscillation signal to a substantially square wave signal for clock applications, using a square wave generator (also in module 330). Frequency selector 335 then provides for selection of one or more of the available output signals having the plurality of frequencies, and mode selector 345 may also provide for operating mode selection, such as providing a low power mode, a pulsed mode, a reference mode, and so on. Using these components, the clock generator 300 provides a plurality of highly accurate (over PVT), low jitter, and stable output frequencies, $f_0$, $f_1$, through $f_n$, with minimal to negligible frequency drift due to such PVT variations, thereby providing sufficient accuracy and stability for sensitive or complex applications, as mentioned above.

Figure 4:
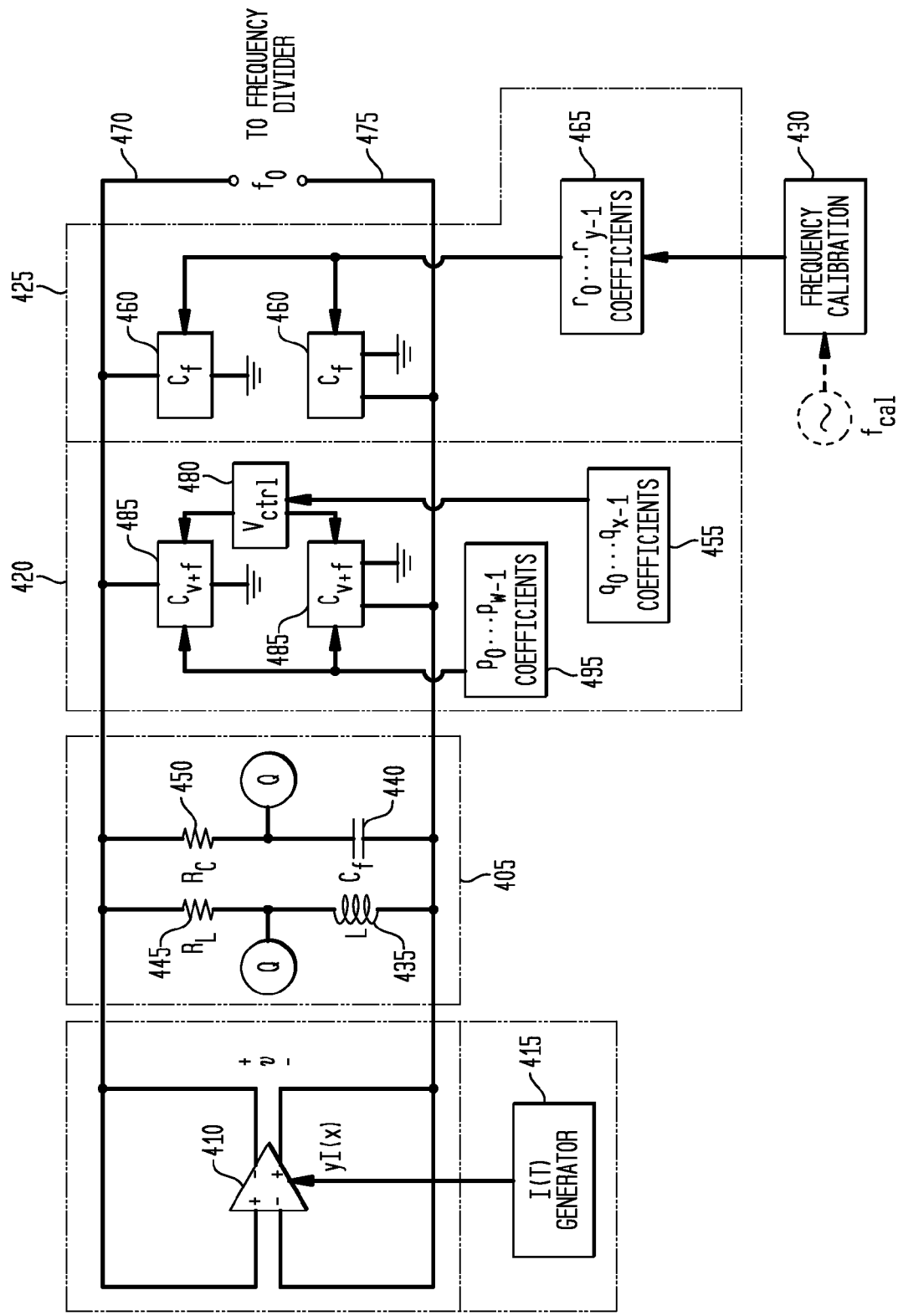
FIG. 4 (or "FIG. 4") is a high-level schematic and block diagram illustrating exemplary frequency controller, oscillator and frequency calibration embodiments in accordance with the teachings of the present invention.

FIG. 4 is a high-level schematic and block diagram illustrating exemplary frequency controller, oscillator and frequency calibration embodiments in accordance with the teachings of the present invention. As illustrated in FIG. 4, the resonator is embodied as a resonant LC tank 405, and the frequency controller is embodied as several elements, a negative transconductance amplifier 410 (used to implement the sustaining amplifier), a temperature-responsive (or temperature-dependent) current generator I(T) (or, more generally, yI(x), as responsive to any such parameter "x") 415, a temperature-responsive (or temperature-dependent) frequency ($f_0$(T)) compensation module 420, a process variation compensation module 425, and may also include a frequency calibration module 430. The various temperature-responsive or temperature-dependent modules 415 and 420 are sensitive to or responsive to temperature fluctuations, and provide corresponding adjustments, such that the resonant frequency is stable and accurate over these PVT and age variations.

Figure 8:
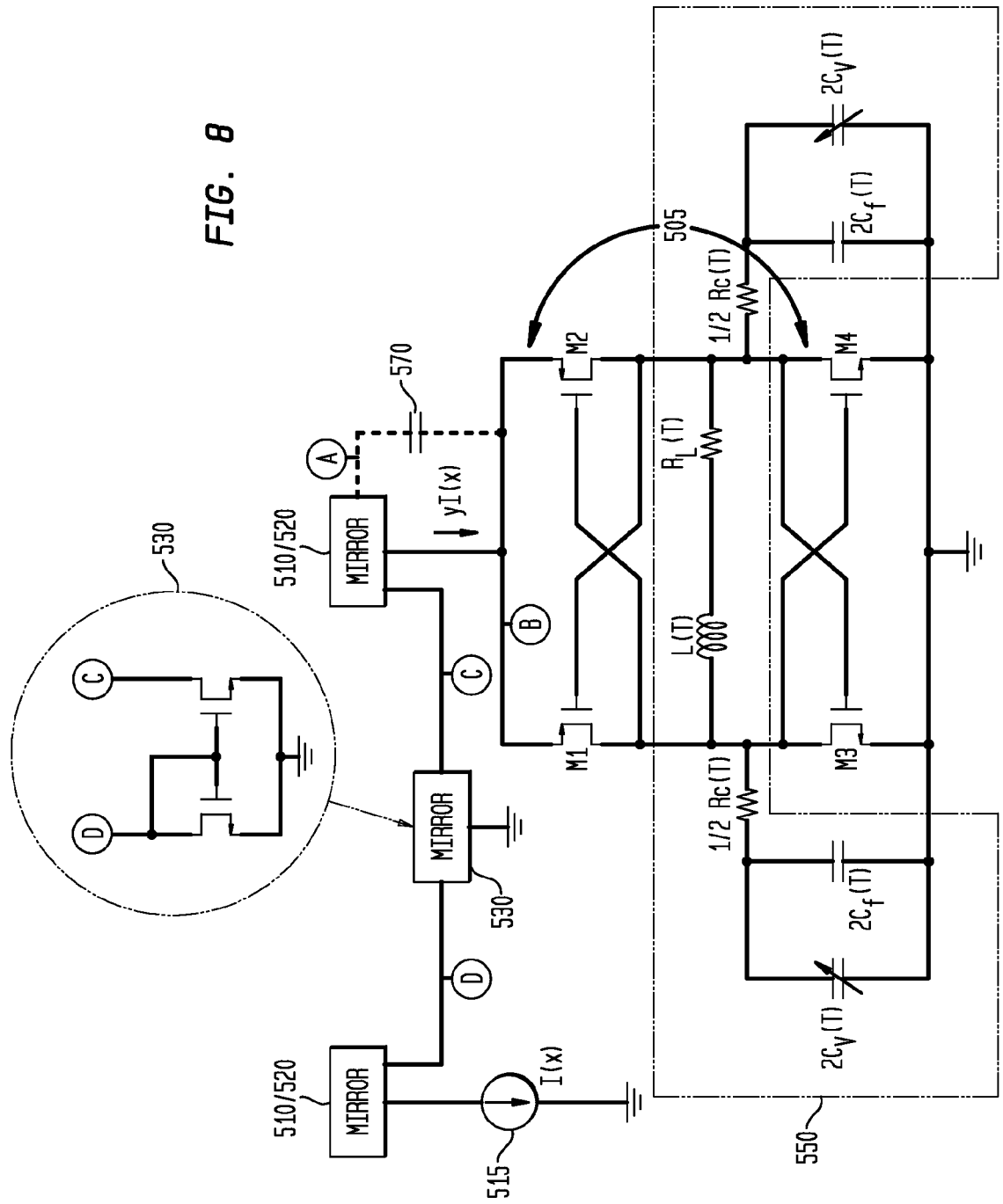
FIG. 8 (or "FIG. 8") is a circuit and block diagram illustrating second exemplary negative transconductance amplifier, temperature-responsive current generator (I(T)), and LC tank oscillator embodiments in accordance with the teachings of the present invention.

The resonant LC tank 405 with a sustaining amplifier may be equally described as a harmonic oscillator or harmonic core, and all such variations are within the scope of the present invention. It should be noted that while the resonant LC tank 405 is an inductor 435 in parallel with a capacitor 440, other circuit topologies are also known and equivalent to that illustrated, such as an inductance in series with a capacitance. Another such equivalent topology is illustrated in FIG. 8. In addition, as indicated above, other types of resonators may be utilized and all are considered equivalent to the exemplary resonant LC tank illustrated herein. Moreover, as discussed in greater detail below, additional capacitances and/or inductances, both fixed and variable (and referred to more generally as impedances or reactances (or reactive elements)), are distributed in the various modules and effectively form part of the resonant LC tank 405 and are utilized as part of the frequency controller of the invention. In addition, corresponding resistances (resistive components of the various impedances) $R_L$ 445 and $R_C$ 450 are illustrated separately, but should be understood to be intrinsic to the inductor 435 and capacitor 440, respectively, occurring as part of fabrication, and are not additional or separate components from the respective inductor 435 and capacitor 440. Conversely, such additional or intrinsic (parasitic) resistances can also be included as part of compensation for PVT variations, as illustrated and discussed below with reference to FIG. 29.

The inductor 435 and capacitor 440 of the resonant LC tank or oscillator 405 are sized to substantially or approximately provide the selected oscillation frequency, $f_0$, or range of oscillation frequencies around $f_0$. In addition, inductor 435 and capacitor 440 may be sized to have or to meet IC layout area requirements, with higher frequencies requiring less area. Those of skill in the art will recognize that $f_0 \approx 1/2\pi\sqrt{LC}$, but only as a first order approximation because, as discussed below, other factors such as the impedances $R_L$ and $R_C$, any additional resistors, along with temperature and process variations and other distortions, affect $f_0$, and may be included in second and third order approximations. For example, the inductor 435 and capacitor 440 may be sized to generate a resonant frequency in the 1-5 GHz range; in other embodiments, higher or lower frequencies may be desirable, and all such frequencies are within the scope of the invention. In addition, the inductor 435 and capacitor 440 may be fabricated using any semiconductor or other circuitry process technology, and may be CMOS-compatible, bipolar-junction transistor-compatible, for example, while in other embodiments, the inductor 435 and capacitor 440 may be fabricated using silicon-on-insulator (SOI), metal-insulator-metal (MiM), polysilicon-insulator-polysilicon (PiP), GaAs, strained-silicon, semiconductor heterojunction technologies, or MEMS-based (microelectromechanical) technologies, also for example and without limitation. It should be understood that all such implementations and embodiments are within the scope of the invention. In addition, other resonator and/or oscillator embodiments, in addition to or instead of the resonant LC tank 405, may also be utilized and are also within the scope of the present invention. As used herein, "LC tank" will mean and refer to any and all inductor and capacitor circuit layouts, configurations or topologies which may provide oscillation, however embodied. It should be noted that the capability of the oscillator 405 to be fabricated using a conventional process, such as CMOS technology, allows the clock generator to be fabricated integrally and monolithically with other circuitry, such as the second circuitry 180, and provides a distinct advantage of the present invention.

In addition, the capacitance 440 illustrated in FIG. 4 is only a portion of the overall capacitance involved in the resonance and frequency determination of the resonant LC tank 405, and is a fixed capacitance. In selected embodiments, this fixed capacitance may represent approximately 10% to 90% of the total capacitance ultimately utilized in the oscillator, as an example. Alternatively, the capacitance 440 may also be implemented as a variable capacitance, if desired. As discussed in greater detail below, the overall capacitance is distributed, such that additional fixed and variable capacitance is selectively included within the clock generator and/or timing/ frequency reference 300, and is provided, for example, by components of the frequency controller (215, 1415), such as temperature-responsive frequency ($f_0(T)$) compensation module 420 and process variation compensation module 425, to provide for both selecting the resonant frequency $f_0$ and to allow the resonant frequency $f_0$ to be substantially independent of both temperature and process variations.

In the selected embodiments, the inductance 435 has been fixed, but also could be implemented in a variable manner, or as a combination of fixed and variable inductances. As a consequence, those of skill in the art will recognize that the detailed discussions of fixed and variable capacitance, for both frequency tuning and temperature and process independence, pertain similarly to inductance choices. For example, different inductances could be switched in or out of the oscillator, to similarly provide tuning. In addition, a single inductor's inductance may also be modulated. As a consequence, all such inductance and capacitance variations are within the scope of the present invention, and are illustrated as switchable, variable and/or fixed reactive elements or components of the exemplary controlled impedance modules 1305 of FIG. 20 and the controlled reactance modules 1805 of FIGS. 25-27.

Also as illustrated in FIG. 4, the resonant LC tank 405 and resulting output signal, referred to as a first (output) signal at nodes or lines 470 and 475, is a differential signal and provides common-mode rejection. Other configurations, including non-differential or other single-ended configurations are also within the scope of the present invention. For example, in single-ended configurations, only one instantiation of the various modules (e.g., 485, 460) would be required, rather than the use of two for a balanced configuration as illustrated. Similarly, other components and features discussed below, such as frequency dividers, would also have a single-ended rather than differential configuration. In addition, various embodiments illustrated utilize MOSFET transistors (metal oxide semiconductor field effect transistors) in various forms (such as CMOS, accumulation-mode MOSFET ("AMOS"), inversion-mode MOSFET ("IMOS"), and so on); other implementations are also available, such as using bipolar junction transistors ("BJTs"), BiCMOS, etc. All such embodiments are considered equivalent and are within the scope of the present invention.

Figure 5A:
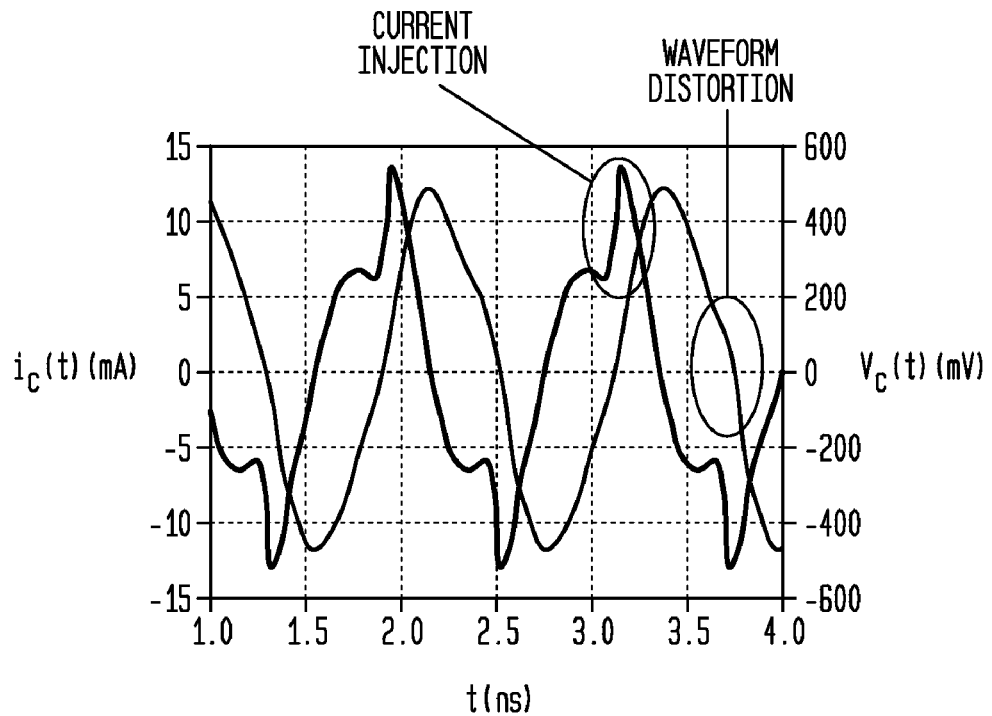
FIG. 5A (or "FIG. 5A") is an exemplary graph illustrating oscillator voltage waveform (frequency) distortion due to a harmonic content of current injected into an oscillator with a specific filter response.
Figure 5B:
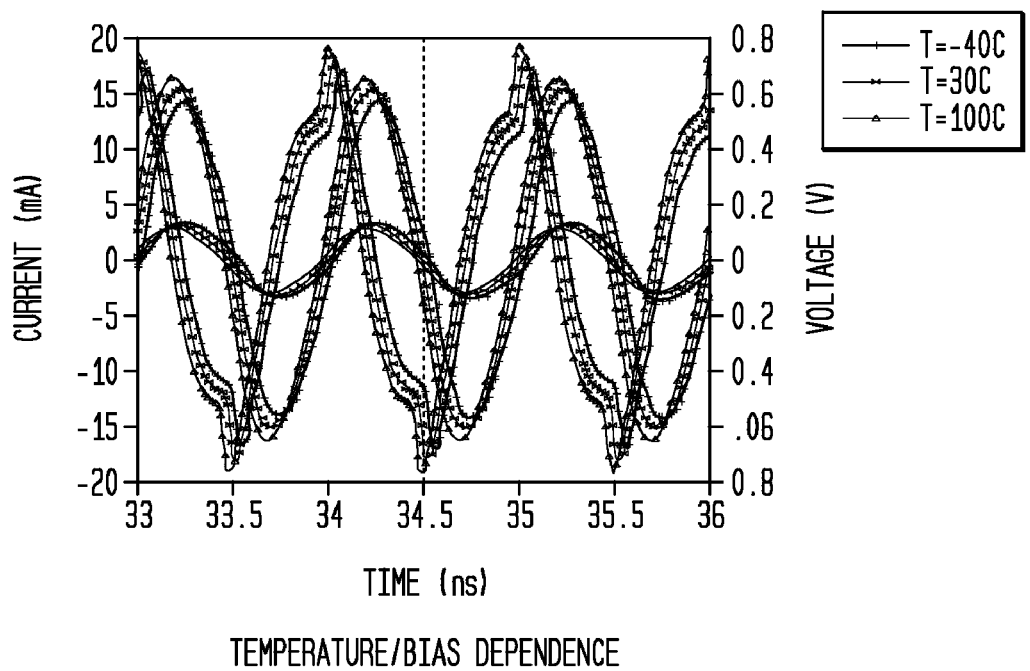
FIG. 5B (or "FIG. 5B") is an exemplary graph illustrating oscillator voltage waveform (frequency) shown in FIG. 5A as a function of temperature.
Figure 5C:
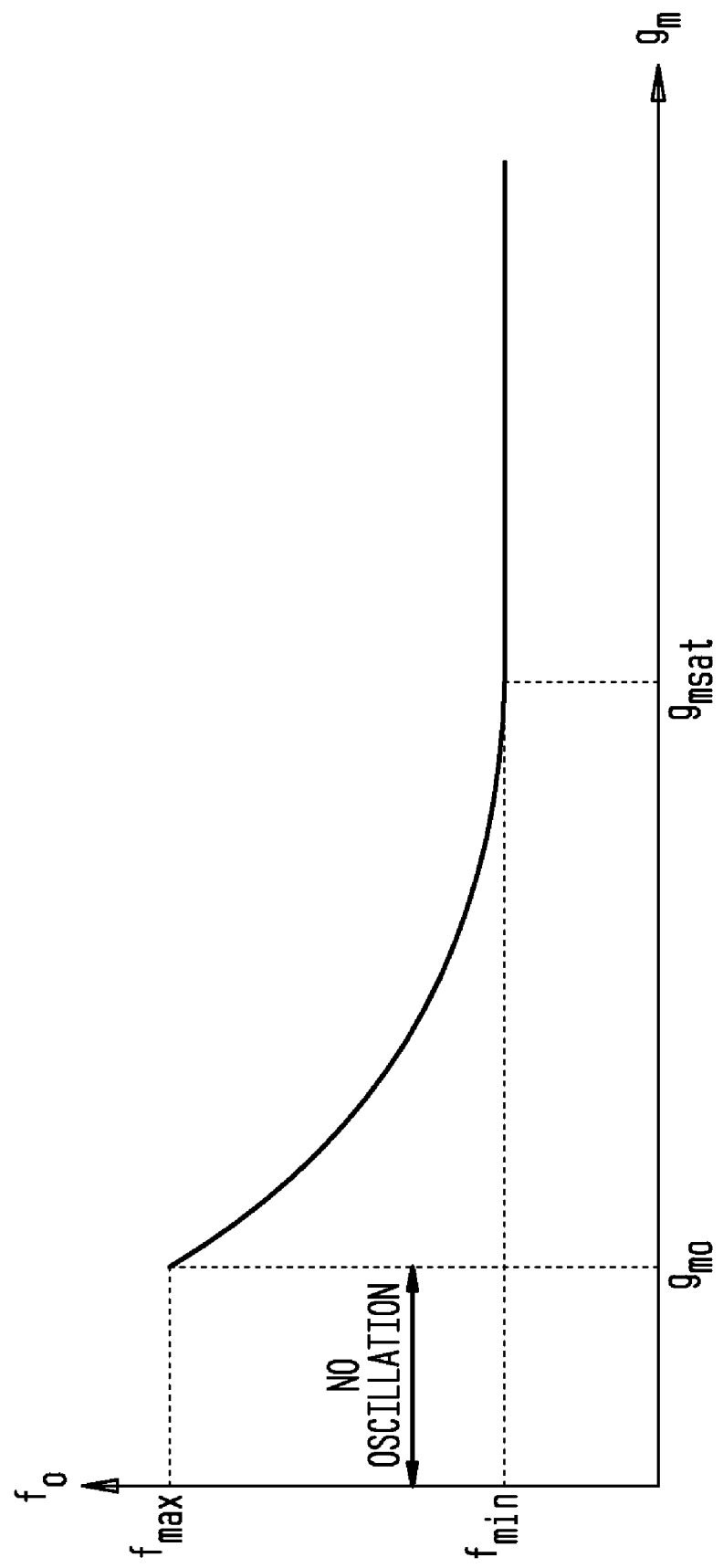
FIG. 5C (or "FIG. 5C") is an exemplary graph illustrating oscillator frequency as a function of the transconductance of a sustaining amplifier.

The negative transconductance amplifier 410 is selected to provide temperature compensation through transconductance ($g_m$) modulation and the on-resistance of its resistors. Transconductance ($g_m$) modulation may also be utilized independently in frequency selection. Another significant advantage of the present invention is the selection of a negative transconductance amplifier 410 to provide start-up and sustaining amplification, because both oscillation amplitude and frequency are affected by the transconductance of the sustaining amplifier, providing both amplitude modulation and frequency trimming (or tuning), in addition to providing temperature compensation. The negative transconductance amplifier 410 will inject current into the resonant LC tank 405 (and specifically onto the capacitor 440) in response to a voltage "v" across the resonant LC tank 405, as illustrated (across nodes 470 and 475). That current injection, in turn, will change (and distort) the voltage waveform (as voltage is the integral of the current), resulting in a change or variation in frequency, generally in inverse proportion to the magnitude of the transconductance, $g_m$, as illustrated in FIG. 5A. It should be noted that this transconductance is a negative value, as gain is provided to cancel the loss intrinsic to the resonant element. As a consequence, whenever "transconductance amplifier" is utilized herein, it should be understood to mean and to be merely an abbreviation for "negative transconductance amplifier". In turn, the transconductance is also a function of the bias current, substantially proportional (approximately) to the square root of the current (yI(x)) through the amplifier 410 (for MOSFETs), and substantially proportional (approximately) to the current (yI(x)) through the amplifier 410 (for BJTs), which is temperature-dependent, resulting in a waveform distortion which is both temperature and bias current dependent, as illustrated in FIG. 5B. In addition, as illustrated in FIG. 5C, the oscillation frequency is also related to and a function of the transconductance of the sustaining negative transconductance amplifier 410, providing for oscillation frequency selection. Moreover, in addition to temperature dependence (as I(T)), the current can also vary as a function of other parameters or variables (so is referred to more generally as current I(x)), such as voltage or external tuning, and may also be amplified such as by a factor of "y" (as illustrated below); as a consequence, the current is referred to as "yI(x)".

Figure 21:
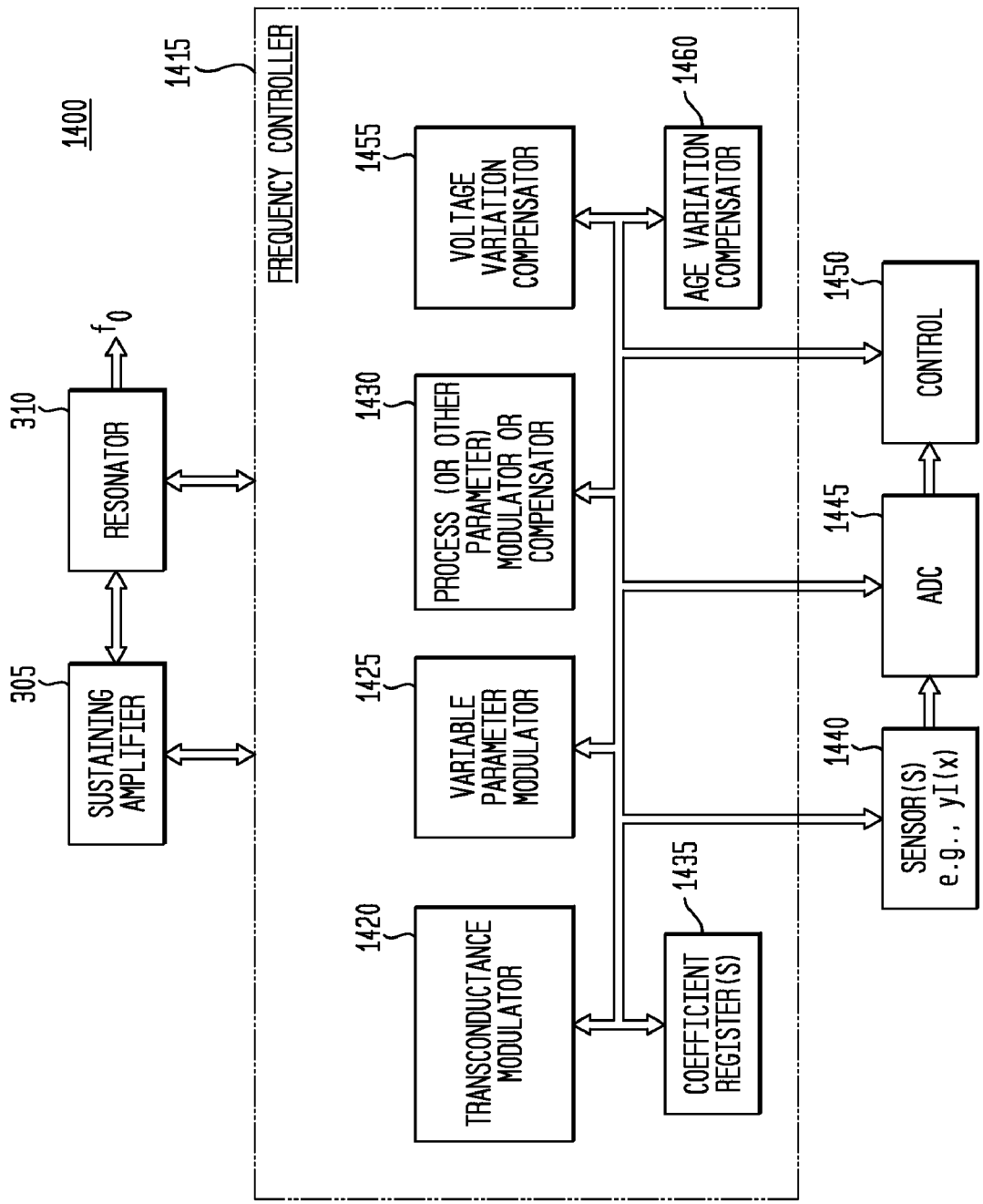
FIG. 21 (or "FIG. 21") is a block diagram illustrating a first exemplary frequency controller and apparatus in accordance with the teachings of the present invention.
Figure 25:
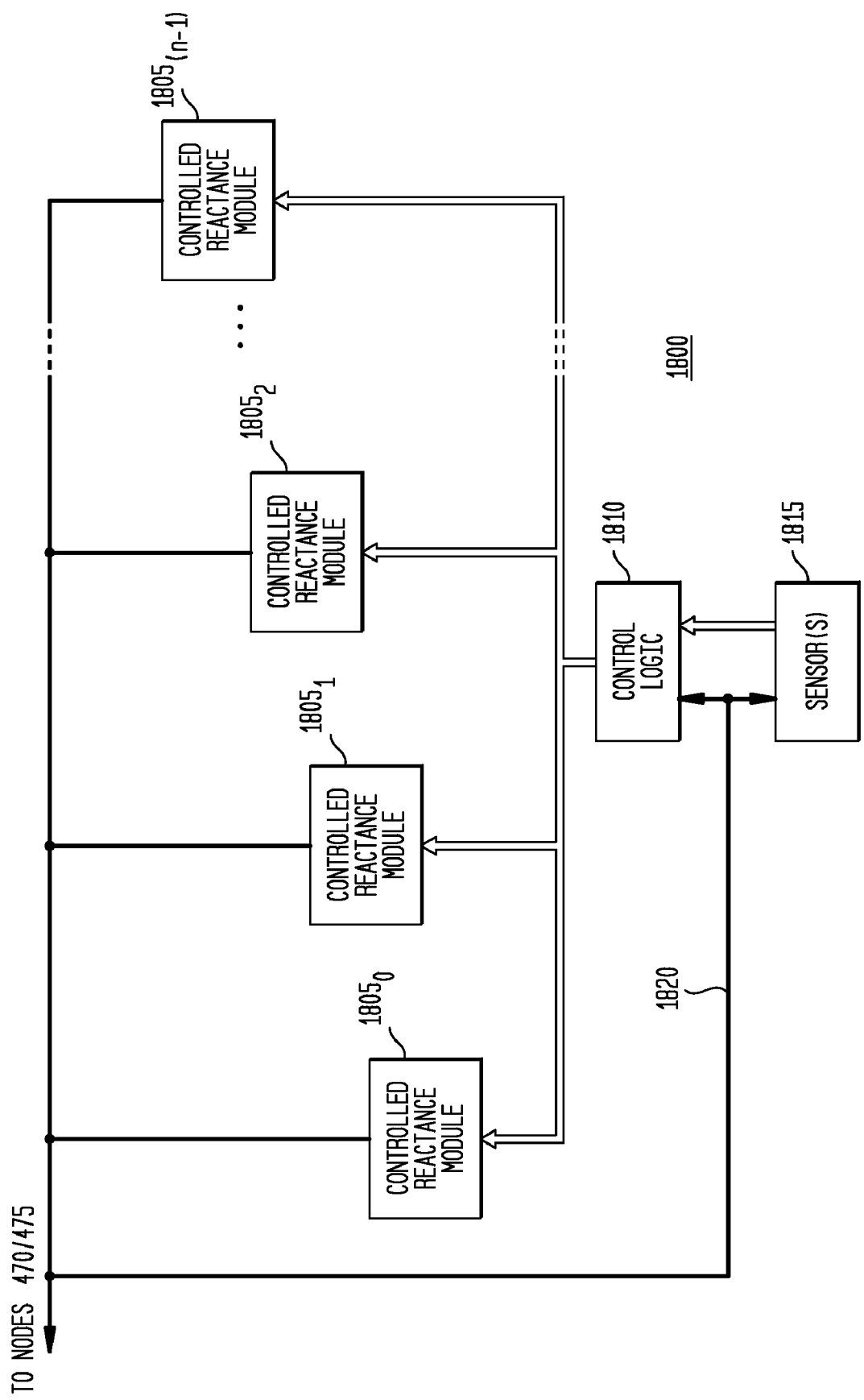
FIG. 25 (or "FIG. 25") is a block diagram illustrating a second exemplary frequency controller and apparatus in accordance with the teachings of the present invention.

As indicated above, more generally, such a variable current yI(x) may be utilized as or as part of a sensor, such as one or more sensors 1440 or transconductance modulator 1420 of FIG. 21 or sensors 1815 of FIG. 25. For example, when such as variable current is provided by I(T) generator 415, such that the current provided is a function of temperature (parameter or variable "x"=temperature parameter "T"), I(T) generator 415 thereby functions as a temperature sensor, and may be utilized as such in the exemplary embodiments, such as utilized by the frequency controller (215, 349, 1415) to adjust the resonant frequency $f_0$ in response to temperature fluctuations. For example, transconductance modulator 1420 of FIG. 21 may comprise such a temperature (or other parameter) responsive current source 415 (which also functions as a sensor 1440), providing current to a sustaining amplifier 305.

Significant inventive breakthroughs of the present invention include utilizing these potential distortions advantageously, to provide for frequency compensation in generating the selected $f_0$ value of the oscillator, and frequency modulation through modulation of the transconductance of the sustaining amplifier. As a consequence, and as discussed in greater detail below, the transconductance, first, may be modified or varied for frequency selection, and second, to compensate for such frequency variation due to temperature, voltage, fabrication process or aging, by modifying the current yI(x), generally on a real-time or near real-time basis. The selected frequency $f_0$, and its stability with respect to temperature variations, in accordance with the invention, may be determined through appropriate selection of the transconductance $g_m$ and selection of I(T). Stated another way, in accordance with the present invention, the bias current is made temperature dependent, as I(T) (or, more generally, as yI(x)), which in turn affects the transconductance $g_m$, which in turn affects the oscillation frequency $f_0$. This methodology may also be utilized for other variables, such as voltage fluctuations, process variation, or aging variation.

Figure 6:
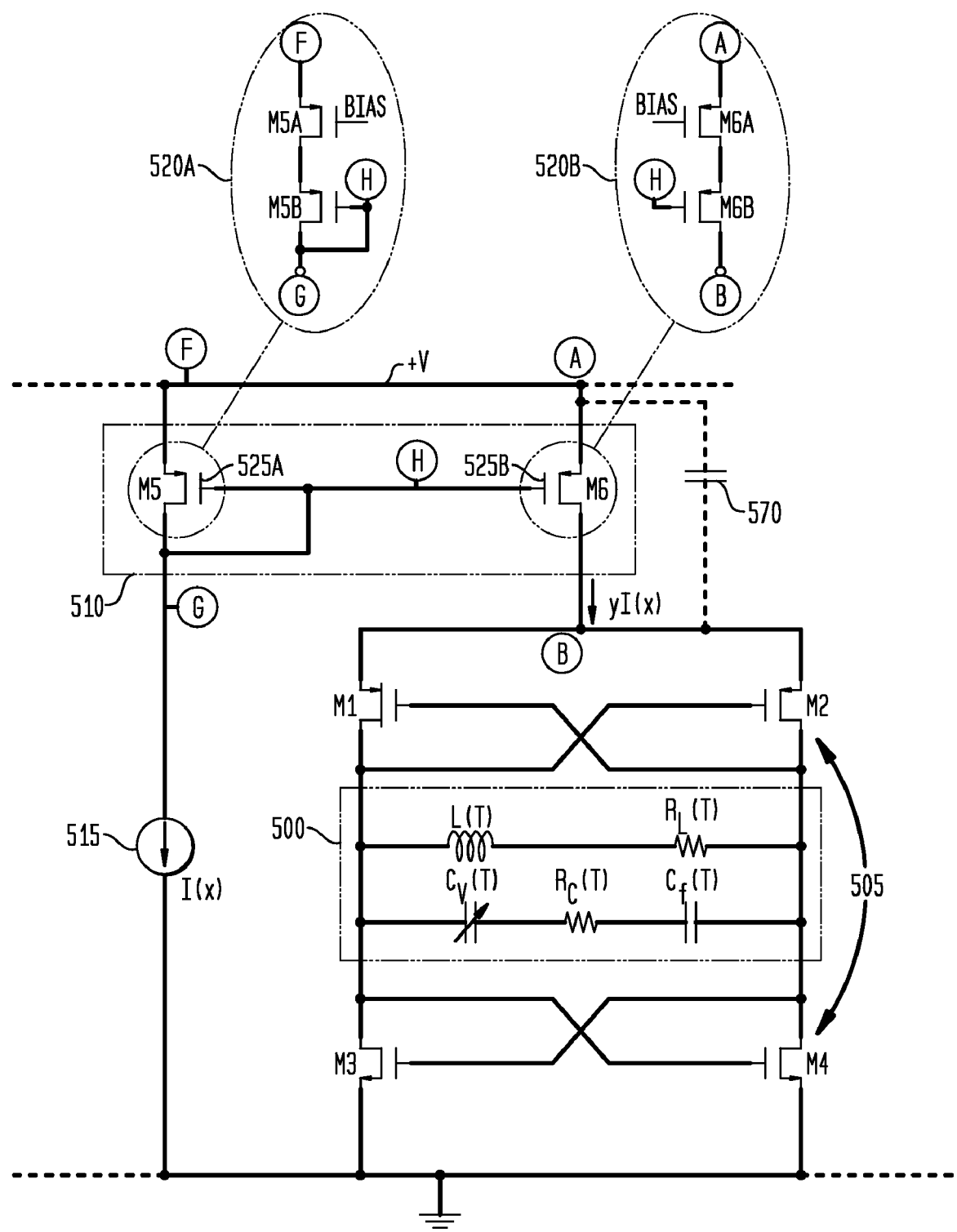
FIG. 6 (or "FIG. 6") is a circuit diagram illustrating first exemplary negative transconductance amplifier, temperature-responsive current generator (I(T)), and LC tank oscillator embodiments in accordance with the teachings of the present invention.
Figure 7A:
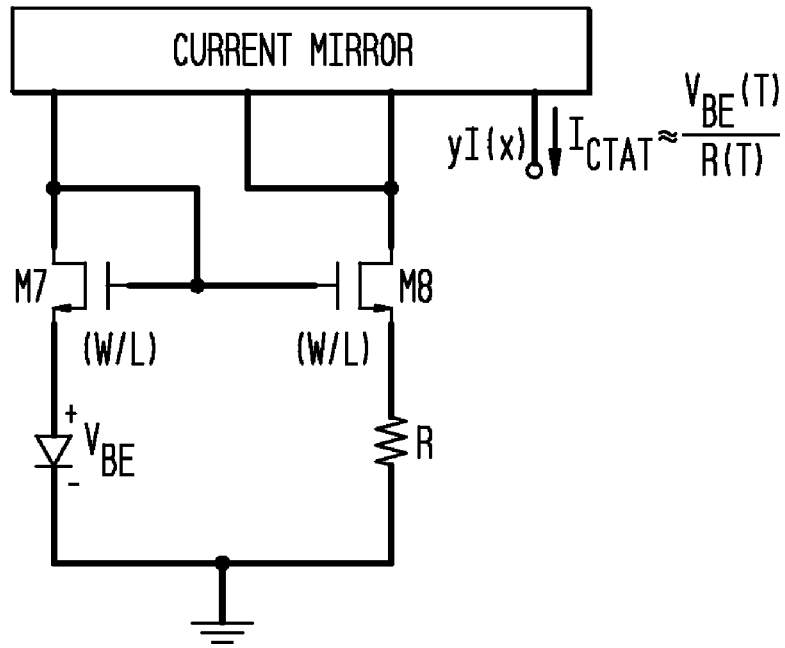
FIG. 7A (or "FIG. 7A") is a circuit diagram illustrating an exemplary temperature-responsive CTAT current generator in accordance with the teachings of the present invention.
Figure 7B:
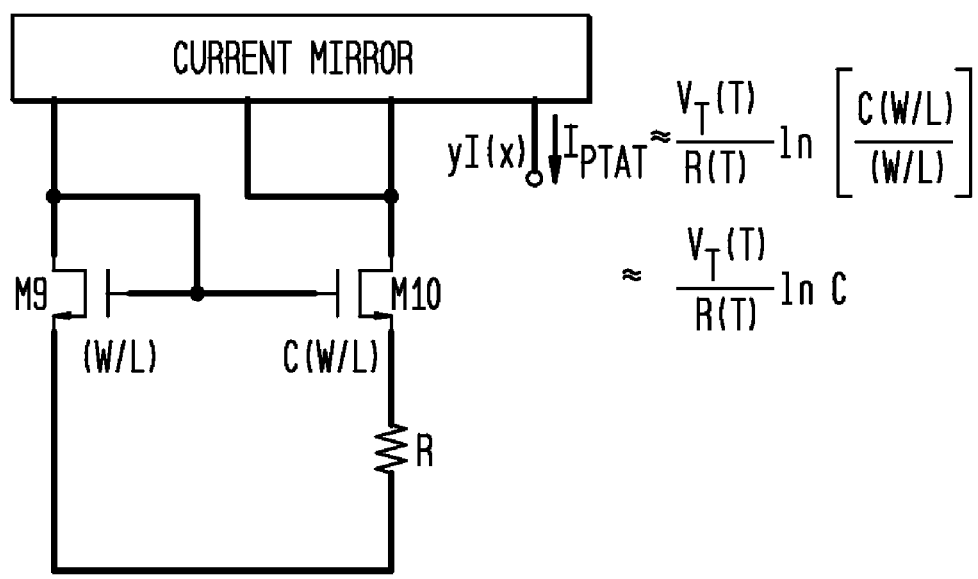
FIG. 7B (or "FIG. 7B") is a circuit diagram illustrating an exemplary temperature-responsive PTAT current generator in accordance with the teachings of the present invention.
Figure 7C:
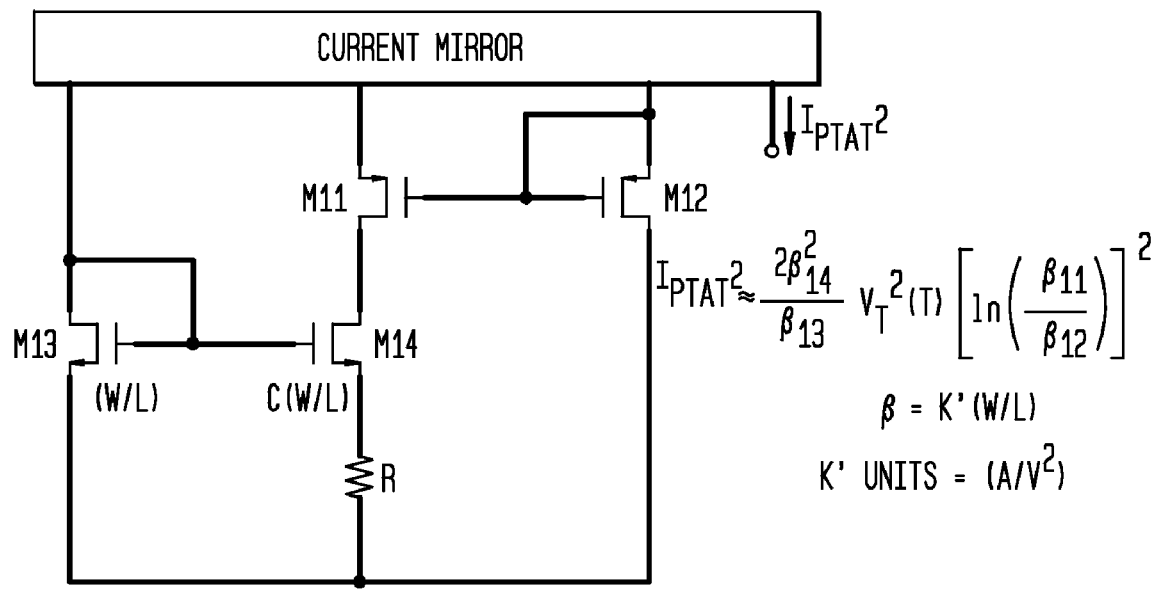
FIG. 7C (or "FIG. 7C") is a circuit diagram illustrating an exemplary temperature-responsive $PTAT^2$ current generator in accordance with the teachings of the present invention.
Figure 7D:
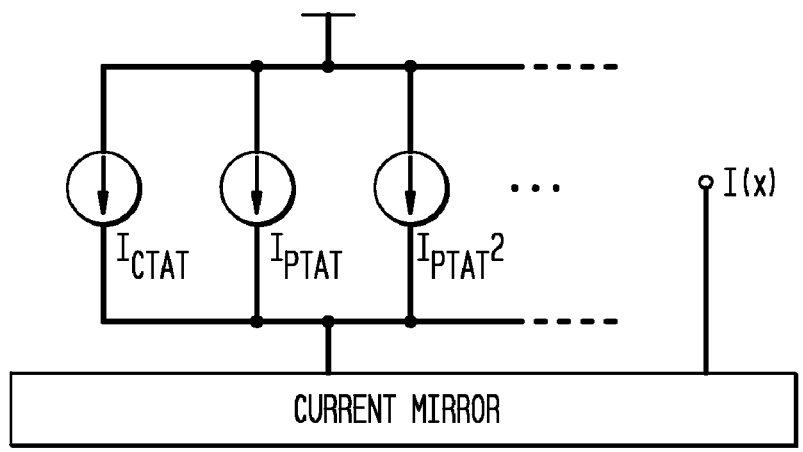
FIG. 7D (or "FIG. 7D") is a circuit diagram illustrating an exemplary selectable and scalable temperature-responsive current generator, with selected CTAT, PTAT, and $PTAT^2$ configurations, in accordance with the teachings of the present invention.

FIG. 6 is a circuit diagram illustrating exemplary negative transconductance amplifier (410), temperature-responsive current generator (I(T) 415), and LC tank resonator (405) embodiments in accordance with the teachings of the present invention. As illustrated in FIG. 6, a resonant LC tank 500 is coupled to a negative transconductance amplifier implemented as a complementary cross-coupled pair amplifier 505 (comprised of transistors M1, M2, M3 and M4) which, in turn, is coupled through a voltage isolator 510 (implemented as current mirror (transistors 525A and 525B) and referred to interchangeably herein) to a temperature-responsive current generator (I(x)) 515. The current mirror 510 (voltage isolator) may also be implemented in a cascode topology (520A and 520B), such as to provide improved stability with variations in power supply and isolate the oscillator from the power supply (voltage isolation). The temperature-responsive current generator 515 may be implemented utilizing topologies such as CTAT (complementary to absolute temperature), PTAT (proportional to absolute temperature), or PTAT$^2$ (proportional to absolute temperature squared), as illustrated in FIGS. 7A, 7B and 7C, respectively, and combinations of CTAT, PTAT, and PTAT$^2$, as illustrated in FIG. 7D. In each case, the current I(T) (or yI(x)) injected into the negative transconductance amplifier (complementary cross-coupled pair amplifier) 505 has a temperature dependence, such as increasing current (PTAT and PTAT$^2$) or decreasing current (CTAT) as a function of increasing temperature, as illustrated. One or more combinations of these temperature-responsive current generators may also be implemented, as illustrated in FIG. 7D, such as CTAT in parallel with PTAT, for example.

The selection of a particular temperature-responsive or temperature-dependent current generator is also a function of the fabrication process utilized; for example, CTAT may be utilized for a Taiwan Semiconductor (TSMC) fabrication process. More generally, as different fabricators utilize different materials, such as aluminum or copper, $R_L$ typically varies, resulting in different temperature coefficients which, in turn, change the temperature coefficient of the oscillator, thereby requiring differences in I(T) compensation. Correspondingly, different ratios of CTAT, PTAT, and PTAT$^2$ compensation may be required to provide an effectively flat frequency response as a function of temperature. Not separately illustrated, the various temperature-responsive current generators illustrated in FIGS. 7A, 7B, 7C and 7D may include a start-up circuit. In addition, the transistors comprising the selected temperature-responsive current generator configuration may be biased differently, such as biased in strong inversion for CTAT (M7 and M8) and PTAT$^2$ (M13 and M14), and in subthreshold for PTAT (M9 and M10) and PTAT$^2$ (M11 and M12), for the exemplary topologies illustrated.

FIG. 8 is a circuit and block diagram illustrating additional exemplary negative transconductance amplifier, temperature-responsive (or temperature-dependent) current generator (I(T) or I(x)), and LC tank oscillator embodiments in accordance with the teachings of the present invention. As illustrated in FIG. 8, the resonant LC tank 550 has a different topology than previously illustrated, but also is coupled to a negative transconductance amplifier implemented as a complementary cross-coupled pair amplifier 505 (transistors M1, M2, M3 and M4) which, in turn, is coupled through a plurality of current mirrors 510 (or 520) and 530 to a temperature-responsive (or temperature-dependent) current generator (I(T) or I(x)) 515. As illustrated, the plurality of current mirrors are utilized to successively provide gain to and increase the current I(T) entering the negative transconductance amplifier 505 and resonant LC tank 550. Often, the tail device in the current mirror (e.g., transistor M6 in FIG. 6) providing current into node B and which drives the negative transconductance amplifier is selected to be a PMOS device, and thus several stages of mirroring may be required (as shown) to provide a PMOS current mirror input to the $g_m$ amplifier. PMOS is often selected because in modern CMOS processes, PMOS devices are often buried channel devices which are known to exhibit less flicker noise than equally sized and similarly biased NMOS devices. Reduced flicker noise in the tail device reduces the phase noise and jitter of the oscillator because flicker noise is upconverted around the oscillation frequency by the nonlinear active devices in the circuit.

As indicated above, the portion of the current mirror 510 or 520 (or other circuitry) sourcing current into the negative transconductance amplifier 505 should have a high impedance at its output to reduce power supply frequency drift, such as by using long transistor geometries and cascode configurations to increase output resistance, and provide significant stability at node B. In addition, a shunt capacitor 570 also may be employed to filter and thereby reduce flicker noise from the various tail devices.

Depending upon the selected application, the use of the negative transconductance amplifier 505 with its I(T) (or yI(x)) bias may provide sufficient frequency stability, such that the additional frequency controller components may not be necessary or desirable in that application. In other embodiments, however, additional accuracy and less frequency drift may be provided, using one or more of the components discussed in greater detail below.

In addition to providing a temperature-dependent current yI(x) (or I(T)), the various transistors M1, M2, M3 and M4 each have an associated resistance during conduction, which may also tend to cause frequency distortion and frequency drift during oscillation. In each half-cycle, either M1 and M4 or M2 and M3 are on and conducting. Such resistance is also temperature dependent. As a consequence, the transistors M1, M2, M3 and M4 should be adjusted in size (width and length) to also compensate for such frequency effects. It should be noted that the current injected into the resonant LC tank 405 must be sufficient to sustain oscillation (as illustrated in FIG. 5C) and, as a consequence, will have a minimum value, which may limit the degree or capability of frequency control which can be readily implemented through the negative transconductance amplifier 410 (or 505) and temperature-dependent current generator 415 (or 515). As a consequence, I(T) and the transistor (M1, M2, M3 and M4) sizing should be jointly selected to provide for oscillation start up, to accommodate maximum currents for power consumption constraints, and to fit into the selected IC area and layout. For example, the transconductance $g_m$ may be selected to provide approximately sufficient current to ensure start up and sustain oscillation, with a frequency characteristic of decreasing frequency with increasing temperature, followed by sizing transistors M1, M2, M3 and M4 to be large enough to either make the frequency independent of temperature or increasing with increasing temperature, followed by fine-tuning the frequency-temperature relationship with appropriate selection of I(T). In selected modeled embodiments, this has resulted in frequency accuracy of approximately ±0.25% to 0.5% over PVT, which may be more than sufficient for many applications.

Figure 20:
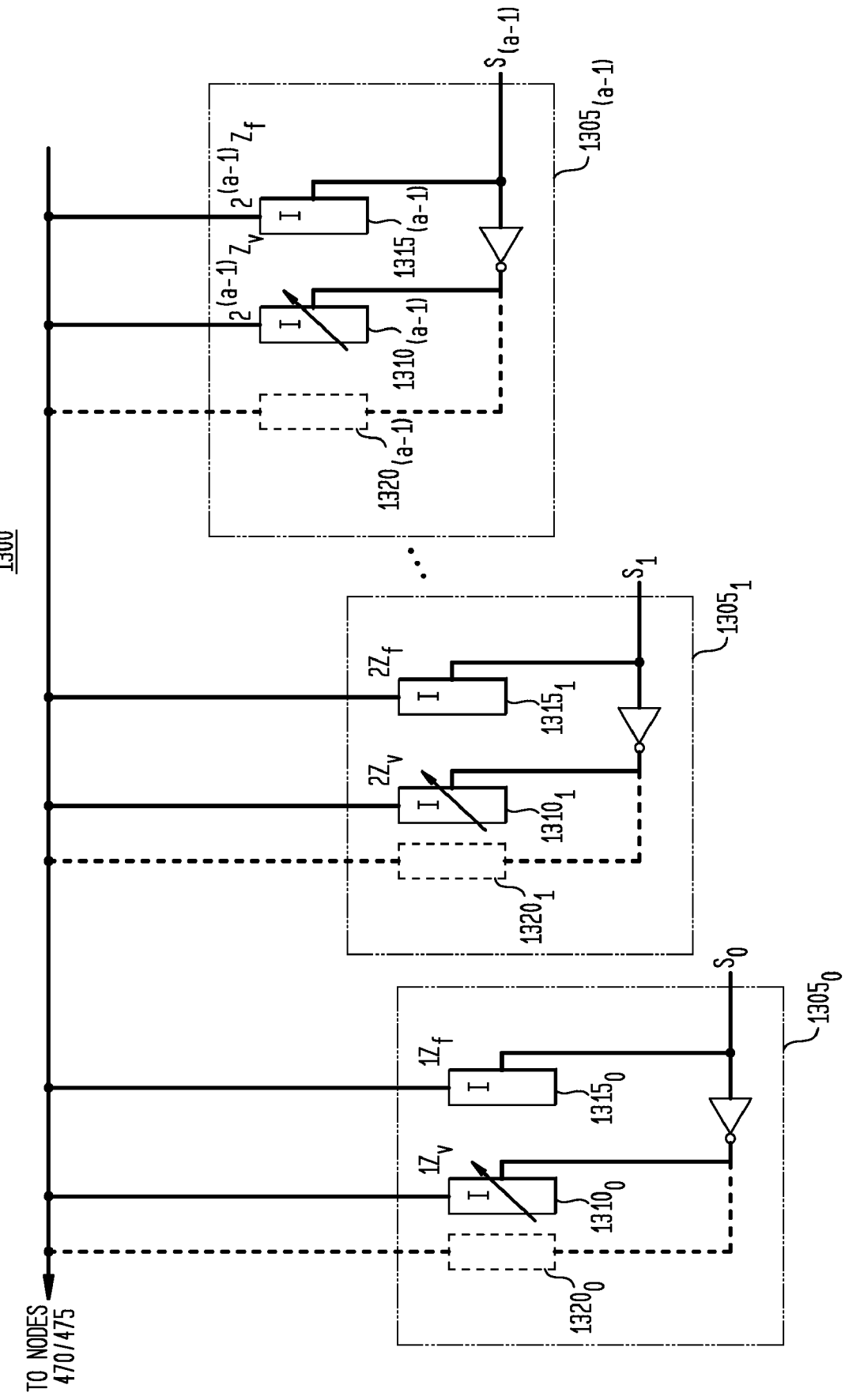
FIG. 20 (or "FIG. 20") is a block and circuit diagram illustrating an exemplary controlled impedance module utilized in a compensation module in accordance with the teachings of the present invention.

Referring again to FIG. 4, additional compensation modules are also utilized as part of frequency controller (215, 349, 1415) to provide greater control and accuracy over the resonant frequency $f_0$, such as for applications in which greater accuracy and less variance (or frequency drift) may be required, or where technologies do not allow the previous techniques to provide sufficient accuracy over PVT or age variations, such as to provide a frequency accuracy of approximately ±0.25% or better. In these circumstances, temperature-dependent (or temperature-responsive) frequency ($f_0(T)$) compensation module 420 may be utilized, such as the exemplary temperature-responsive frequency ($f_0(T)$) compensation module 420. This module 420 may be implemented, for example, utilizing controlled (or controllable) capacitance modules 485, with each coupled to a respective side or rail of the resonant LC tank 405 (lines 470 and 475), and with each under common control, provided by a first plurality ("w") of switching coefficients ($p_0$ though $p_{(w-1)}$) (register 495) and a voltage controller ($V_{CTRL}$) 480 providing a control voltage determined by a second plurality ("x") of switching coefficients ($q_0$ though $q_{(x-1)}$) (register 455), with representative examples illustrated in FIGS. 9 and 10. (The terms "controlled" and "controllable" are utilized interchangeably herein). Additional exemplary embodiments are illustrated in FIG. 20, which illustrates an exemplary controlled impedance module 1300 utilized in a frequency-temperature compensation module, such as in place of or in addition to controlled (or controllable) capacitance modules 485 in module 420; in FIG. 22, which illustrates another variation of controlled capacitance modules 485, as controlled capacitance modules 1500 with a plurality of temperature-dependent or other parameter-dependent control voltages (generated as illustrated FIG. 23 or 26); in FIG. 25, which illustrates a plurality of controlled reactance modules 1805 which are switched in or out (coupled to or uncoupled from the resonator) in response to control signals from control logic 1810 and sensor(s) 1815, including feedback from the oscillator; in FIG. 26, which illustrates a plurality of controlled reactance modules 1805 which are switched in or out and/or switched to a control voltage, in response to control signals (continuous) or coefficients (discrete); and in FIG. 27, which illustrates a plurality of controlled reactance modules 1805 which are switched in response to control signals, for voltage variation compensation. There are several different types of switching available, such as coupling or uncoupling a reactance or impedance to the resonator, or switching coupled reactances or impedances to selected control voltages or other control signals, for example.

Figure 9:
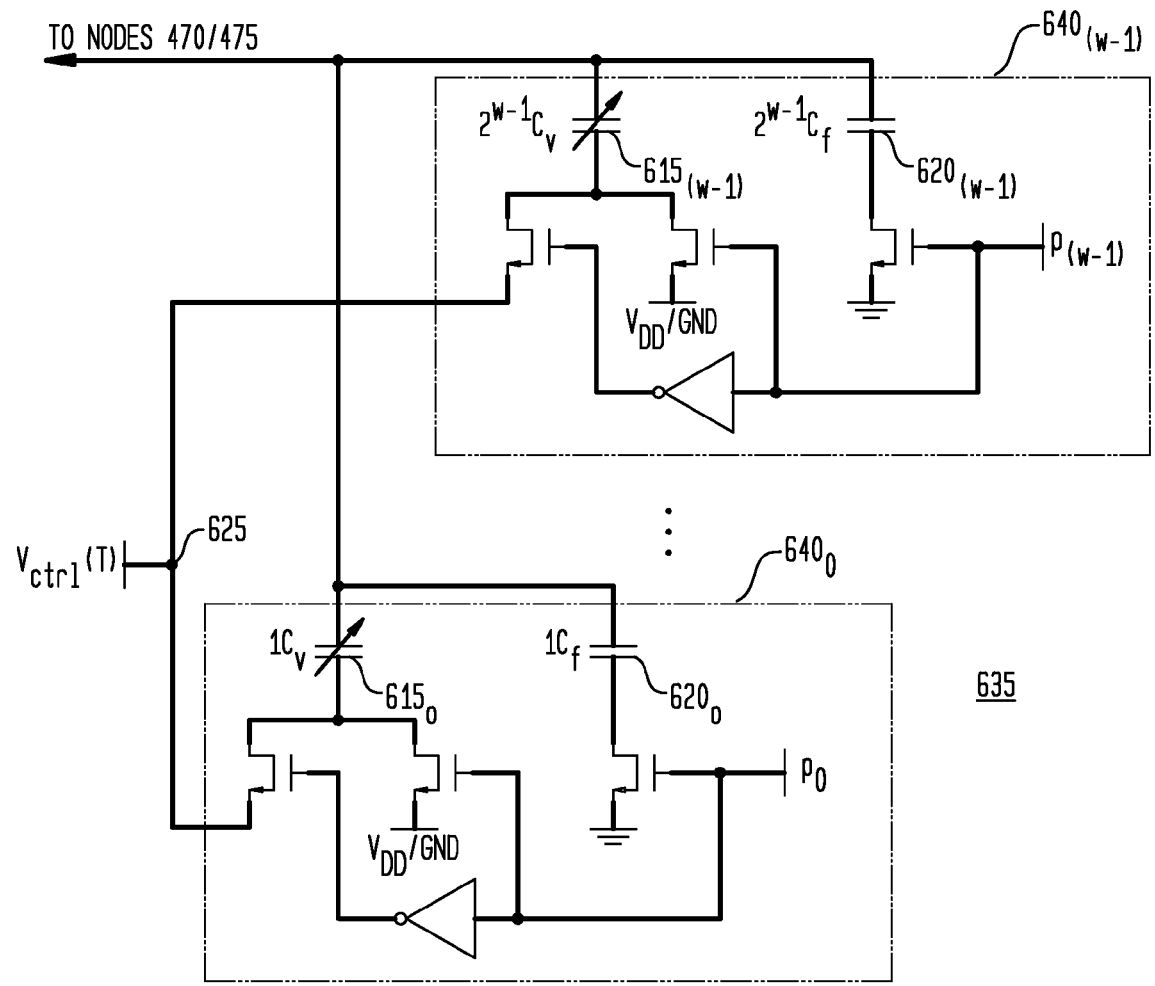
FIG. 9 (or "FIG. 9") is a circuit diagram illustrating an exemplary first controlled (or controllable) capacitance module utilized in a frequency-temperature compensation module in accordance with the teachings of the present invention.

FIG. 9 is a circuit diagram illustrating an exemplary first controllable capacitance module 635 in accordance with the teachings of the present invention, which may be utilized as the controlled (or controllable) capacitance modules 485 in the frequency-temperature compensation module 420 (and attached to each side of the resonant LC tank 405 (nodes or lines 470 and 475). As illustrated, the controlled (or controllable) capacitance module 635 is comprised of a bank or array of a plurality (w) of switchable capacitive modules 640 of binary-weighted fixed capacitors ($C_f$) 620 and binary- or other differentially-weighted variable capacitors (varactors) ($C_v$) 615. Any type of fixed capacitors 620 and variable capacitors (varactors) 615 may be utilized; in selected embodiments, the varactors 615 are AMOS (accumulation-mode MOSFET), IMOS (inversion-mode MOSFET), and/or junction/diode varactors. Each switchable capacitive module 640 has an identical circuit layout, and each differs by a binary weighted capacitance, with switchable capacitive module 640₀ having a capacitance of one unit, switchable capacitive module 640₁ having a capacitance of two units, and so on, with switchable capacitive module 640$_{(w-1)}$ having a capacitance of $2^{(w-1)}$ units, with each unit representing a particular capacitance magnitude or value (typically in femtofarads (fF) or picofarads (pF)). As mentioned above, other differential weighting schemes are equally applicable, such as linear or binary, and may also consist of providing such differential weighting by switching the reactance to a selected control voltage, thereby increasing or decreasing its effective reactance.

Within each switchable module 640, each fixed and variable capacitance is initially equal, with the variable capacitance allowed to vary in response to the control voltage provided at node 625. This control voltage, in turn, varies with temperature or another selected variable parameter, resulting in an overall or total capacitance provided by the controlled capacitance module 635 also varying as a function of temperature (or other parameter) and which, in turn, is utilized to vary the resonant frequency $f_0$. In other selected embodiments, any of a plurality of control voltages may be utilized, including static control voltages, to provide for other types of compensation, discussed below. Also within each switchable capacitive module 640, either the fixed capacitance $C_f$ or the variable capacitance $C_v$ is switched into the circuit, not both, using switching coefficients $p_0$ though $p_{(w-1)}$. For example, in the selected embodiment, for a given or selected module 640, when its corresponding "p" coefficient is a logic high (or high voltage), the corresponding fixed capacitance $C_f$ is switched into the circuit and the corresponding variable capacitance $C_v$ is switched out of the circuit (and coupled to a power rail voltage $V_{DD}$ or ground (GND), depending whether the device is AMOS or IMOS, respectively, to avoid a floating node and to minimize the capacitance presented to the tank), and when its corresponding "p" coefficient is a logic low (or low voltage), the corresponding fixed capacitance $C_f$ is switched out of the circuit and the corresponding variable capacitance $C_v$ is switched into the circuit and coupled to the control voltage provided on node 625.

In an exemplary embodiment, a total of eight switchable capacitive modules 640 (and corresponding first plurality of eight switching coefficients $p_0$ though $p_7$ have been implemented to provide 256 combinations of fixed and variable capacitances. As a result, significant control over oscillation frequency as a function of temperature variations is provided.

It should be noted, in this exemplary embodiment, by switching in or out the fixed capacitance $C_f$ or the variable capacitance $C_v$, the ratio of fixed to variable changes and, correspondingly, the amount or degree of temperature-responsiveness of the controllable capacitance module 635. For example, with increasing amounts of variable capacitance $C_v$, the controllable capacitance module 635 provides greater variability of capacitance in response to temperature (or other parameter), thereby adjusting the frequency response of the tank or other oscillator.

Figure 10:
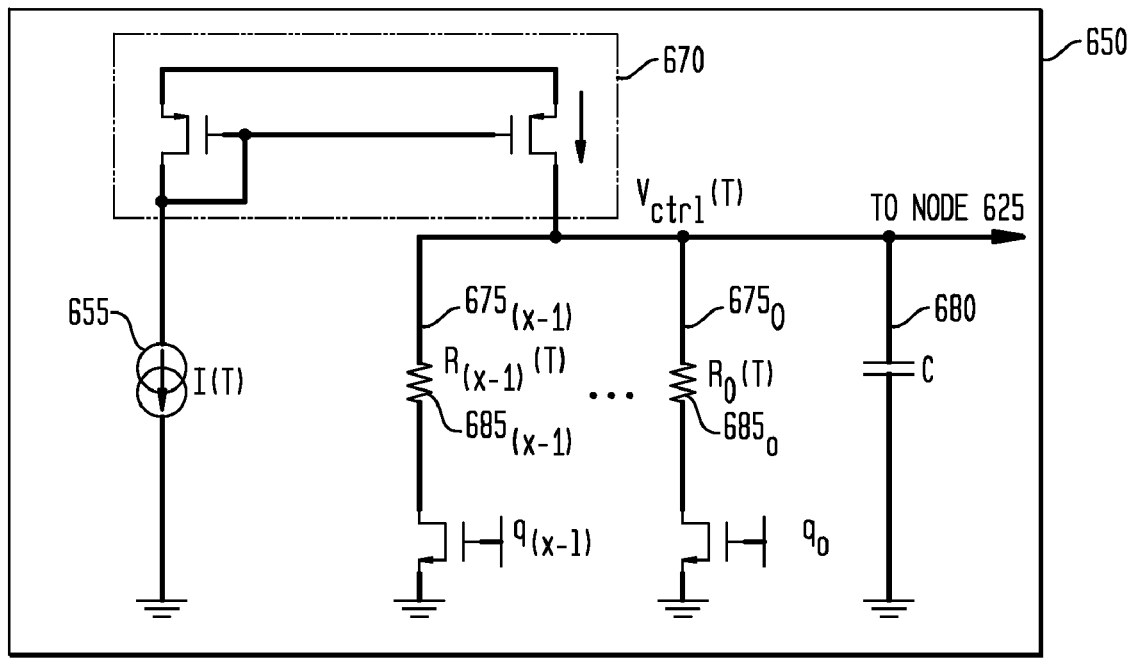
FIG. 10 (or "FIG. 10") is a circuit diagram illustrating an exemplary first voltage control module utilized in a frequency-temperature compensation module in accordance with the teachings of the present invention.

FIG. 10 is a circuit diagram illustrating an exemplary temperature dependent voltage control module 650 utilized to provide the control voltage in the controllable capacitance module 635 (of the frequency-temperature compensation module 420) and as $V_{CTRL}$ 480 (in FIG. 4), in accordance with the teachings of the present invention. As illustrated, voltage control module 650 creates a temperature-dependent current I(T) (or more generally, a current I(x)), using current generator 655, as previously discussed, using one or more combinations of PTAT, PTAT$^2$ and/or CTAT current generators, and may share the I(T) generator 415 utilized with the negative transconductance amplifier 410, instead of providing a separate generator 655. The temperature-dependent current I(T) (or I(x)) is mirrored through current mirror 670 to an array or bank of a plurality of switchable resistive modules or branches 675 and a fixed capacitive module or branch 680, all configured in parallel. In other exemplary embodiments, depending upon the parameter variation to be compensated, other control voltage generators discussed below may be utilized.

In other combinations, depending upon the selection and weighting of the PTAT, PTAT$^2$ and/or CTAT current generators, a temperature-independent current may also be generated. For example, a PTAT generator and a CTAT generator, sized to have equal magnitudes and opposite slopes, can be combined to create a current generator which provides a constant current over temperature fluctuations. Such a current generator, for example, can be utilized to provide a constant current source in the aging variation compensator illustrated in FIG. 30. Those of skill in the art will recognize that other current sources may also be utilized, such as those which vary with power supply voltage, and may be utilized as corresponding voltage sensors.

The resistors 685 may be any type or combination of different types, such as diffusion resistors (p or n), polysilicon, metal resistors, salicide or unsalicide polysilicon resistors, or well resistors (p or n well), for example. Depending upon the type or combination of types of resistors selected, the resistors 685 generally will also have a corresponding temperature dependence (or responsiveness), providing a corresponding voltage variation across the selected resistor 685 as a function of temperature for a given current through the selected resistor 685. For example, a diffusion resistor will generally have a high temperature coefficient (providing more voltage variation with temperature), while a polysilicon resistor will generally have a low temperature coefficient (providing less voltage variation with temperature), while a mix of a plurality of these different resistor types in series for a selected module 675 will provide a corresponding response in between these high and low response levels. Alternatively, the resistors 685 may be sized or weighted to provide different voltage levels as a function of a given current, such as a temperature-dependent current (e.g., I(T)), also thereby providing a corresponding voltage variation as a function of temperature for such a temperature-varying current.

Each switchable resistive module 675 is switched in or out of the voltage control module 650 by a corresponding "q" coefficient of a second plurality ("x") of switching coefficients $q_0$ though $q_{(x-1)}$. When switchable resistive module 675 is switched into the circuit (such as when its corresponding coefficient is a logic high or high voltage), the resulting voltage across its corresponding resistor 685 is also temperature-dependent, due to the temperature-dependent current I(T). In a selected embodiment, three switchable resistive modules 675 were utilized, providing 8 branch combinations. As a result, the control voltage provided to node 625 is also a function of temperature (or other parameter), thereby providing a temperature or other parameter dependence or sensitivity to the variable capacitors 615 in controllable capacitance module 635. Other resistive modules which are more generally parameter-dependent, or which are temperature-independent, are discussed below with reference to FIGS. 23 and 26, and FIG. 28, respectively.

Figure 24:
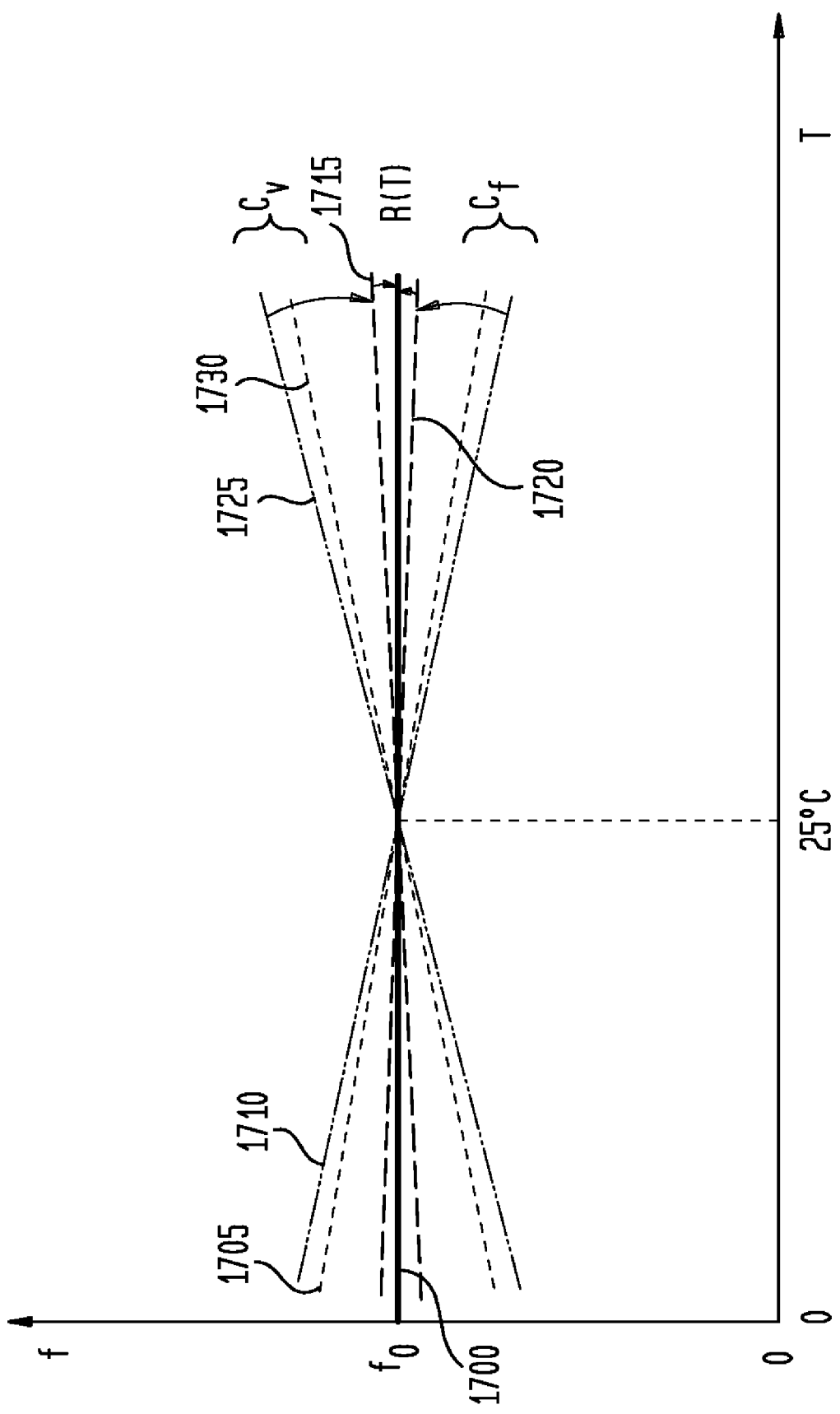
FIG. 24 (or "FIG. 24") is a graph illustrating exemplary frequency control in response to temperature variation in accordance with the teachings of the present invention.

The first plurality of switching coefficients $p_0$ though $p_{(w-1)}$ and the second plurality of switching coefficients $q_0$ though $q_{(x-1)}$ may be determined post-fabrication by testing a representative IC having the clock generator of the present invention. Once a resonant frequency $f_0$ has been selected and/or calibrated for a given fabrication process (discussed below with reference to FIGS. 11 and 12), the temperature (or other parameter) responsiveness of the oscillator is determined and adjusted, to provide a substantially constant selected resonant frequency $f_0$ for such variation in ambient or operating temperature (or other variable parameter). In the exemplary embodiments, the first plurality of switching coefficients $p_0$ though $p_{(w-1)}$ are determined first, by testing various combinations of coefficients, to provide a coarse level of adjustment, resulting in a substantially or mostly flat frequency response as a function of varying ambient temperature. As illustrated in FIG. 24, more or less fixed capacitance $C_f$ or variable capacitance $C_v$ is switched into or out of the oscillator. For example, when the uncompensated frequency response of the oscillator to temperature variation is represented by lines 1705 or 1710, additional variable capacitance $C_v$ may be switched in, providing a coarse adjustment for the frequency response of the oscillator to approximately line 1715. Conversely, also for example, when the uncompensated frequency response of the oscillator to temperature variation is represented by lines 1725 or 1730, additional fixed capacitance $C_f$ may be switched in, providing a coarse adjustment for the frequency response of the oscillator to approximately line 1720.

The second plurality of switching coefficients $q_0$ though $q_{(x-1)}$ are then determined, also by testing various combinations of coefficients, to provide a finer level of adjustment, resulting in a substantially and significantly flat frequency response as a function of varying ambient temperature, illustrated in FIG. 24 as adjusting a partially compensated frequency response (lines 1715 or 1720) to the substantially flat response of line 1700, through selection of the temperature responsiveness of the various resistors 685. The first and second pluralities of coefficients are then loaded into respective registers 495 and 455 in all of the ICs fabricated in the selected processing run (or batch). Depending on the fabrication processing, under other circumstances, it is possible that for higher accuracy, each IC may be separately calibrated. As result, in conjunction with the temperature compensation provided by the negative transconductance amplifier 410 and I(T) generator 415, the overall frequency response of the clock generator is substantially independent of temperature fluctuations.

In other exemplary embodiments, the first plurality of switching coefficients $p_0$ though $p_{(w-1)}$ and the second plurality of switching coefficients $q_0$ though $q_{(x-1)}$ may also be determined and varied dynamically during operation of the oscillator, such as through sensor(s) 1440 and A/D converter 1445, as illustrated in FIG. 21, or through sensor(s) 1815 and control logic (or control loop) 1810 illustrated in FIG. 25. In these alternative embodiments, the stored first and second pluralities of coefficients may be eliminated or bypassed, with corresponding voltages applied directly as control signals to the respective switching components as illustrated in FIGS. 9 and 10 (and, similarly, extended to the other pluralities of coefficients discussed below).

Figure 26:
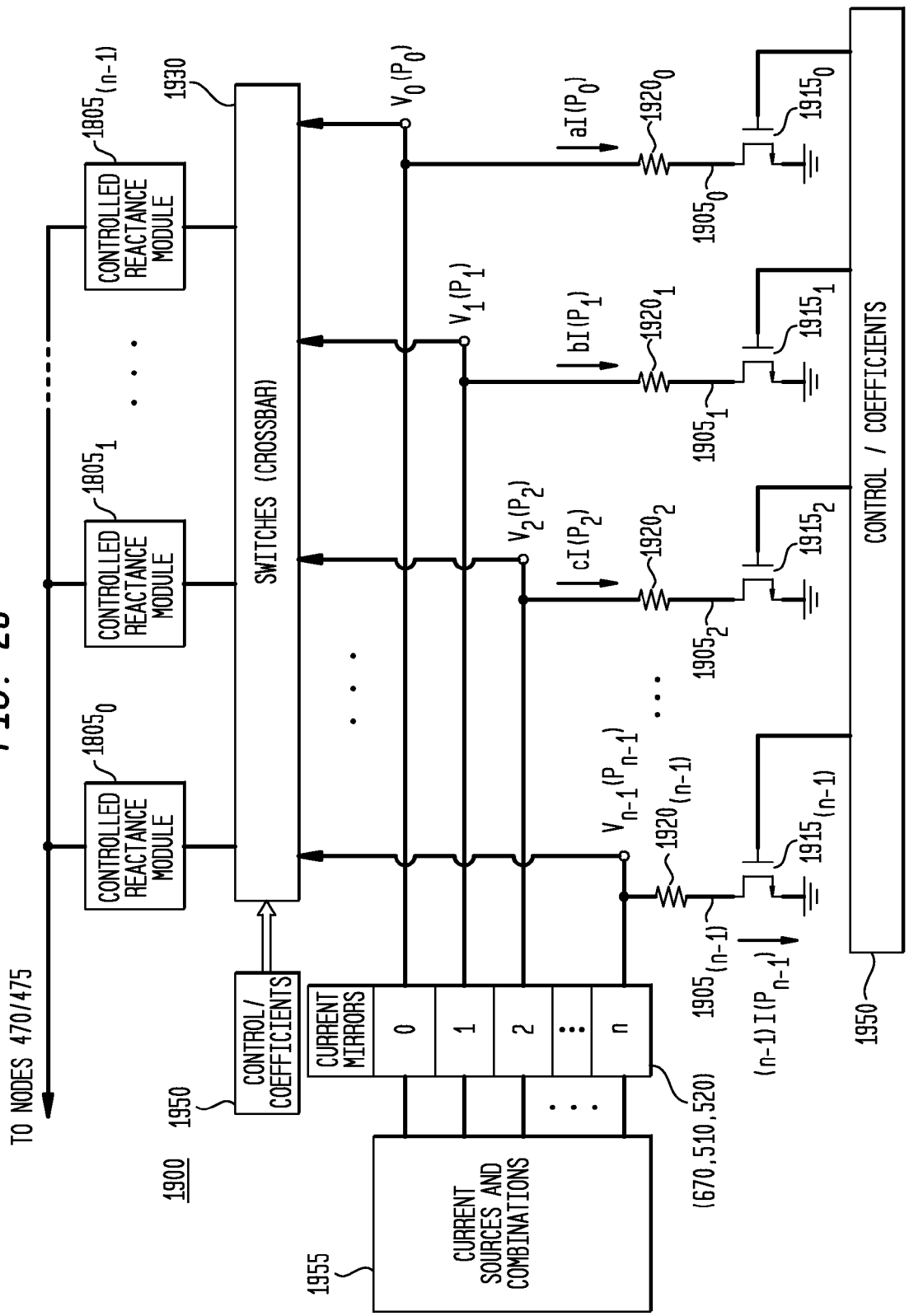
FIG. 26 (or "FIG. 26") is a circuit diagram illustrating an exemplary third controlled capacitance module and an exemplary third voltage control module utilized in a parameter compensation module in accordance with the teachings of the present invention.
Figure 28:
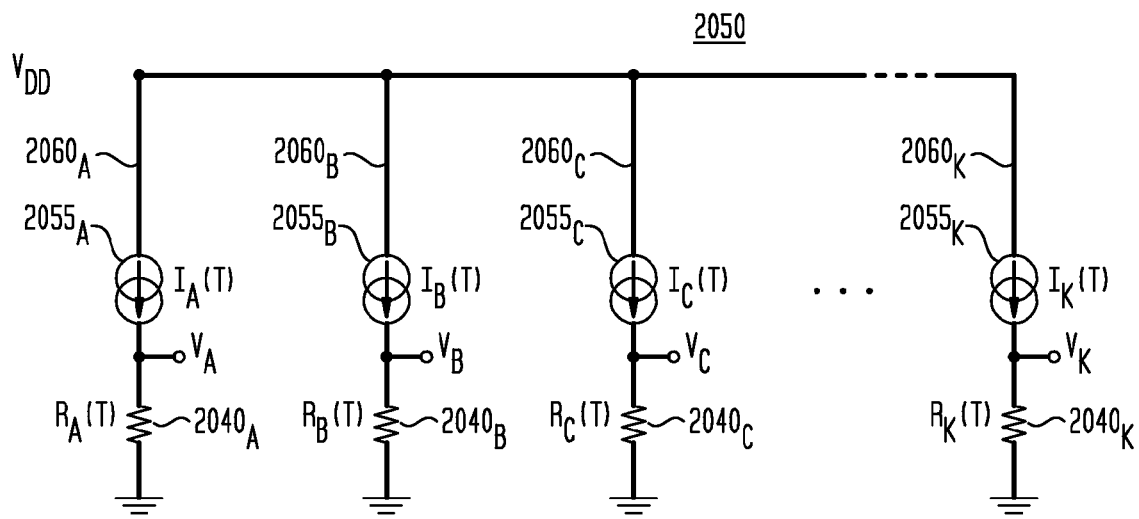
FIG. 28 (or "FIG. 28") is a circuit diagram illustrating an exemplary fourth voltage control module utilized in frequency and process compensation modules in accordance with the teachings of the present invention.

For example, as illustrated in FIG. 26, as discussed in greater detail below, any of a plurality of current sources 1955 may be provided in various combinations to a plurality of resistive modules, to create a plurality of control voltages responsive to a selected parameter "P", which may be switched in any combinations to each of the plurality of controlled reactance modules 1805, which may be embodied, for example, as controlled capacitance modules 1505 (FIG. 22), to control the effective reactance of the resonator. In addition, any of a plurality of constant (temperature independent) control voltages may also be created, as illustrated in FIG. 28. Moreover, other or additional types of current sources may be utilized, either to generate the control voltage or to provide sensor 385, 1440 capability, such as those which may vary with the supply voltage VDD, or which are independent of both supply voltage, temperature, and other parameters. Any of these control voltages may be utilized to provide continuous control in real time, in addition to discrete control, over parameter variations, such as temperature variations.

As a consequence, the overall capacitance provided to the resonant LC tank 405 is distributed into a combination of fixed and variable portions, with the variable portions responsive to provide temperature compensation and, therefore, control over the resonant frequency $f_0$. The more variable capacitance $C_v$ which is switched into the circuit (controlled capacitor module 635), the greater the frequency response to fluctuations in ambient temperature. As indicated above, both fixed and variable capacitors may be implemented using variable capacitors (varactors) coupled or switched, respectively, to substantially constant or variable voltages.

In addition to providing temperature compensation, it should be noted that a switched or controlled (or controllable) capacitance module 635 may also be utilized to select or tune the resonant frequency $f_0$. It will also be apparent to those of skill in the art that a switched or controllable capacitance module 635 may also be utilized to provide a frequency response to other parameter variations, such as fabrication process variations, frequency, and voltage fluctuations. In addition, as discussed below with reference to FIGS. 20 and 25-27, a capacitance, an inductance, a resistance, or any other reactance or impedance element may be utilized in these various exemplary embodiments, providing a controlled reactance or impedance module to provide a selected frequency response to any of a plurality of variable parameters, such as temperature, voltage, fabrication process, or frequency.

Figure 22:
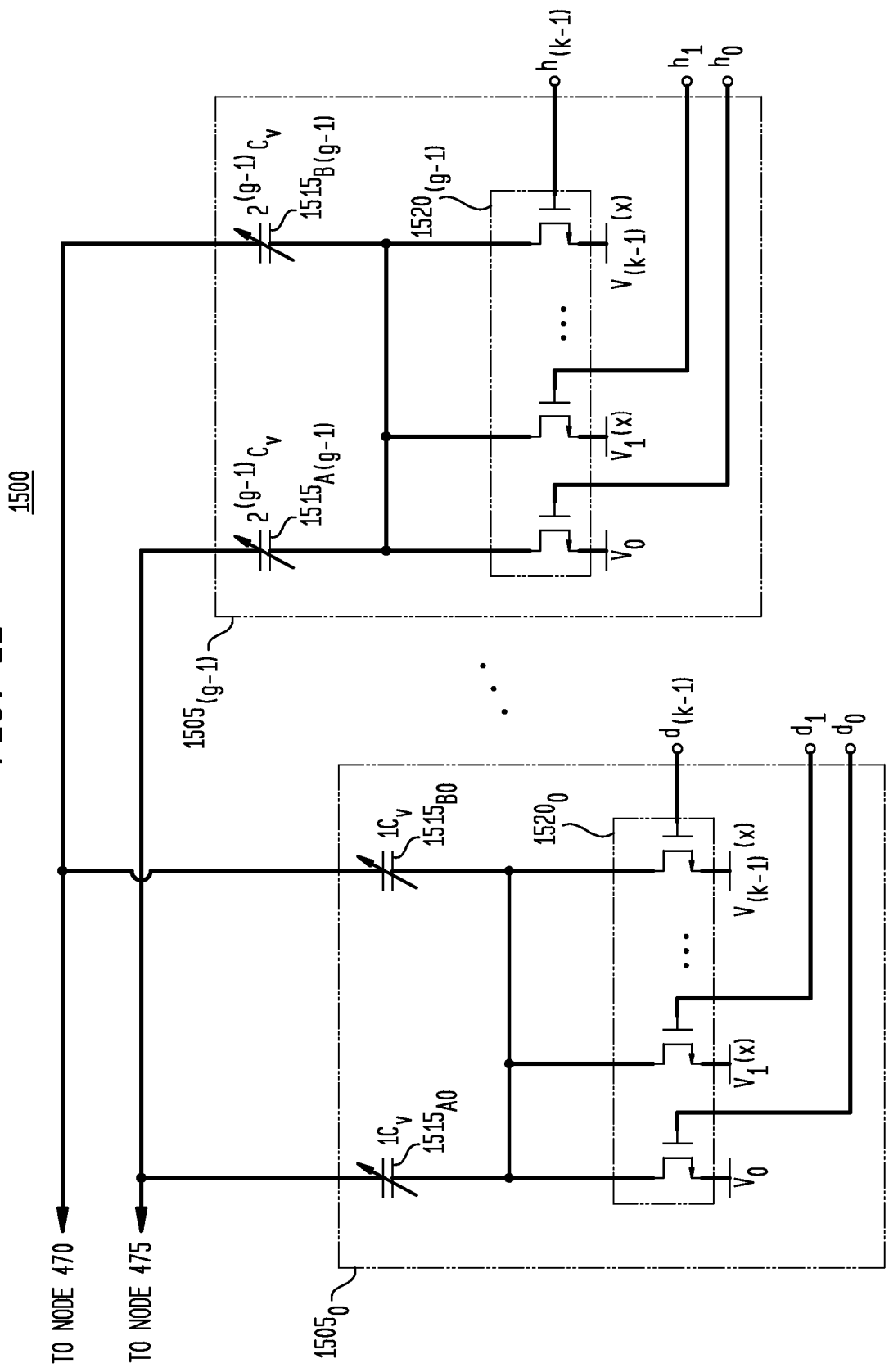
FIG. 22 (or "FIG. 22") is a circuit diagram illustrating an exemplary second controlled capacitance module utilized in a frequency-temperature compensation module in accordance with the teachings of the present invention.

FIG. 22 is a circuit diagram illustrating an exemplary second controlled capacitor module 1500 utilized (with module 1600 of FIG. 23) (in lieu of or in addition to modules 485 and 480) in a frequency-temperature compensation module 420, or more generally, in a frequency controller 215, 349, 1415, in accordance with the teachings of the present invention. The second controlled capacitance module 1500 operates similarly to the first controlled capacitance module 635, but utilizes variable capacitances, instead of both fixed and variable, and utilizes a plurality of different control voltages, instead of a single control voltage. In addition, such variable capacitances are not coupled to or decoupled from the resonator (i.e., the variable capacitances are always coupled to the resonator), and instead are switched to different control voltages to control the frequency response as a function of a selected parameter such as temperature. Selected embodiments, moreover, may utilize as few as one module, and the differential weighting may be accomplished by switching to a selected control voltage of a plurality of control voltages.

Referring to FIG. 22, the second controlled capacitor module 1500 utilizes at least one of a plurality ("g") of variable capacitance modules 1505, each of which contains variable capacitances ($C_v$) $1515_{A0}$ through $1515_{B(g-1)}$ (illustrated in pairs A and B, corresponding to balanced coupling to node 475 or 470, and illustrated with binary-weighting) which are switchable (through pluralities of transistors or other switches $1520_0$ through $1520_{(g-1)}$) to a selected control voltage of a plurality of control voltages $V_0$, $V_1(x)$, through $V_{(k-1)}(x)$, where control voltage $V_0$ is substantially static (substantially non-responsive to the selected parameter "x", such as temperature), while the remaining control voltages $V_1(x)$ through $V_{(k-1)}(x)$ are generally responsive or sensitive to the selected parameter "x", such as temperature. As illustrated, the backplates of each corresponding pair of variable capacitors 1515 (A and B) are coupled to each other (shorted together), and then connected via a switch to a selected control voltage. Each such pair of variable capacitances 1515 is switchable, through corresponding coefficients (illustrated as a fourth plurality of coefficients $d_0$, $d_1$, ... $d_{(k-1)}$ through $h_0$, $h_1$, ... $h_{(k-1)}$, such that each module 1505 may be switched separately and independently to any of the plurality of control voltages $V_0$, $V_1(x)$, through $V_{(k-1)}(x)$. As a consequence, these switchable modules may remain coupled to the resonator with the effective impedance (e.g., reactance) varied through switching to one or more control voltages.

Figure 23:
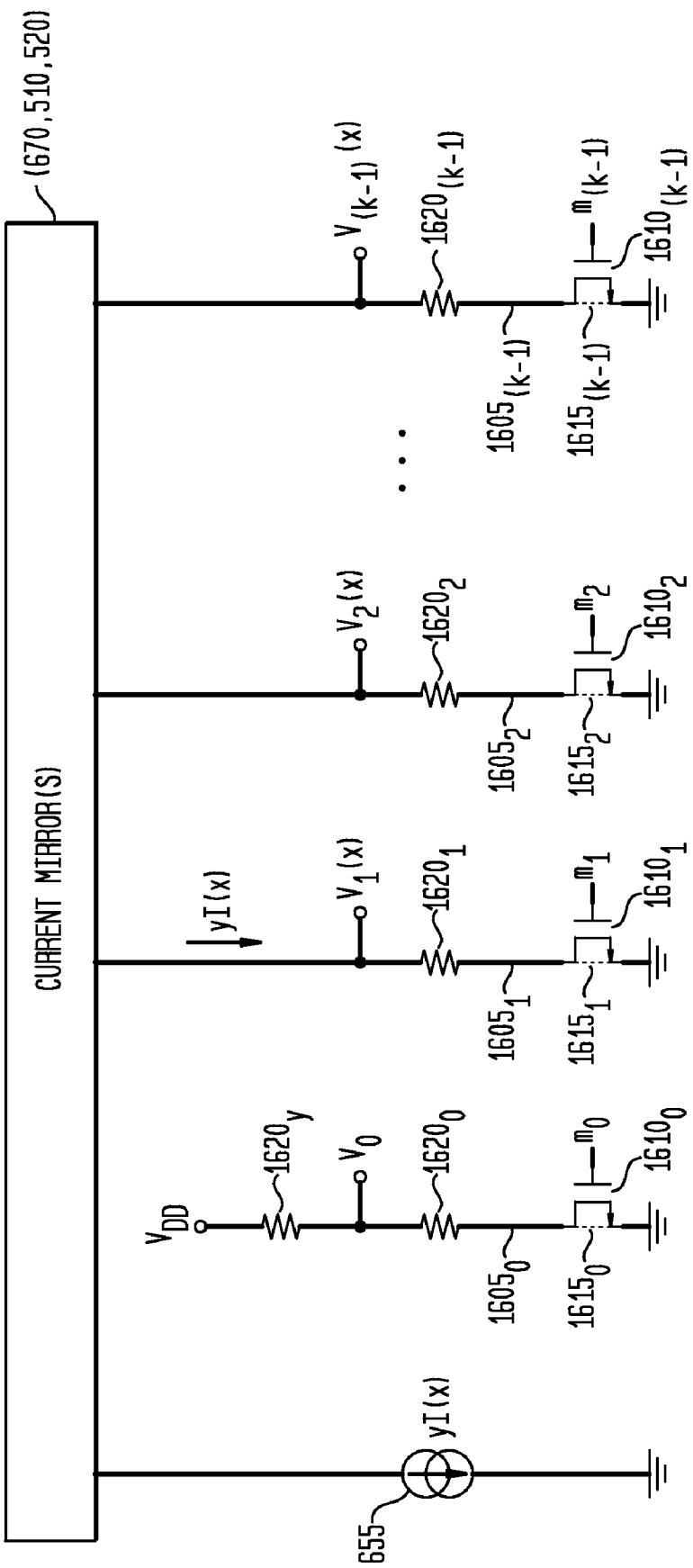
FIG. 23 (or "FIG. 23") is a circuit diagram illustrating an exemplary second voltage control module utilized in a frequency-temperature compensation module in accordance with the teachings of the present invention.

FIG. 23 is a circuit diagram illustrating an exemplary second voltage control module 1600 utilized in a frequency-temperature compensation module in accordance with the teachings of the present invention. As illustrated in FIG. 23, a parameter-sensitive or responsive current source 655 (such as any of the various CTAT, PTAT and PTAT² temperature sensitive current sources, and their combinations, previously discussed an illustrated in FIGS. 7A-7D) is provided (through one or more current mirrors (e.g., 670, 510, 520)) to an array or bank of a plurality "k−1" of resistive modules 1605 (illustrated as modules 1605₀, 1605₁, through 1605₍ₖ₋₁₎), each of which provides a separate or independent control voltage, $V_1(x)$, $V_2(x)$, through $V_{(k-1)}(x)$ which are provided to modules 1505 (of FIG. 22). The various corresponding resistors 1620₀, 1620₁, through 1620₍ₖ₋₁₎ may be any of the types, sizes or weights previously discussed with reference to FIG. 10, to provide any selected voltage response to a selected parameter, such as temperature. A static control voltage, $V_0$, as illustrated, may be generated utilizing any voltage divider coupled between the voltage supply rail $V_{DD}$ and ground, with corresponding resistance magnitudes or values 1605₀ and 1605_y, selected to provide the desired static voltage level. In addition, generation of a plurality of different static or constant (i.e., temperature independent) voltages is illustrated in FIG. 28, by combining different current sources having differently shaped currents in response to temperature (or another parameter) with different temperature-dependent resistors having complementary or opposing temperature responses, resulting in a plurality of control voltages having different magnitudes and substantially constant over temperature variations. Any of these various voltages may be utilized, as needed, as any of the various control voltages.

In the exemplary embodiments, each such control voltage of the plurality of control voltages is different, to provide a plurality of control voltages, each of which are differently responsive or shaped (i.e., provide different responses (response curves) as a function of variations in the selected parameter such as temperature), may respond to different parameters, and others which may be substantially constant with respect to a selected parameter. Depending upon the selected embodiment, the array or bank of resistive modules 1605 may be switchable (through corresponding transistors 1610 (illustrated as transistors 1610₀, 1610₁, through 1610₍ₖ₋₁₎), and thereby switched into or out of the array 1600, or may be statically included (fixed connections 1615, illustrated as dashed lines in FIG. 23) to automatically generate a predetermined number of control voltages $V_0, V_1(x)$, through $V_{(k-1)}(x)$. Depending upon the selection of resistors 1620 (and/or transistors 1610, if included), each of the various control voltages $V_0, V_1(x)$, through $V_{(k-1)}(x)$ will be different or otherwise provide a different response to the selected parameter or variable, such as a different temperature response.

Similarly, FIG. 26 is a circuit and block diagram illustrating an exemplary third voltage control module 1900 which may be utilized to provide control voltages to any of the various modules in accordance with the teachings of the present invention. As illustrated in FIG. 26, a plurality of parameter-sensitive or responsive current sources 1955 (such as any of the various CTAT, PTAT and PTAT² temperature sensitive current sources, and their combinations, previously discussed an illustrated in FIGS. 7A-7D) is provided (through one or more current mirrors (e.g., 670, 510, 520)) to an array or bank of a plurality "n−1" of resistive modules 1905 (illustrated as modules 1905₀, 1905₁, through 1905₍ₙ₋₁₎). Each of the resistive modules 1905 provides a separate or independent control voltage, $V_0(P), V_1(P), V_2(P)$, through $V_{(n-1)}(P)$, creating a plurality of control voltages which are responsive or dependent upon the selected parameter "P", and which are provided to controlled reactance modules 1805, controlled capacitance modules 1505 (of FIG. 22), or any of the other modules utilizing one or more control voltages. The various corresponding resistors 1920₀, 1920₁, through 1920₍ₙ₋₁₎ may be any of the types, sizes or weights previously discussed, to provide any selected voltage response to a selected parameter. The selection of current source (or combination of current sources) and resistor size and type allows the shaping of the response of any desired control voltage to the selected parameter. In addition, any of the plurality of different static or constant (i.e., temperature independent) voltages illustrated in FIG. 28 also may be utilized, as needed, as any of the various control voltages for any of the modules discussed.

Depending upon the selected embodiment, the array or bank of resistive modules 1905 may be switchable (through corresponding transistors 1915 (illustrated as transistors 1915₀, 1915₁, through 1915₍ₙ₋₁₎), and thereby switched into or out of the array, dynamically or statically, to automatically generate a plurality of control voltages $V_0(P), V_1(P), V_2(P)$, through $V_{(n-1)}(P)$. Each of these different control voltages may then be switched (using switches 1930, such as a full crossbar switch), in any combination, statically or dynamically, under the switching control of control signals and/or coefficients 1950, to controlled reactance modules 1805, which may be coupled to the resonator or which also may be switched into or out of the tank. As a consequence, any of these control voltages may be utilized to control the effective reactance of the resonator (oscillator), providing both discrete and continuous control of the resulting resonant frequency. For example, any of these parameter-dependent control voltages $V_0(P), V_1(P), V_2(P)$, through $V_{(n-1)}(P)$, or any of the substantially parameter-independent control voltages (FIG. 28), may be provided to the controlled impedance modules 1305 or the controlled capacitance modules 1505 or 1805 to vary the effective capacitance provided to the resonator, providing frequency control over variations from any of a plurality of parameters.

Referring again to FIG. 22, when each of these different control voltages $V_0, V_1(x)$, through $V_{(k-1)}(x)$, or more generally, $V_0(P), V_1(P), V_2(P)$, through $V_{(n-1)}(P)$, and any of the substantially constant control voltages, is available and switchable to the variable capacitances $C_v$ 1515 in the variable capacitance modules 1505 through the fourth plurality of coefficients $d_0, d_1, \ldots d_{(k-1)}$ through $h_0, h_1, \ldots h_{(k-1)}$, a highly flexible, fine-tuned and highly controllable frequency response to the selected parameter (such as temperature) is provided to the resonator 405, enabling highly accurate frequency control over the resonant frequency $f_0$. For example, variable capacitances $1515_{A(g-1)}$ and $1515_{B(g-1)}$ in module $1505_{(g-1)}$ may be switched to control voltage $V_1(x)$ through parameter $h_1$ (or a corresponding dynamically applied voltage, as a control signal ) being set to a logic high or high voltage with the remaining h parameters of the fourth plurality of parameters set to a logic low or low voltage, providing a first frequency response as a function of temperature or another selected parameter, while variable capacitances $1515_{A0}$ and $1515_{B0}$ in module 1505₀ may be switched to control voltage $V_{(k-1)}(x)$ through parameter $d_{(k-1)}$ (or a corresponding dynamically applied voltage, as another control signal) being set to a logic high or high voltage with the remaining d parameters of the fourth plurality of parameters set to a logic low or low voltage, providing a second frequency response as a function of temperature or another selected parameter, and so on. As discussed above, the fourth plurality of coefficients $d_0, d_1, \ldots d_{(k-1)}$ through $h_0, h_1, \ldots h_{(k-1)}$, also may be determined post-fabrication through testing one or more ICs, or may also be determined and varied dynamically during operation of the oscillator, such as through sensor(s) 1440 and A/D converter 1445, as illustrated in FIG. 21, or through sensor(s) 1815 and control logic (or control loop) 1810 illustrated in FIG. 25. More generally, such control through either coefficients or control signals is illustrated in FIG. 26, and can be utilized to provide either or both discrete or continuous frequency control as a function of any selected parameter, such as temperature, voltage, fabrication process, age, or frequency.

In addition, in lieu of stored coefficients for the first, second or fourth pluralities of coefficients, particularly when the corresponding values would be determined dynamically, as discussed above, corresponding voltages may be directly applied to the various switches (e.g., transistors 1520 or the switching transistors of modules 640 and 650), as control signals, as mentioned above.

Referring again to FIG. 4, another compensation module is also utilized to provide greater control and accuracy over the resonant frequency $f_0$, also for applications in which greater accuracy and less variance (or frequency drift) may be required, such as to provide a frequency accuracy of approximately ±0.25% or better over PVT. In these circumstances, a process variation compensation module 425 may be utilized, to provide control over the resonant frequency $f_0$ independently of fabrication process variations, such as the exemplary modules illustrated in FIGS. 11 and 12. As indicated above, any of these various modules may include any impedance, reactance, or resistance, and be made responsive to any selected parameter, such as temperature, process variation, voltage variation, and frequency variation.

Figure 11:
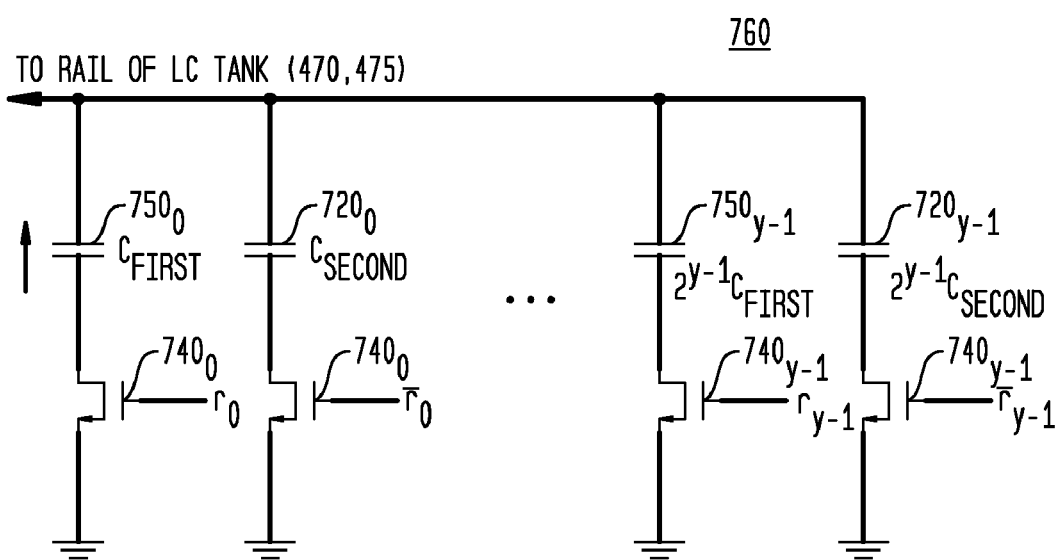
FIG. 11 (or "FIG. 11") is a circuit diagram illustrating an exemplary first process variation compensation module in accordance with the teachings of the present invention.

FIG. 11 is a circuit diagram illustrating an exemplary first process variation compensation module 760 in accordance with the teachings of the present invention. The first process variation compensation module 760 may be utilized as the process compensation modules 460 in FIG. 4, with each module attached to a rail or side of the resonant LC tank 405 (lines or nodes 470 and 475). In addition, each first process variation compensation module 760 is controlled by a third plurality ("y") of switching coefficients $r_0$ though $r_{(y-1)}$, stored in register 465. The first process variation compensation module 760 provides an array of switchable capacitive modules having differentially-weighted (e.g., binary-weighted), first fixed capacitances 750, for adjustment and selection of the resonant frequency $f_0$, by switching in or out a plurality of fixed capacitances 750, through a corresponding plurality of switching transistors 740 (controlled by a corresponding "r" coefficient). Again, as each capacitance branch is switched in or out of the array or circuit 760, the corresponding first fixed capacitance is added or subtracted from the total capacitance available for oscillation in the resonant LC tank, thereby changing the effective reactance and modulating the resonant frequency. The third plurality of switching coefficients $r_0$ though $r_{(y-1)}$ is also determined post-fabrication using test ICs, generally as an iterative process with the determinations of the first and second (or fourth) pluralities of switching coefficients. This calibration is accomplished using the frequency calibration module (325 or 430) and a reference oscillator known to have a predetermined frequency. The determined "r" coefficients are then stored in the corresponding registers 465 of the ICs of that production or process batch. Alternatively, each IC may be calibrated separately, for example.

In addition to such calibration methods, the third plurality of switching coefficients $r_0$ though $r_{(y-1)}$ may also be determined using other methods, discussed below, such as using various voltage and current sensors to measure parameters or variables which reflect fabrication process parameters, such as transistor threshold voltages, resistance magnitudes or values of the tank, or absolute current levels produced by the various current sources. Such measured values may then be utilized to provide corresponding coefficients (the third plurality of switching coefficients $r_0$ though $r_{(y-1)}$) and/or control signals for corresponding frequency adjustment. For example, such measured or sensed values may be converted to digital values, which are then indexed to a lookup table in memory, which then provides stored values based on known values, or other calibrations or modeling.

To avoid additional frequency distortions, several additional features may be implemented with this first process variation compensation module 760. First, to avoid additional frequency distortion, the on resistance of the MOS transistors 740 should be small, and therefore the transistors' width/length ratio is large. Second, large capacitances may be split into two branches, with two corresponding transistors 740 controlled by the same "r" coefficient. Third, to provide for the resonant LC tank to have a similar load under all conditions, when a first fixed capacitance 750 is switched in or out of the circuit 760, a corresponding second fixed capacitance 720, as a "dummy" capacitor (having a significantly smaller capacitance or the smallest size allowed by the design rules for the fabrication process), is correspondingly switched out of or into the circuit, based on the inverse of the corresponding "r" coefficient. As a consequence, approximately or substantially the same on resistance of the transistors 740 is always present, with only the amount of capacitance varied.

As an alternative to the use of the "dummy" capacitances, metal fuses or the like could be utilized instead of the transistors 740. Metal fuses would be left intact to include the corresponding fixed capacitance 750, and could be "blown" (open-circuited) to remove the corresponding fixed capacitance 750 from the resonant LC tank 405.

Figure 12:
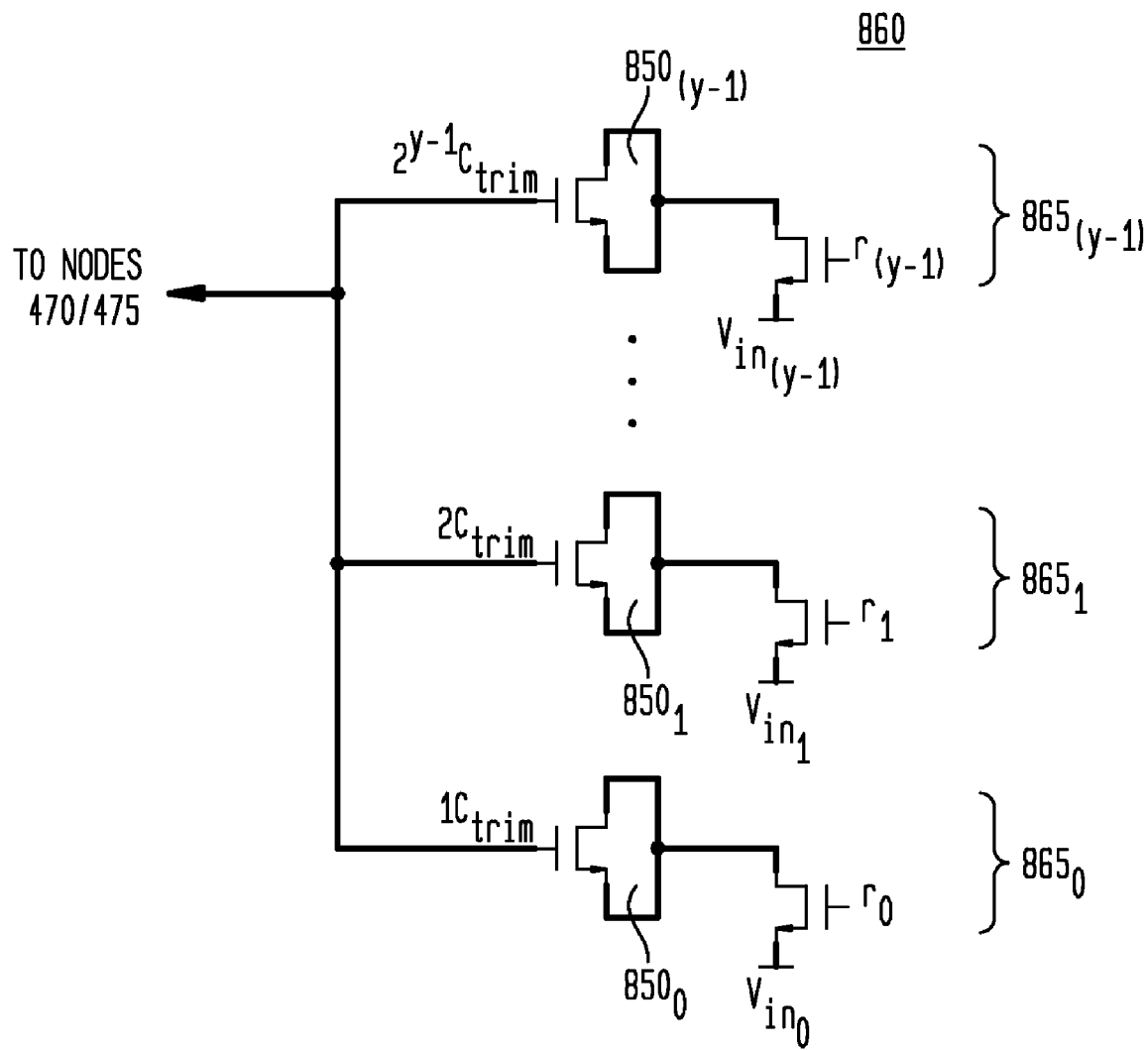
FIG. 12 (or "FIG. 12") is a circuit diagram illustrating an exemplary second process variation compensation module in accordance with the teachings of the present invention.

FIG. 12 is a circuit diagram illustrating an exemplary second process variation compensation module 860 in accordance with the teachings of the present invention. The second process variation compensation module 860 may be utilized as the process compensation modules 460 in FIG. 4, with each module attached to a rail or side (lines 470 and 475) of the resonant LC tank 405, instead of modules 760. More generally, the second process variation compensation module 860 is utilized as part of frequency controller (215, 349 or 1415), such as process (or other parameter) modulator or compensator 1430 (FIG. 21). In addition, each second process variation compensation module 760 would also be controlled by a third plurality of switching coefficients $r_0$ though $r_{(y-1)}$, stored in register 465. (Because of the different circuitry employed in each exemplary process variation compensation module 760 or 860, however, the corresponding third pluralities of switching coefficients $r_0$ though $r_{(y-1)}$ generally would, of course, be different from each other.) In addition, such switching may be controlled through use of any control signals, discussed above.

It should be noted that FIG. 12 provides a varactor illustration different from those utilized in other Figures, in which a varactor 850 is represented by a MOS transistor, rather than as a capacitor with an arrow through it. Those of skill in the art will recognize that varactors are often AMOS or IMOS transistors, or more generally MOS transistors, such as those illustrated in FIG. 12, and configured by shorting the transistor's source and drain. As a consequence, the other illustrated varactors may be consider to include, as potential embodiments, the AMOS or IMOS transistors as configured as in FIG. 12. In addition, the varactors 850 may also be binary-weighted with respect to each other, or may use another differential weighting scheme.

The second process variation compensation module 860 has a similar structural concept, but additional notable differences from the first process variation compensation module 760. The second process variation compensation module 860 provides an array or bank of a plurality of switchable variable capacitive modules 865, without MOS switches/transistors, and hence the losses or loading through the MOS transistors are eliminated. Instead, the load appears as a low loss capacitance; such low loss also implies that the oscillator start-up power is less. In the second process variation compensation module 860, a MOS varactor 850 is switched either to Vin, which may be any of the various pluralities of control voltages discussed above, to provide a corresponding capacitance level to the resonant LC tank 405, or may be switched to ground or the power rail (voltage $V_{DD}$), thereby providing either the minimum capacitance or the maximum capacitance to the resonant LC tank 405 based upon the varactor 850 geometry. For AMOS, switched to voltage $V_{DD}$ would provide minimum capacitance and switched to ground would provide maximum capacitance, while the opposite is the case for IMOS. Again, the second process variation compensation module 860 is comprised of an array of variable capacitances, as varactors 850, for adjustment and selection of the resonant frequency $f_0$, by coupling or switching a selected varactor 850 to any of a plurality of control voltages (Vin), or to ground or $V_{DD}$, such as switching between a first voltage and a second voltage, through a corresponding "r" coefficient or through application of a corresponding control signal. In another alternative, instead of a plurality or an array, one varactor 850 may be utilized, with its effective reactance provided to the tank controlled by a selected control voltage.

As each capacitance branch is switched to a corresponding control voltage, ground or $V_{DD}$, the corresponding variable capacitance is added to or not included in the total capacitance available for oscillation in the resonant LC tank, thereby changing its effective reactance and modulating the resonant frequency. More particularly, for an AMOS implementation, coupling to $V_{DD}$ (as $V_{in}$) provides lesser capacitance and coupling to ground ($V_{in}=0$) provides greater capacitance, with the opposite holding for an IMOS implementation, in which coupling to $V_{DD}$ (as $V_{in}$) provides greater capacitance and coupling to ground ($V_{in}=0$) provides lesser capacitance, where it is assumed that the voltage on the rails of the LC tank (nodes or lines 470 and 475 of FIG. 4) is between zero V and voltage $V_{DD}$, and significantly or substantially far from either voltage level. Coupling to voltages between $V_{DD}$ and ground, such as many of the various control voltages, as Vin, will provide a corresponding, intermediate level of capacitance to the tank. The third plurality of switching coefficients $r_0$ though $r_{(y-1)}$ is also determined post-fabrication using test ICs, also generally as an iterative process with the determinations of the first and second pluralities of switching coefficients. The determined "r" coefficients are then stored in the corresponding registers 465 of the ICs of that production or process batch. Again, individual ICs may also be calibrated and tested separately. In addition, any selected number of modules 850 may be controlled dynamically, to provide continuous frequency control during oscillator operation.

As indicated above, depending upon the type (AMOS or IMOS) of varactor, switching any of the variable capacitive modules 865 to $V_{DD}$ or ground, as first and second voltage levels, results in the corresponding maximum capacitance or no (negligible) capacitance being included as effective capacitance for the resonator (LC tank). As mentioned above, however, other capacitance levels intermediate between such maxima and minima may also be generated, by switching the variable capacitive modules 865 to a corresponding control voltage. Utilizing a plurality of control voltages having different magnitudes, results in a corresponding capacitance of the variable capacitive modules 865 being added to (or sub-tracted from) the LC tank, thus changing its effective reactance and modulating the resonant frequency.

FIG. 28 is a circuit diagram illustrating an exemplary fourth voltage control module 2050 utilized in frequency, process and other parameter compensation modules in accordance with the teachings of the present invention. Referring to FIG. 28, a plurality of substantially constant voltage modules 2060 (illustrated as $2060_A$, $2060_B$, $2060_C$ through $2060_K$) are utilized to create a corresponding plurality of control voltages which are substantially constant with respect to a selected parameter, such as temperature, and which have a corresponding plurality of different magnitudes, creating a plurality of control voltages $V_A$, $V_B$, $V_C$ through $V_K$, which have different magnitudes. As illustrated, the plurality of different, substantially static or constant (i.e., temperature independent) voltages is created by combining different current sources 2055 (illustrated as current sources $2055_A$, $2055_B$, $2055_C$ through $2055_K$), each having different responses to temperature or another parameter (i.e., differently shaped currents in response to temperature (or another parameter)), with a corresponding plurality of resistors 2040 (illustrated as corresponding resistors $2040_A$, $2040_B$, $2040_C$ through $2040_K$), each of which have a temperature or other parameter-dependent response which is opposing or complementary to the corresponding current source 2055 of the particular module 2060. Each corresponding current source 2055 and resistor 2040 is selected to have such opposing or complementary responses with the other, to effectively cancel the other's response to the selected parameter. For example, a current source 2055 is selected to have a particular combination of PTAT, CTAT or $CTAT^2$ current sources of appropriate magnitude, and a resistor 2040 is selected based on size, type, and so on, such that the resulting voltage is substantially constant over the parameter variations, e.g., temperature variations. Any of these various voltages may be utilized, as needed, as any of the various control voltages, such as to provide a corresponding Vin for the variable capacitive modules 865 illustrated in FIG. 12, to adjust the effective capacitance (reactance) of the resonator and the resulting resonant frequency.

It should also be noted that the illustrated embodiments for modules such as temperature compensator 315 (or 410, 415 and/or 420) and process variation compensator 320 (or 425 and 460), such as those illustrated in FIGS. 6-12, may be utilized for other purposes. For example, the various illustrated embodiments for the compensator 315 (or 410, 415 and/or 420) may be made dependent upon process variation, rather than temperature. Similarly, the various illustrated embodiments for the compensator 320 (or 425 and 460) may be made dependent upon temperature, rather than process variation. As a consequence, the embodiments for these and other modules should not be considered limited to the exemplary circuits and structures illustrated, as those of skill in the art will recognize additional and equivalent circuits and applications, all of which are within the scope of the invention.

As indicated above, the various illustrated controlled capacitance modules (485, 635, 460, 760, 860, 1501) may be generalized to any reactance or impedance element, whether a capacitance, inductance, resistance, or combination of capacitance, inductance or resistance. An array or bank 1300 of such a plurality ("a") of switchable, controlled impedance (or reactance) modules 1305 are illustrated in FIG. 20, and may be utilized within the frequency controller (215, 349, 1400) of the present invention, as any of the various modulators or compensators (315, 320, 355, 1420, 1425, 1430). Each differently weighted, controlled reactance or impedance module 1305 (illustrated as $1305_0$, $1305_1$, through $1305_{(a-1)}$)

is comprised of one or more fixed reactances $Z_f$ 1315, variable reactances $Z_v$ 1310, or "dummy" reactances 1320, which are switchable in response to a corresponding coefficient "s" of a fifth plurality of coefficients ($s_0$, $s_1$, through $s_{(a-1)}$). The array of controlled reactance or impedance modules 1305 generally may be implemented to operate as discussed above with respect to any of the various controlled capacitance modules, in any of the various embodiments. The fifth plurality of coefficients may be determined post-fabrication, or dynamically, as discussed above for the other sets of coefficients. In addition, depending upon the implementation, the various reactances or impedances may be switched in or out of the array 1300 or switched to various control voltages or ground, as previously illustrated, and may be utilized to provide a selected frequency response of the oscillator in response to any of a plurality of parameters, such as temperature variations, voltage fluctuations, fabrication process, or frequency.

Similarly, referring to FIG. 25, an array or bank of a plurality "n" of switchable, controlled reactance modules 1805 are illustrated (as controlled reactance modules $1805_0$ through $1805_{(n-1)}$), and also may be utilized within the frequency controller (215, 1415) of the present invention, as any of the various modulators or compensators (315, 320, 355, 1420, 1425, 1430). These controlled reactance modules 1805 may also be binary, linearly, or otherwise differently weighted, and switched in or out of the various circuits, switched to one or more control voltages, or any combination thereof, and may be responsive to any selected parameter. The array of controlled reactance modules 1805 generally may be implemented to operate as discussed above with respect to any of the various controlled capacitance modules, in any of the various embodiments. Rather than being switched to the oscillator through a plurality of coefficients, in this exemplary embodiment, the controlled reactance modules 1805 are switched dynamically, through voltages or currents provided directly by sensors 1815 and control logic 1810, with feedback provided (line or node 1820), and which may be implemented as known in the art, or as illustrated above, with all such variations considered within the scope of the present invention. In addition, the reactance modules may be more considered more broadly, as impedance modules, with both a resistive and/or reactance aspect, such as utilizing the various resistors illustrated in FIG. 29.

For example, such variations in the selected parameter may be determined in any of a plurality of ways previously discussed, such as through a temperature-sensitive current source, other temperature sensors, or any other type of sensor which is responsive to the selected parameter. For example, a sensor may comprise a voltage across a diode, providing a voltage output responsive to temperature. Referring to FIG. 21, the output of such a sensor 1440 may be provided to A/D converter 1445, which provides a digital output indicative of the level of the sensed parameter, which may then be utilized as the corresponding coefficients (any of the pluralities of coefficients discussed above), or utilized to dynamically switch any of the various controlled reactance or impedance modules (e.g., 1305, 1805) or the various second controlled capacitance modules. Similarly, sensor 1815 output may be provided to control logic 1810, which may also adjust the various reactances, either statically or dynamically, and with or without feedback from the resonator.

Figure 27:
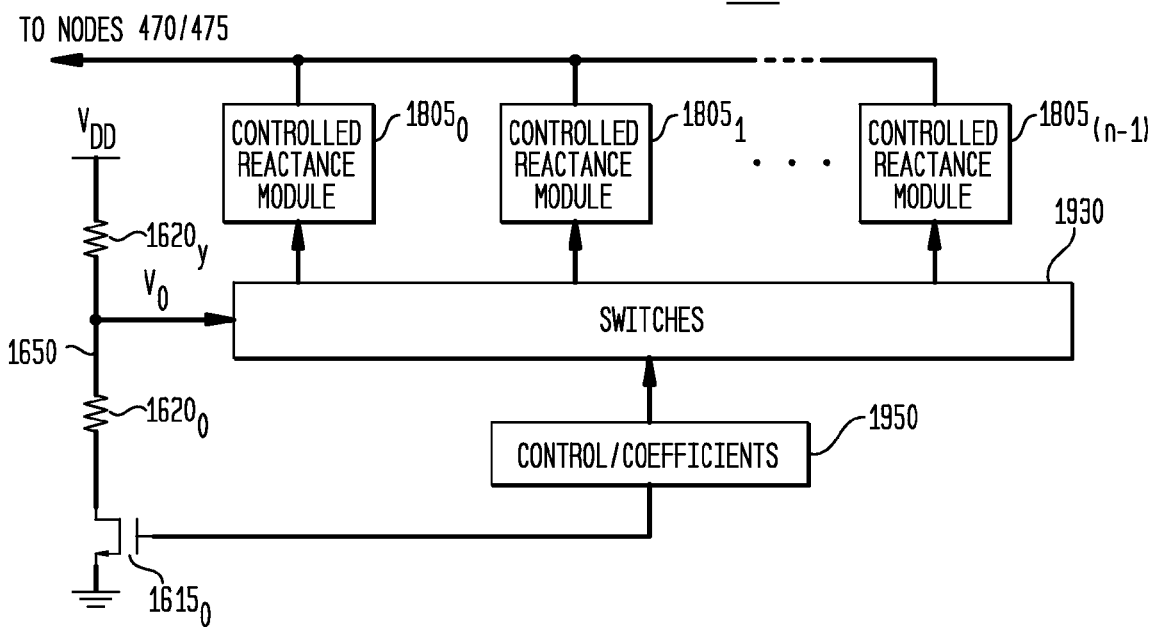
FIG. 27 (or "FIG. 27") is a circuit and block diagram illustrating an exemplary voltage variation compensation module in accordance with the teachings of the present invention.

FIG. 27 is a circuit and block diagram illustrating an exemplary voltage variation compensation module 2000 in accordance with the teachings of the present invention, and may be utilized as a voltage variation compensator 380, 1455 illustrated in FIGS. 3 and 21. Referring to FIG. 27, a switchable resistive module 1650 forms a voltage divider, using resistors 1620$_0$ and 1620$_y$, providing voltage $V_O$. In the event of fluctuations in the supply voltage (power rail) $V_{DD}$, voltage $V_O$ is correspondingly changed. As voltage $V_O$ can be switched (switches 1930) (as discussed above) to any of the controlled reactance modules 1805, under the control of control signals or coefficients 1950, the effective capacitance to the tank is also varied, thereby modulating the resonant frequency. As a result, the resonant frequency may be controlled over such voltage fluctuations. Other implementations will be apparent based upon the other illustrated embodiments, and are also within the scope of the invention.

Figure 29:
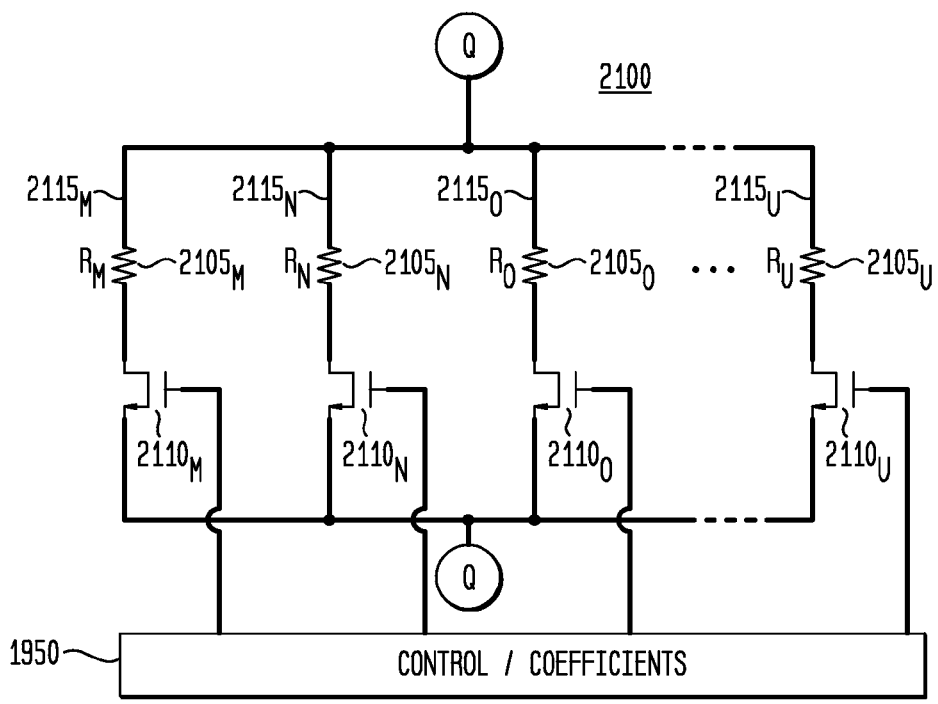
FIG. 29 (or "FIG. 29") is a circuit diagram illustrating an exemplary resistive control module in accordance with the teachings of the present invention.

As indicated above, the resonant frequency of the tank may also be modified by varying the resistance to the tank, in addition to the intrinsic or parasitic resistances $R_L$ 445 and $R_C$ 450 of FIG. 4. FIG. 29 is a circuit diagram illustrating an exemplary resistive control module 2100 which may be utilized as or as part of any of the various frequency control module and the various frequency controllers in accordance with the teachings of the present invention. Such a resistive control module 2100 may be inserted into node Q in resonator 405 of FIG. 4, in series with inductor 435 and $R_L$ 445, or in series with capacitor 440 and $R_C$ 450, or both. Each switchable resistive module 2115 (illustrated as the plurality of switchable resistive modules $2115_M$, $2115_N$, $2115_O$ through $2115_U$) has a differently weighted (such as a binary-weighted), resistor 2105 (illustrated as corresponding resistors $2105_M$, $2105_N$, $2105_O$ through $2105_U$), and is switchable in or out of the array or module 2100 through corresponding transistors or switches 2110 (illustrated as transistors $2110_M$, $2110_N$, $2110_O$ through $2110_U$), under the control of control signals and/or coefficients 1950. As indicated above, such switching also provides another mechanism to control or modulate the resonant frequency of the resonator 405, and may be a function of any selected parameter, or may be parameter independent, such as for resonant frequency selection.

Figure 30:
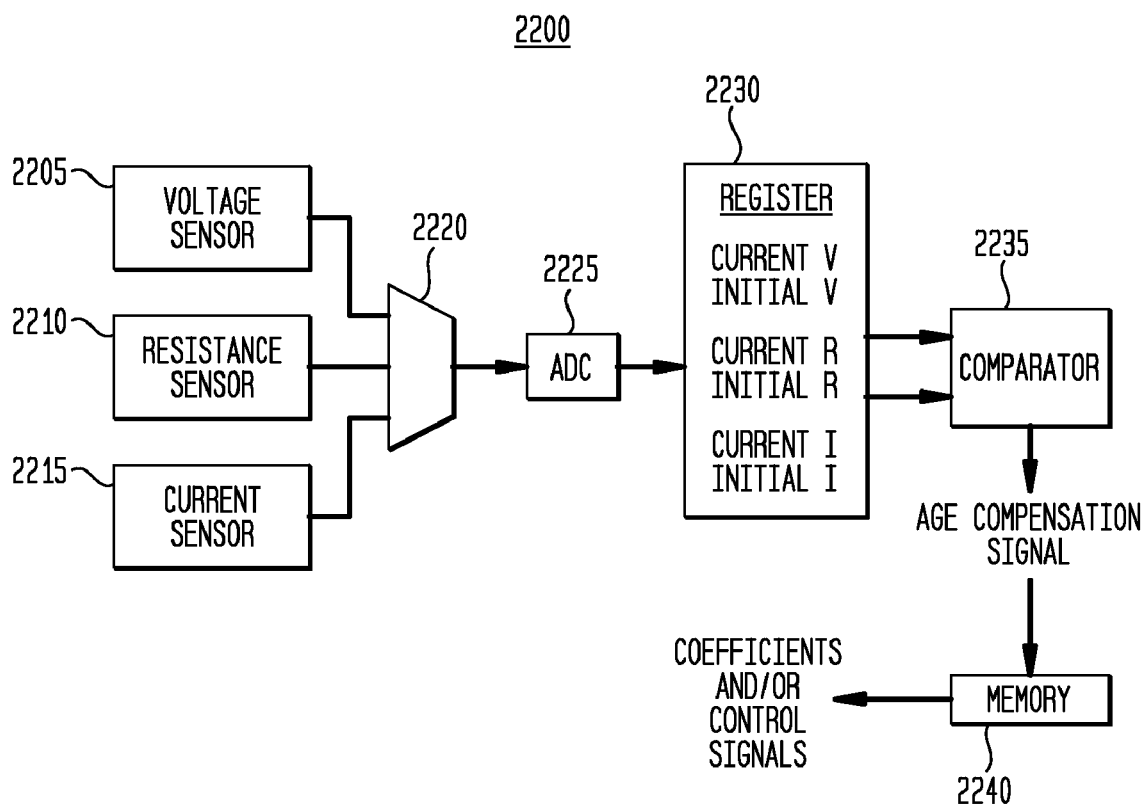
FIG. 30 (or "FIG. 30") is a block diagram illustrating an exemplary age variation compensator in accordance with the teachings of the present invention.

FIG. 30 is a block diagram illustrating an exemplary age variation compensator 2200 in accordance with the teachings of the present invention. As illustrated in FIG. 30, various sensors are utilized to measure a relevant parameter which is or may be affected by the passage of time, or which otherwise changes over the lifetime of an IC, such as a voltage sensor 2205 to measure a threshold voltage of a transistor, a resistance sensor 2210 to measure one or more resistance magnitudes or values of the tank, and/or a current sensor to measure absolute current levels produced by the various current sources. A selected measurement, at a given point in time is provided (via multiplexer 2220) to ADC 2225, for conversion into a digital value, which is stored in a register or other non-volatile memory 2230. When the IC is first powered on or otherwise initialized, an initial measurement is stored in the register 2230, to provide a basis for comparison for subsequent measurements. Subsequently, additional measurements may be performed, with the resulting values stored as corresponding current values in register 2230, illustrated as current and initial values for voltage, resistance and current. For a given parameter, such as voltage, current and initial values may be read and compared, comparator 2235, which then provides a corresponding age compensation signal proportional to any difference between the two values. Such difference values provided by the age compensation signal may then be utilized to provide corresponding coefficients and/or control signals for corresponding frequency adjustment. For example, such age compensation signals may be indexed to a lookup table in memory 2240, which then provides stored values based on known values, or other calibrations or modeling of age affects, and provides for corresponding frequency adjustments using any of the various modulators and compensators discussed above.

Referring again to FIG. 21, the frequency controller 215, 349, 1415 of the present invention may comprise one or more of the following components: (1) a transconductance modulator 1410 (e.g. 410, 415 and the embodiments illustrated in FIGS. 6-8), which in the exemplary embodiments, may also include or be coupled to sustaining amplifier 305; (2) a variable parameter modulator 1425, to modulate the resonant frequency $f_0$ in response to any selected parameter, such as temperature, fabrication process variation, voltage variation, or frequency, such as the various controlled capacitance modules 485, 635, 1505 or controlled reactance modules 1305, 1805; (3) a process (or other parameter) modulator or compensator 1430, such as process variation compensator 425, 760, 860, or controlled reactance modules 1305, 1805; (4) a voltage variation compensator 380, 1455; and/or (5) an age (time) variation compensator (or modulator) 365, 1460. It will be observed by those of skill in the art that the various divisions between transconductance modulator 1410, variable parameter modulator 1425, or process (or other parameter) modulator or compensator 1430 or the other compensators and modulators are arbitrary and do not limit the scope of the present invention, as each may be made responsive to any of the parameters discussed above, and each may be utilized for any of the purposes discussed above (e.g., the variable parameter modulator 1425 may be utilized to compensate for fabrication process variations, etc., rather than temperature variations, for example). In addition, depending upon the selected implementation, one or more coefficient registers 1435 (e.g., 455, 465, 495) may be utilized to store any of the pluralities of coefficients discussed above. In alternative embodiments, such coefficients may not be needed, with switching voltages or currents applied directly, either statically or dynamically, as control signals.

Also in the exemplary embodiments, these various components may include a sensor 1440, 1815 (e.g., yI(x) (or I(T)) generator 415, 515), or such as sensor may be provided as a separate component, such as a current source coupled to a diode as discussed above. Also, depending on the selected embodiment, and A/D converter 1445 and control logic 1450, 1810, to provide the selected frequency control.

In summary, the exemplary embodiments of the present invention provide an apparatus for frequency control of a resonator, with the resonator adapted to provide a first signal having a resonant frequency. The apparatus comprises a sensor (1440, 1815) adapted to provide a second signal, such as a control voltage, in response to at least one parameter of a plurality of parameters; and a frequency controller (215, 1415) coupled to the sensor and couplable to the resonator, with the frequency controller adapted to modify the resonant frequency in response to the second signal. The plurality of parameters are variable and comprise at least one of the following parameters: temperature, fabrication process, voltage, frequency, and age.

In the exemplary embodiments, the frequency controller is further adapted to modify a reactance or impedance element coupled to the resonator in response to the second signal, such as modifying a total capacitance of the resonator in response to the second signal (FIG. 9), coupling to the resonator or decoupling from the resonator a fixed or variable capacitance (635), modifying the effective reactance of a varactor coupled to the resonator by switching the varactor to a selected control voltage, or equivalently, modifying an inductance of the resonator in response to the second signal, such as by coupling to the resonator or decoupling from the resonator a fixed or variable inductance, or modifying a resistance (or other impedance) of the resonator in response to the second signal, such as by coupling to the resonator or decoupling from the resonator a resistance.

In the exemplary embodiments, the frequency controller may further comprise: a coefficient register adapted to store a first plurality of coefficients; and a first array (635) having a plurality of switchable capacitive modules coupled to the coefficient register and couplable to the resonator, each switchable capacitive module having a fixed capacitance 615 and a variable capacitance 620, each switchable capacitive module responsive to a corresponding coefficient of the first plurality of coefficients to switch between the fixed capacitance and the variable capacitance and to switch each variable capacitance to a control voltage. The plurality of switchable capacitive modules may be binary-weighted. The frequency controller may further comprise a second array 650 having a plurality of switchable resistive modules coupled to the coefficient register and further having a capacitive module, the capacitive module and the plurality of switchable resistive modules further coupled to a node 625 to provide the control voltage, with each switchable resistive module responsive to a corresponding coefficient of a second plurality of coefficients stored in the coefficient register to switch the switchable resistive module to the control voltage node 625. In selected embodiments, the sensor further comprises a current source 655 responsive to temperature, wherein the current source is coupled through a current mirror 670 to the second array to generate the control voltage across at least one switchable resistive module of the plurality of switchable resistive modules. Also in selected embodiments, the current source has at least one CTAT, PTAT, or $PTAT^2$ configuration (FIGS. 7A-7D). In addition, each switchable resistive module of the plurality of switchable resistive modules has a different temperature response for a selected current.

In other exemplary embodiments, the sensor is a temperature sensor and varies the second signal in response to temperature variation. The selected embodiments may also include an analog-to-digital converter 1445 coupled to the temperature sensor to provide a digital output signal in response to the second signal, and a control logic block 1450 to convert the digital output signal to the first plurality of coefficients.

In other exemplary embodiments, the frequency controller further comprises a process variation compensator 320, 425, 760 or 860, the process variation compensator couplable to the resonator and adapted to modify the resonant frequency in response to a fabrication process parameter of the plurality of parameters. The process variation compensator may further comprise a coefficient register adapted to store a plurality of coefficients; and an array 760 having a plurality of switchable capacitive modules coupled to the coefficient register and to the resonator, each switchable capacitive module having a first fixed capacitance 750 and a second fixed capacitance 720, each switchable capacitive module responsive to a corresponding coefficient of the plurality of coefficients to switch between the first fixed capacitance and the second fixed capacitance. In other exemplary embodiments, the process variation compensator may further comprise a coefficient register adapted to store a plurality of coefficients; and an array 860 having a plurality of binary-weighted switchable variable capacitive modules 865 coupled to the coefficient register and to the resonator, each switchable variable capacitive module responsive to a corresponding coefficient of the plurality of coefficients to switch between a first voltage and a second voltage.

In other exemplary embodiments, a frequency controller further comprises a coefficient register adapted to store a first plurality of coefficients; and a first array 1500 having a plurality of switchable, binary-weighted capacitive modules 1505 coupled to the coefficient register and couplable to the resonator, each switchable capacitive module having a variable capacitance 1515, each switchable capacitive module responsive to a corresponding coefficient of the first plurality of coefficients to switch (1520) the variable capacitance to a selected control voltage of a plurality of control voltages. The sensor may comprises a current source responsive to temperature, and the frequency controller may also include a second array 1600 having a plurality of resistive modules 1605 coupled through a current mirror (670, 510, 520) to the current source (655), the plurality of resistive modules adapted to provide the plurality of control voltages, and wherein each resistive module of the plurality of resistive modules has a different response to temperature and is adapted to provide a corresponding control voltage, of the plurality of control voltages, in response to a current from the current source.

In other exemplary embodiments, an apparatus for frequency control of a resonator comprises a coefficient register adapted to store a first plurality of coefficients; and a first array (1300, 1800) having a plurality of switchable reactance modules (1305, 1805) coupled to the coefficient register and to the resonator, each switchable reactance module responsive to a corresponding coefficient of the first plurality of coefficients to switch a corresponding reactance to the resonator to modify the resonant frequency. The corresponding reactance may be a fixed or variable inductance, a fixed or variable capacitance, or any combination thereof. The corresponding reactance may be switched between the resonator and a control voltage or a ground potential, and the control voltage may be determined by a current source responsive to temperature. For example, the corresponding reactance is variable and is switched between the resonator and a selected control voltage of a plurality of control voltages. In selected embodiments, the first plurality of coefficients are calibrated or are determined by a sensor responsive to at least one parameter of a plurality of variable parameters, such as temperature, fabrication process, voltage, and frequency.

In the exemplary embodiments, the plurality of switchable reactance modules may further comprise a plurality (635) of binary-weighted switchable capacitive modules 640, each switchable capacitive module having a fixed capacitance and a variable capacitance, each switchable capacitive module responsive to a corresponding coefficient of the first plurality of coefficients to switch between the fixed capacitance and the variable capacitance and to switch each variable capacitance to a control voltage. The apparatus may also include a current source 655 responsive to temperature; and a second array having a plurality of switchable resistive modules 675 coupled to the coefficient register and selectively couplable to the current source, the second array further having a capacitive module 680, the capacitive module and the plurality of switchable resistive modules further coupled to a node 625 to provide the control voltage, each switchable resistive module responsive to a corresponding coefficient of a second plurality of coefficients stored in the coefficient register to switch the switchable resistive module to the control voltage node, and wherein each switchable resistive module of the plurality of switchable resistive modules has a different temperature response for a selected current from the current source.

In other exemplary embodiments, the plurality of switchable reactance modules further comprise a plurality 1500 of binary-weighted switchable capacitive modules 1505, each switchable capacitive module having a variable capacitance 1515, each switchable capacitive module responsive to a corresponding coefficient of the first plurality of coefficients to switch (1520) the variable capacitance to a selected control voltage of a plurality of control voltages. The apparatus may also include a current source 655 responsive to temperature; and a second array having a plurality of resistive modules 1605 coupled through a current mirror (670, 510, 520) to the current source, the plurality of resistive modules adapted to provide the plurality of control voltages, and wherein each resistive module of the plurality of resistive modules has a different response to temperature and is adapted to provide a corresponding control voltage, of the plurality of control voltages, in response to a current from the current source.

In other exemplary embodiments, the plurality of switchable reactance modules may further comprise a plurality 760 of binary-weighted switchable capacitive modules coupled to the coefficient register and to the resonator, each switchable capacitive module having a first fixed capacitance 750 and a second fixed capacitance 720, each switchable capacitive module responsive to a corresponding coefficient of the plurality of coefficients to switch between the first fixed capacitance and the second fixed capacitance. In other exemplary embodiments, the plurality of switchable reactance modules may further comprise a plurality 860 of binary-weighted switchable variable capacitive modules 865 coupled to the coefficient register and to the resonator, each switchable variable capacitive module responsive to a corresponding coefficient of the plurality of coefficients to switch between a first voltage and a second voltage.

In the exemplary embodiments, an apparatus in accordance with the teachings of the invention comprises a resonator 310, 405 adapted to provide a first signal having a resonant frequency; and a temperature compensator 315 coupled to the resonator and adapted to modify the resonant frequency in response to temperature variation. The resonator is at least one of the following resonators: an inductor (L) and a capacitor (C) configured to form an LC-tank resonator; a ceramic resonator, a mechanical resonator, a microelectromechanical resonator, or a film bulk acoustic resonator. The apparatus may further comprise a negative transconductance amplifier 410 coupled to the resonator and to the temperature compensator, wherein the temperature compensator is further adapted to modify a current through the negative transconductance amplifier in response to temperature variation. The temperature compensator may further comprises a current source 415, 515, 655 responsive to temperature variation.

In other exemplary embodiments, the temperature compensator further comprises: a current source 415, 515, 655 adapted to provide a current responsive to temperature variation; a coefficient register adapted to store a first plurality of coefficients; a plurality of resistive modules 675, 1605 coupled to the resonator and the current source, at least one resistive module of the plurality of resistive modules adapted to provide a control voltage or a plurality of control voltages; and a plurality of switchable reactance modules (1305, 1805, 635, 1505), coupled to the resonator and to the current source and selectively couplable to at least one resistive module of the plurality of resistive modules.

In other exemplary embodiments, the invention provides a frequency controller for frequency control of a resonator, comprising: a coefficient register adapted to store a first plurality of coefficients and a second plurality of coefficients; a current source 415, 515, 655 adapted to provide a current corresponding to a temperature; a first array having a plurality of switchable resistive modules 675, 1605 coupled to the coefficient register and further having a capacitive module, the first array further coupled through a current mirror to the current source to create at least one control voltage across at least one switchable resistive module of the plurality of switchable resistive modules, each switchable resistive module responsive to a corresponding coefficient of the second plurality of coefficients to switch the switchable resistive module to provide the control voltage to a control voltage node; and a second array having a plurality of binary-weighted switchable capacitive modules 640 coupled to the coefficient register and to the resonator, each switchable capacitive module having a fixed capacitance and a variable capacitance, each switchable capacitive module responsive to a corresponding coefficient of the first plurality of coefficients to switch between the fixed capacitance and the variable capacitance and to switch each variable capacitance to the control voltage node.

Figure 13:
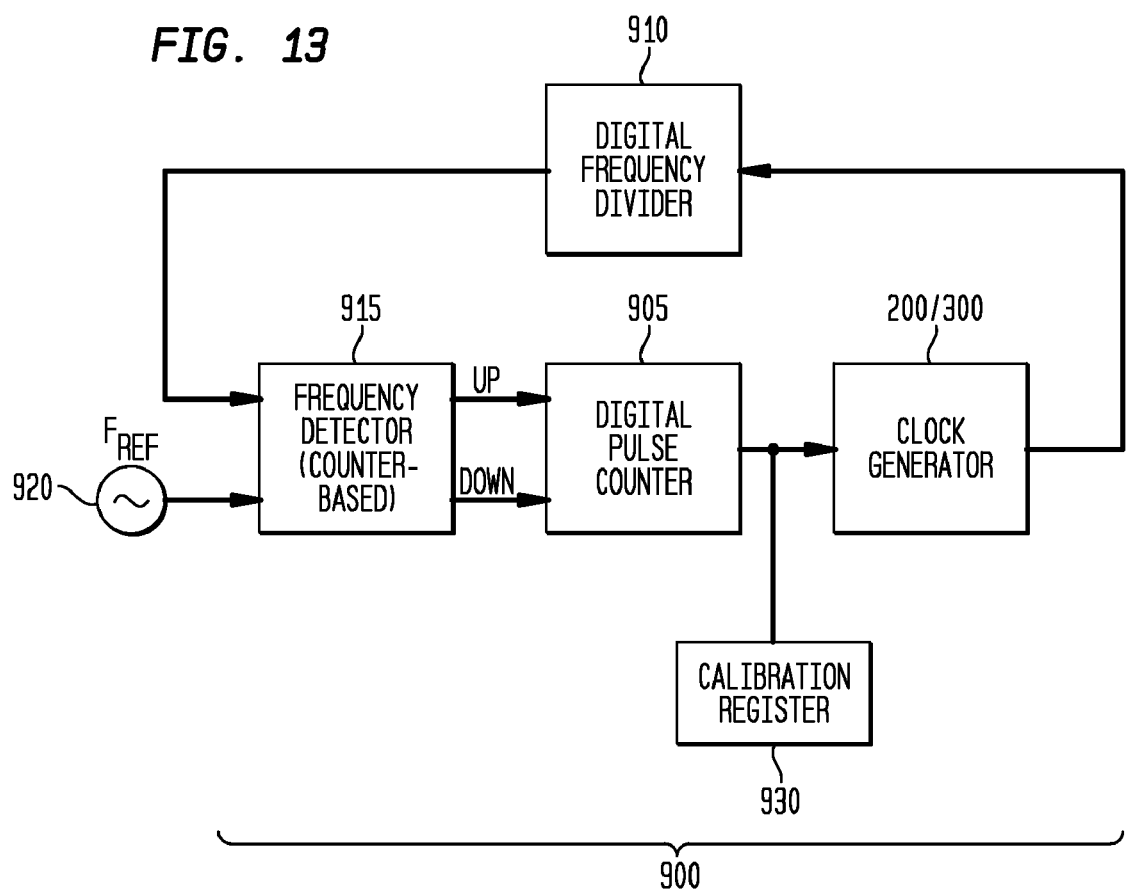
FIG. 13 (or "FIG. 13") is a block diagram illustrating an exemplary frequency calibration module in accordance with the teachings of the present invention.

Referring again to FIGS. 3 and 4, the clock generator and/or timing/frequency reference (100, 200, or 300) may also include a frequency calibration module (325 or 430). This frequency calibration module is the subject of a separate patent application, but its high-level functionality is described briefly below. FIG. 13 is a high-level block diagram illustrating an exemplary frequency calibration module 900 (which may be utilized as module 325 or 430) in accordance with the teachings of the present invention. The frequency calibration module 900 includes a digital frequency divider 910, a counter-based frequency detector 915, a digital pulse counter 905, and a calibration register 930 (which also may be utilized as register 465). Using a test IC, the output signal from the clock generator (100, 200 or 300) is frequency divided (910) and compared with a known reference frequency 920 in frequency detector 915. Depending upon whether the clock generator (100, 200 or 300) is fast or slow with respect to the reference, down or up pulses are provided to the pulse counter 905. Based upon those results, the third plurality of switching coefficients $r_0$ though $r_{(y-1)}$ is determined, and the clock generator (100, 200 or 300) is calibrated to a selected reference frequency. Again, individual ICs may also be calibrated and tested separately.

Referring again to FIGS. 2, 3 and 4, it will be appreciated by those of skill in the art that a highly accurate over PVT, low jitter, free-running and self-referenced oscillator has been described, providing a differential, substantially sinusoidal signal having a selectable and tunable resonant frequency, $f_0$, available at nodes 470 and 475. For many applications, this signal is sufficient, and may be utilized directly (and may be output on bus 125 or 135 of FIG. 1, on line 250 of FIG. 2, or on line 350 of FIG. 3, or between the rails or lines 470 and 475 of FIG. 4). For example, this signal may be utilized as a timing or frequency reference. In accordance with the present invention, additional applications are available, including clock generation (substantially square wave), frequency division, low-latency frequency switching, and mode selection, as described below.

Figure 14:
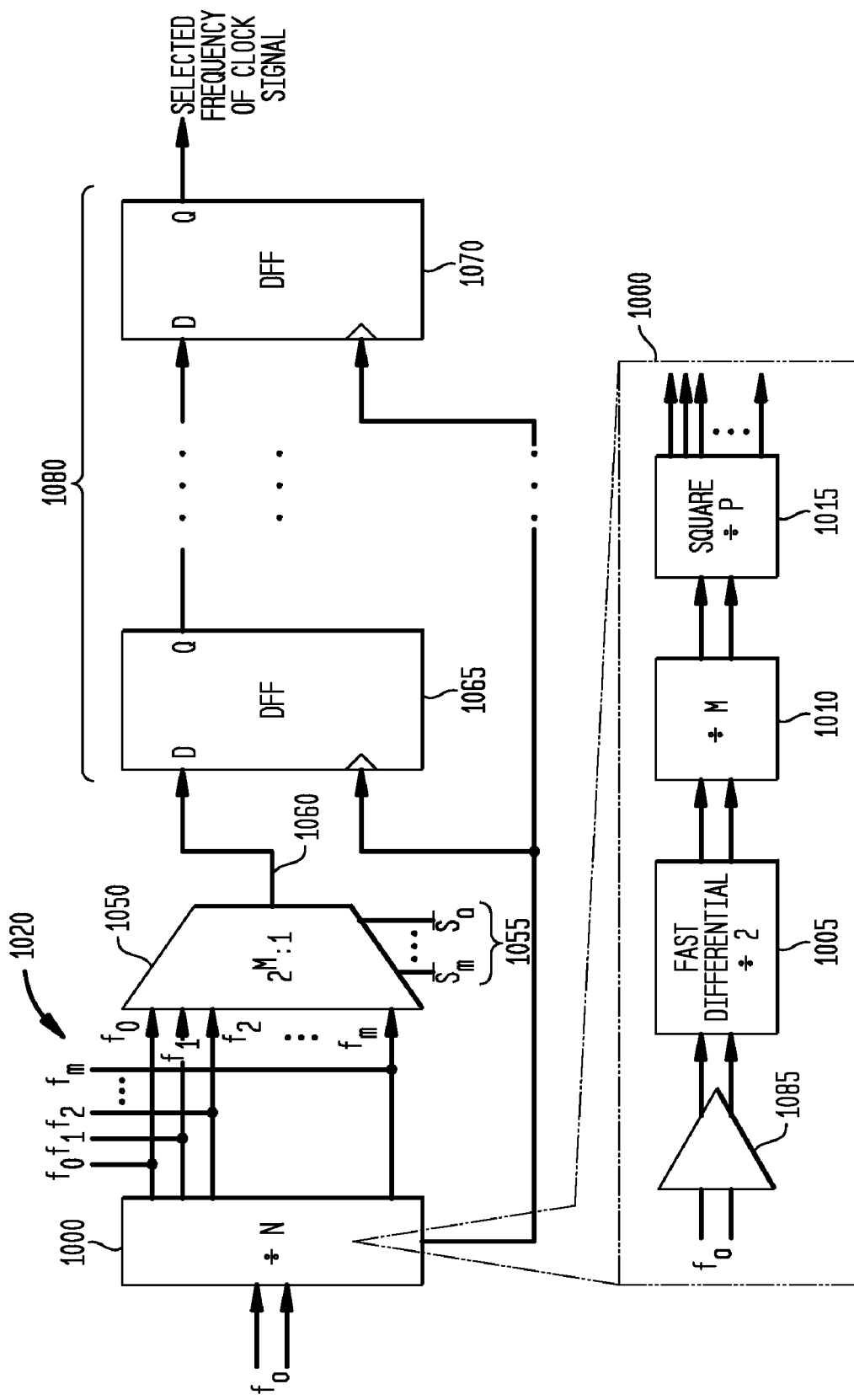
FIG. 14 (or "FIG. 14") is a block diagram illustrating an exemplary frequency divider, square wave generator, asynchronous frequency selector and glitch suppression module in accordance with the teachings of the present invention.

FIG. 14 is a block diagram illustrating an exemplary frequency divider and square wave generator 1000, and an exemplary asynchronous frequency selector 1050, with exemplary glitch suppression module 1080 in accordance with the teachings of the present invention. As indicated above, frequency divider and square wave generator 1000 may be included in or comprise modules 220 and/or 330, and frequency selector 1050 (with or without glitch suppression module 1080) may be included in or comprise modules 205 and/or 335.

Referring to FIG. 14, the output signal from the oscillator, namely, a differential and substantially sinusoidal signal having a frequency $f_0$, such as output on line 250 of FIG. 2, or line 350 of FIG. 3, or between the rails or lines 470 and 475 of FIG. 4, is input into frequency divider and square wave generator 1000. The frequency of this substantially sinusoidal signal is divided by any one or more arbitrary values "N" into "m" different frequencies (including $f_0$, where appropriate), and converted to substantially square wave signals, resulting in a plurality of substantially square wave signals having m+1 different available frequencies, output on lines or bus 1020 as frequencies $f_0$, $f_1$, $f_2$, through $f_m$. Any of these substantially square wave signals having m+1 different available frequencies are selectable asynchronously through exemplary asynchronous frequency selector 1050 which, as illustrated, may be embodied as a multiplexer. The selection of any of these substantially square wave signals having m+1 different available frequencies may be accomplished through the plurality of selection lines ($S_m$ through $S_0$) 1055, providing a substantially square wave signal having the selected frequency, output on line 1060.

As part of asynchronous frequency selection, glitch suppression is also provided by glitch suppression module 1080, which may be embodied in a plurality of ways, including through the use of one or more exemplary D flip-flops ("DFFs") illustrated in FIG. 14. A glitch could occur in an asynchronous frequency transition in which either a low state or a high state is not maintained for a sufficient period of time and may cause metastability in circuitry which is driven by the output clock signal. For example, an asynchronous frequency transition could result in a low state at a first frequency transitioning into a high state at a second frequency, at a point where the high state is about to transition back to a low state at the second frequency, resulting in a voltage spike or glitch. To avoid potential glitches from being provided as part of an output clock signal, the selected substantially square wave signal (having the selected frequency) is provided on line 1060 to a first DFF 1065 which provides a holding state; if a glitch should occur, it will be held until a clock edge triggering the DFF. To avoid the glitch occurring at the clock edge, the DFFs may be clocked at less than the maximum available frequency, or one or more additional DFFs (such as DFF 1070) may be employed, as during the wait for another clock signal, the Q output from the DFF 1065 will have stabilized to either a first state (high or low) or a second state (low or high), such as to either the power or ground rail. It has been shown by the inventors that 2 DFFs are sufficient, with additional DFFs potentially being added as may be desired, but with additional DFFs causing increased switching latency. While illustrated utilizing exemplary DFFs, other flip-flops or counters may be utilized, and those of skill in the art will recognize myriad other equivalent implementations which will achieve this result, and all such variations are within the scope of the invention.

Such exemplary low latency frequency switching in accordance with the teachings of the present invention is illustrated in FIG. 15. FIG. 15 is also illustrative of "substantially" square waves of the present invention, which are typical of actual square waves utilized in various technologies, exhibiting reasonable variation, undershoots and overshoots at their respective high and low states (and not the perfect "flatness" of textbook examples). FIG. 15, part A, illustrates asynchronous glitch-free switching from 1 MHz to 33 MHz, while part B illustrates measured glitch-free switching from 4 MHz to 8 MHz, then to 16 MHz, and then to 33 MHz.

Figure 16:
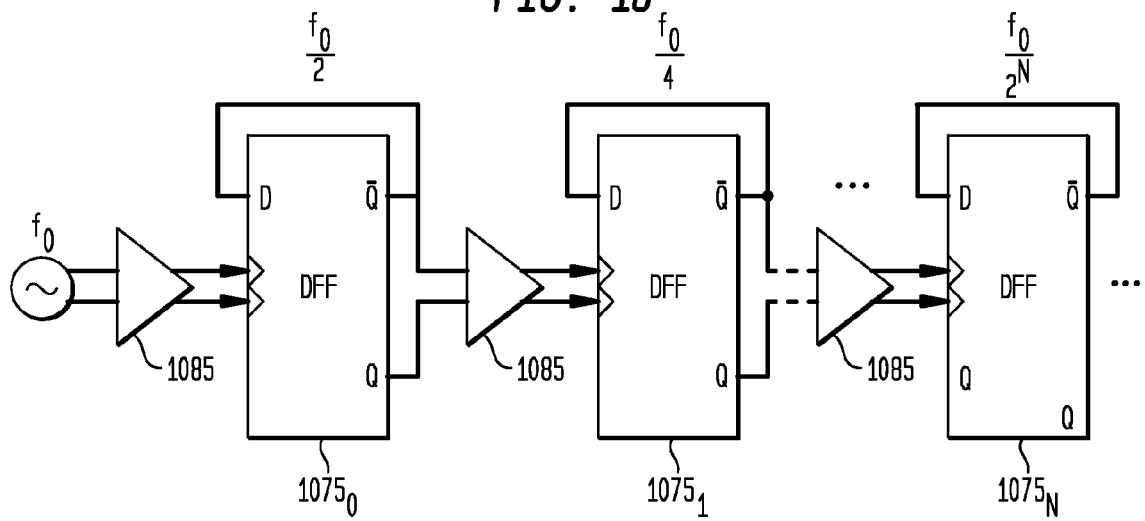
FIG. 16 (or "FIG. 16") is a block diagram illustrating an exemplary frequency divider in accordance with the teachings of the present invention.

Referring again to FIG. 14, the frequency divider and square wave generator 1000 may be implemented in innumerable ways, such as differential or single-ended, with the illustrated divider being merely exemplary. As the output from the oscillator illustrated in FIG. 4 is differential (across lines or rails 470 and 475), the first divider 1005 is also differential and provides complementary outputs, to present a substantially constant load to the oscillator and to maintain phase alignment, and is fast, to support high frequencies such as in the GHz range. In addition, it may be necessary or advisable to reject any relaxation mode oscillation of the first divider 1005. The second divider 1010 may also be differential and provide any arbitrary frequency division (divide by "M"), such as dividing by an integer, a multiple of two, a rational number, or any other amount or number, etc. Topologies or configuration for such dividers are known in the art, and any such divider may be utilized. Such dividers, for example and without limitation, may be a sequence (multiple stages) of counters or flip-flops 1075, such as those flip-flops illustrated in FIG. 16, which provide frequency division in powers or multiples of 2, with the output of each stage providing a different frequency and further providing a clock signal for the next stage and also fed back to its own input, as illustrated. As illustrated, a plurality of frequencies are then available for output on lines or bus 1020, such as $f_0/2$, $f_0/4$, and so on, through $f_0/2^N$. In addition, as illustrated, buffers 1085 may also be utilized, from the oscillator to the first divider 1005, to provide sufficient voltage to drive the first divider 1005, and also between second divider 1010 stages, to isolate state-dependent load variation which could also affect signal rise and fall times.

It should also be noted that the use of the various flip-flops has also provided a substantially square wave, as any substantially sinusoidal signal has been provided to clock a flip flop, whose output is then pulled to a high or low voltage. Other square wave generators may also be utilized, as known or becomes known in the art. In the illustrated embodiments, to maintain phase alignment, differential signals are maintained through the last division. Following the last frequency division, the plurality of signals (each having a different frequency) are then squared (in module 1015) to provide substantially an evenly divided (e.g., 50:50) duty cycle, such that the time in which the signal is in a first (high) state is substantially equal to the time in which the signal is in a second (low) state.

Figure 17:
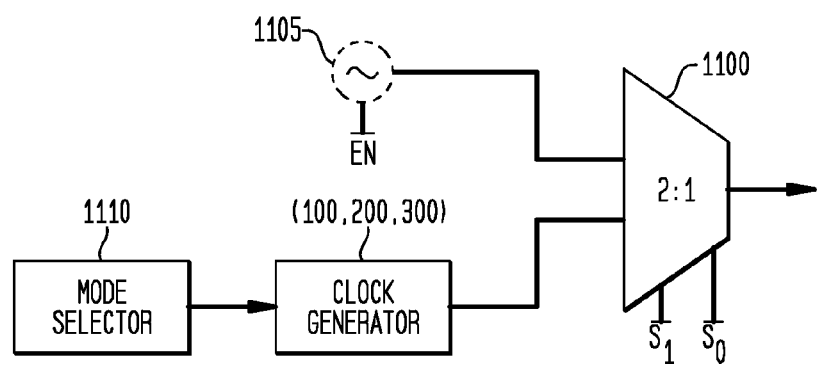
FIG. 17 (or "FIG. 17") is a block diagram illustrating an exemplary power mode selection module in accordance with the teachings of the present invention.

FIG. 17 is a block diagram illustrating an exemplary mode selection module in accordance with the teachings of the present invention. There are circumstances in which a highly-accurate, high performance reference, such as a clock generator (100, 200 or 300) of the invention, is unnecessary, such as in a low power, standby mode. In these circumstances, in accordance with the invention, either no clock output is provided, or a low power, reduced performance clock 1105 output is provided. For example, at comparatively low frequencies, a low performance ring oscillator may provide suitable performance with low power consumption. As illustrated in FIG. 17, for these conditions, the output of the low power oscillator 1105 may be selected (through multiplexer 1100), and provided as a clock output to other circuitry. At higher frequencies, however, such low performance oscillators consume considerably more power, typically significantly more than the oscillator of the present invention. There is typically a "break-even" point as a function of frequency, after which the clock generator (100, 200 or 300) provides both higher performance and lower power consumption, and may be selected (through multiplexer 1100), and provided as a clock output to other circuitry. As a consequence, the clock generator (100, 200 or 300) may also be utilized to provide a low power mode.

In addition, using mode selector 1110, other modes may be selected, such as a no power mode, rather than merely a low-frequency or sleep mode, as the clock generator (100, 200 or 300) may be restarted comparatively rapidly, or a pulsed mode, in which the clock generator (100, 200 or 300) is repeatedly stopped and restarted, periodically or non-periodically, in bursts or intervals. Various reference modes are discussed below.

In sharp contrast to the prior art, this pulsed clocking using the clock generator and/or timing/frequency reference (100, 200 or 300) of the present invention provides power savings or conservation. While more power may be consumed during a given burst, as the clock has a comparatively high frequency, more instructions are processed in that interval, followed by no or limited power dissipation during the non-pulse or off interval, resulting in higher MIPS/mW compared to a continuously running clock. In contrast, due to the comparatively long start-up time and locking of prior art clocks, such pulsed clocking results in more power consumption and less efficiency in the prior art.

Figure 18:
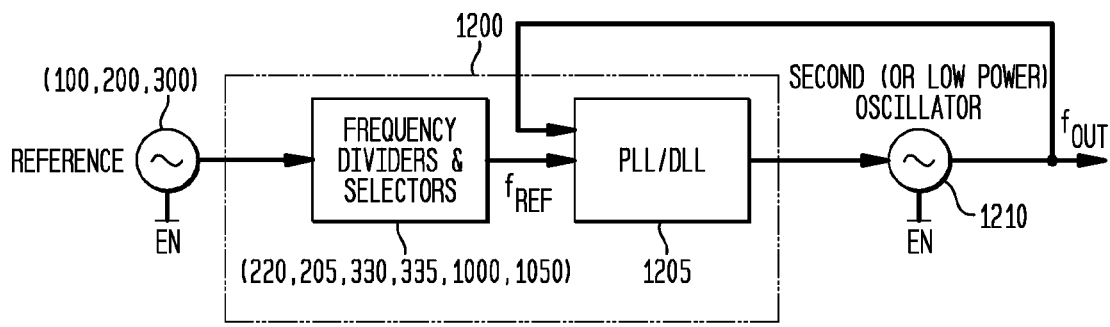
FIG. 18 (or "FIG. 18") is a block diagram illustrating an exemplary synchronization module for a second oscillator in accordance with the teachings of the present invention.

FIG. 18 is a block diagram illustrating an exemplary synchronization module 1200 for a second oscillator in accordance with the teachings of the present invention. As mentioned above, the clock generator and/or timing/frequency reference (100, 200 or 300) may provide a reference mode to synchronize other oscillators or clocks, which may or may not be low power, such as second oscillator 1210 (e.g., ring, relaxation, or phase shift oscillators). An output signal from the clock generator and/or timing/frequency reference (100, 200 or 300) is further frequency divided as needed to form a plurality of available reference frequencies, with a reference frequency selected from this plurality of frequencies. This may be accomplished using the modules discussed above, such as by using the existing frequency dividers (220, 330, 1000, for example), and then providing the reference signal from the frequency selector 1050 (or 205 or 335). For example, referring to FIG. 3, mode selector 345 may select a reference mode and provide the output reference signal from frequency selector 335 to a second oscillator (with synchronization module) 375. A synchronization module, such as PLL or DLL 1205, is then utilized to synchronize the output signal from the second oscillator 1210 to the reference signal provided by clock generator and/or timing/frequency reference (100, 200 or 300). In addition to a mode of continuous synchronization, a pulsed-synchronization may also be provided, in which the clock generator and/or timing/frequency reference (100, 200 or 300) provides a pulsed output, and synchronization occurs during the interval of these pulses, as a synchronization interval.

Figure 19:
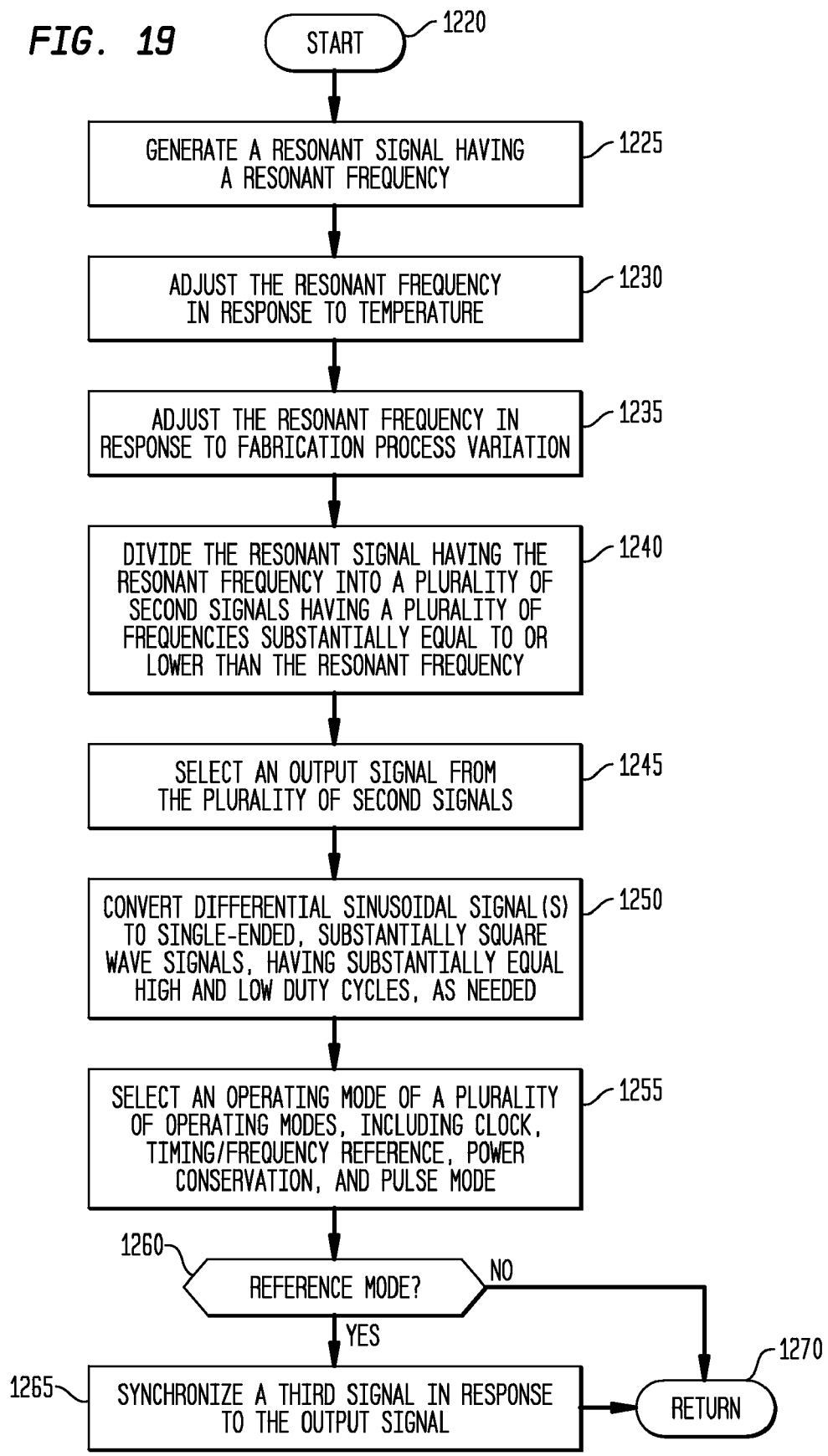
FIG. 19 (or "FIG. 19") is a flow diagram illustrating an exemplary method in accordance with the teachings of the present invention.

FIG. 19 is a flow diagram illustrating an exemplary method in accordance with the teachings of the present invention, and provides a useful summary. The method begins with start step 1220, such as through clock generator and/or timing/frequency reference (100, 200 or 300) start-up. It should be noted that while illustrated in FIG. 19 as consecutive steps, these steps may occur in any order, and generally may occur concurrently as the clock generator and/or timing/frequency reference (100, 200 or 300) operates. Referring to FIG. 19, a resonant signal having a resonant frequency is generated, step 1225, such as through LC tank 405 or resonator 310. The resonant frequency is adjusted in response to temperature, step 1230, such as through a temperature compensator 315, which adjusts current and frequency. The resonant frequency is adjusted in response to fabrication process variation, step 1235, such as through process variation compensator 320. As indicated above, step 1235 may be performed as a first calibration step, followed by the temperature adjustment of step 1230. The resonant signal having the resonant frequency is divided into a plurality of second signals having a corresponding plurality of frequencies, in which the plurality of frequencies are substantially equal to or lower than the resonant frequency, step 1240, such as through frequency divider

330 or 1000). An output signal is selected from the plurality of second signals, step 1245, such as through frequency selector 335 or 1050, for example. Depending upon the selected embodiment or mode, the selected output signal may be provided directly, for example, as a reference signal.

In other embodiments, such as when the output signal is a differential rather than single-ended signal, and when the resonant signal is a substantially sinusoidal signal, the method continues with converting the differential, substantially sinusoidal signal to a single-ended, substantially square wave signal having a substantially equal high and low duty cycle, as needed, step 1250, such as to generate a clock output signal using modules 330 or 1000, for example. An operating mode is also selected from a plurality of operating modes, step 1255, where the plurality of operating modes can be selected from a group comprising a clock mode, a timing and frequency reference mode, a power conservation mode, and a pulsed mode, for example, such as using mode selector 225 or 345. When a reference mode is selected in step 1255, in step 1260, the method proceeds to step 1265, to synchronize a third signal (e.g., from a second oscillator) in response to the output signal, such as illustrated in FIG. 18. Following steps 1260 or 1265, the method may end or repeat (continue) (such as with the clock generator and/or timing/frequency reference (100, 200 or 300) running continuously), return step 1270.

Also in summary, the present invention provides an apparatus comprising a resonator adapted to provide a first signal having a resonant frequency; an amplifier coupled to the resonator; and a frequency controller (coupled to the resonator) which is adapted to select a resonant frequency having a first frequency of a plurality of frequencies. The apparatus also includes a frequency divider (coupled to the resonator) which is adapted to divide the first signal having the first frequency into a plurality of second signals having a corresponding plurality of frequencies, the plurality of frequencies substantially equal to or lower than the first frequency, such as by division by a rational number.

The first signal may be a differential signal or a single-ended signal. When the first signal is a differential signal, the frequency divider is further adapted to convert the differential signal to a single-ended signal. Similarly, when the first signal is a substantially sinusoidal signal, the frequency divider is further adapted to convert the substantially sinusoidal signal to a substantially square wave signal.

In various embodiments, the frequency divider may comprise a plurality of flip-flops or counters coupled successively in series, wherein an output of a selected flip-flop or counter is a frequency of a previous flip-flop or counter divided by two, or more generally, a plurality of dividers coupled successively in series, wherein an output of a successive divider is a lower frequency than the output of a previous divider. The plurality of dividers may be differential, single-ended, or differential and single-ended, such as differential followed by a final single-ended stage. The frequency divider may also include a square-wave generator adapted to convert the first signal into a substantially square-wave signal having a substantially equal high and low duty cycle.

The present invention may also include a frequency selector coupled to the frequency divider, and adapted to provide an output signal from the plurality of second signals. The frequency selector may further comprise a multiplexer and a glitch-suppressor.

The present invention may also include a mode selector coupled to the frequency selector, wherein the mode selector is adapted to provide a plurality of operating modes, which may be selected from a group comprising a clock mode, a timing and frequency reference mode, a power conservation mode, and a pulsed mode.

For a reference mode, the invention may also include a synchronization circuit coupled to the mode selector; and a controlled oscillator coupled to the synchronization circuit and adapted to provide a third signal; wherein in the timing and reference mode, the mode selector is further adapted to couple the output signal to the synchronization circuit to control timing and frequency of the third signal. Such a synchronization circuit may be a delay-locked loop, a phase-locked loop, or an injection locking circuit.

In selected embodiments, the amplifier may be a negative transconductance amplifier. The frequency controller may be further adapted to modify a current through the negative transconductance amplifier in response to temperature, and may comprise a current source responsive to temperature. Such a current source may have one or more configurations selected from a plurality of configurations, such as the plurality of configurations comprising CTAT, PTAT, and PTAT$^2$ configurations. In addition, the frequency controller may be further adapted to modify a current through the negative transconductance amplifier to select the resonant frequency, modify a transconductance of the negative transconductance amplifier to select the resonant frequency, or modify a current through the negative transconductance amplifier in response to a voltage. The frequency controller may also include a voltage isolator coupled to the resonator and adapted to substantially isolate the resonator from a voltage variation, and may comprises a current mirror, which may further have a cascode configuration. The frequency controller may be further adapted to modify a capacitance or an inductance of the resonator in response to fabrication process variation, temperature variation, or voltage variation.

The frequency controller may have various embodiments for these various functions, and may further comprise: a coefficient register adapted to store a first plurality of coefficients; and a first array having a plurality of switchable capacitive modules coupled to the coefficient register and to the resonator, each switchable capacitive module having a fixed capacitance and a variable capacitance, each switchable capacitive module responsive to a corresponding coefficient of the first plurality of coefficients to switch between the fixed capacitance and the variable capacitance and to switch each variable capacitance to a control voltage. The plurality of switchable capacitive modules may be binary-weighted, or have another weighting scheme. The frequency controller may also include a second array having a plurality of switchable resistive modules coupled to the coefficient register and further having a capacitive module, the capacitive module and the plurality of switchable resistive modules further coupled to a node to provide the control voltage, each switchable resistive module responsive to a corresponding coefficient of a second plurality of coefficients stored in the coefficient register to switch the switchable resistive module to the control voltage node; and a temperature-dependent current source coupled through a current mirror to the second array.

The frequency controller may also include a process variation compensator coupled to the resonator and adapted to modify the resonant frequency in response to fabrication process variation. In an exemplary embodiment, the process variation compensator may comprise: a coefficient register adapted to store a plurality of coefficients; and an array having a plurality of switchable capacitive modules coupled to the coefficient register and to the resonator, each switchable capacitive module having a first fixed capacitance and a second fixed capacitance, each switchable capacitive module responsive to a corresponding coefficient of the plurality of coefficients to switch between the first fixed capacitance and the second fixed capacitance. The plurality of switchable capacitive modules may be binary-weighted, or have another weighting scheme.

In another exemplary embodiment the process variation compensator may comprise: a coefficient register adapted to store a plurality of coefficients; and an array having a plurality of switchable variable capacitive modules coupled to the coefficient register and to the resonator, each switchable variable capacitive module responsive to a corresponding coefficient of the plurality of coefficients to switch between a first voltage and a second voltage. The plurality of switchable variable capacitive modules also may be binary-weighted, or have another weighting scheme.

The present invention may also include a frequency calibration module coupled to the frequency controller and adapted to modify the resonant frequency in response to a reference signal. For example, the frequency calibration module may include a frequency divider coupled to the frequency controller, the frequency divider adapted to convert an output signal derived from the first signal having the first frequency to a lower frequency to provide a divided signal; a frequency detector coupled to the frequency divider, the frequency detector adapted to compare the reference signal to the divided signal and provide one or more up signals or down signals; and a pulse counter coupled to the frequency detector, the pulse counter adapted to determine a difference between the one or more up signals or down signals as an indicator of a difference between the output signal and the reference signal.

The resonator used with the invention may comprise an inductor (L) and a capacitor (C) coupled to form an LC-tank, having a selected configuration of a plurality of LC-tank configurations, such as series, parallel and so on, and may include other components. In other embodiments, the resonator may be selected from a group comprising: a ceramic resonator, a mechanical resonator, a microelectromechanical resonator, and a film bulk acoustic resonator, or any other resonator which is electrically equivalent to an inductor (L) coupled to a capacitor (C).

The apparatus of the invention may be utilized as a timing and frequency reference, or as a clock generator. In addition, the invention may also include a second oscillator (such as a ring, relaxation, or phase shift oscillator) providing a second oscillator output signal; and a mode selector coupled to the frequency controller and to the second oscillator, the mode selector adapted to switch to the second oscillator output signal to provide a power conservation mode. Additional operating modes may be provided by a mode selector coupled to the frequency controller, which may be adapted to periodically start and stop the resonator to provide a pulsed output signal, or adapted to selectively start and stop the resonator to provide a power conservation mode.

In another selected embodiment, the apparatus of the invention, comprises: a resonator adapted to provide a first signal having a resonant frequency; an amplifier coupled to the resonator; a temperature compensator coupled to the amplifier and to the resonator, the temperature compensator adapted to modify the resonant frequency in response to temperature; a process variation compensator coupled to the resonator, the process variation compensator adapted to modify the resonant frequency in response to fabrication process variation; a frequency divider coupled to the resonator, the frequency divider adapted to divide the first signal having the resonant frequency into a plurality of second signals having a corresponding plurality of frequencies, the plurality of frequencies substantially equal to or lower than the resonant frequency; and a frequency selector coupled to the frequency divider, the frequency selector adapted to provide an output signal from the plurality of second signals.

In another selected embodiment, the apparatus of the invention generates a clock signal, and comprises: an LC resonator adapted to provide a differential, substantially sinusoidal first signal having a resonant frequency; a negative transconductance amplifier coupled to the LC resonator; a temperature compensator coupled to the negative transconductance amplifier and to the LC resonator, the temperature compensator adapted to modify a current in the negative transconductance amplifier in response to temperature and further to modify a capacitance of the LC resonator in response to temperature; a process variation compensator coupled to the LC resonator, the process variation compensator adapted to modify the capacitance of the LC resonator in response to fabrication process variation; a frequency divider coupled to the resonator, the frequency divider adapted to convert and divide the first signal having the resonant frequency into a plurality of single-ended, substantially square-wave second signals having a corresponding plurality of frequencies, the plurality of frequencies substantially equal to or lower than the resonant frequency, and each second signal having a substantially equal high and low duty cycle; and a frequency selector coupled to the frequency divider, the frequency selector adapted to provide an output signal from the plurality of second signals.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

The invention claimed is:

1. An apparatus comprising:
   a reference oscillator configured to provide a first signal having a first frequency, the reference oscillator comprising at least one variable capacitor having a selected capacitance in response to a control signal;
   a temperature sensor configured to generate a second signal in response to temperature;
   a frequency controller coupled to the temperature sensor and to the reference oscillator, the frequency controller configured to provide the control signal in response to the second signal to maintain the first frequency within a predetermined frequency range over a predetermined temperature variation;
   a frequency divider coupled to the reference oscillator and configured to provide an output reference signal having an output frequency determined from the first frequency and a divide value; and
   at least one controlled reactance module electrically coupled to the reference oscillator, said at least one controlled reactance module responsive to a coefficient to switch a reactance of the controlled reactance module to the reference oscillator.

2. The apparatus of claim 1, further comprising:
   a first memory coupled to the frequency controller and configured to store a first plurality of coefficients.

3. The apparatus of claim 2, wherein the frequency controller comprises:
   an analog-to-digital converter coupled to the temperature sensor and configured to provide a digital value in response to the second signal;

a control circuit coupled to the analog-to-digital converter and configured to determine corresponding coefficients in response to the digital value; and a control voltage generator configured to generate the control signal as an analog voltage level in response to the corresponding coefficients.

4. The apparatus of claim 3, wherein the control circuit is further configured to determine the corresponding coefficients in response to the second signal by selecting the corresponding coefficients from the first plurality of coefficients stored in the first memory.

5. The apparatus of claim 4, wherein the first plurality of coefficients comprise a plurality of control words calibrated for a plurality of temperatures.

6. The apparatus of claim 4, wherein the first plurality of coefficients comprise a plurality of control words calibrated for a corresponding plurality of frequencies of the first signal at a plurality of temperatures.

7. The apparatus of claim 4, wherein the first plurality of coefficients comprise a plurality of control words corresponding to a plurality of selectable or programmable divide values.

8. The apparatus of claim 3, wherein the control circuit is further configured to determine the corresponding coefficients in response to the second signal by modifying coefficients of the first plurality of coefficients stored in the first memory.

9. The apparatus of claim 3, wherein the control voltage generator comprises at least one resistor and a current source.

10. The apparatus of claim 3, wherein the control voltage generator comprises at least one switchable resistive module and a current source.

11. The apparatus of claim 3, wherein the control voltage generator is further configured to generate a plurality of control voltages, and wherein the control circuit is further configured to switch a selected control voltage, of the plurality of control voltages, to the at least one variable capacitor in response to the at least one control coefficient.

12. The apparatus of claim 2, wherein the frequency controller is further configured, in response to the second signal, to select corresponding coefficients from the first plurality of coefficients to generate the control signal.

13. The apparatus of claim 2, wherein the frequency controller is further configured, in response to the second signal, to modify corresponding coefficients from the first plurality of control coefficients to generate the control signal.

14. The apparatus of claim 2, wherein a second plurality of coefficients is stored as a selectable or programmable divide value in the first memory or in a second memory.

15. The apparatus of claim 14, wherein the divide value is a rational number.

16. The apparatus of claim 14, further comprising:
an interface coupled to the frequency controller or to the first memory or to the second memory, the interface configured for selection or calibration of the output frequency.

17. The apparatus of claim 16, wherein the interface is further configured for input of the first and second pluralities of coefficients to provide a selected output frequency.

18. The apparatus of claim 17, wherein the first plurality of coefficients are predetermined for a calibrated first frequency and the second plurality of coefficients are predetermined for a selected divide value to provide a selected output frequency at a selected temperature.

19. The apparatus of claim 17, wherein the first plurality of coefficients are predetermined for a calibrated first frequency and the second plurality of coefficients are predetermined for a selected divide value to provide a plurality of selectable output frequencies over the predetermined temperature variation.

20. The apparatus of claim 1, wherein the reference oscillator further comprises an inductor and at least one capacitor having a fixed capacitance.

21. The apparatus of claim 1, wherein the at least one variable capacitor is coupled directly to the frequency controller to receive the control signal.

22. The apparatus of claim 1, wherein the frequency controller is further configured to provide the control signal in response to the second signal to maintain the first frequency substantially constant within the predetermined frequency range over the predetermined temperature variation.

23. The apparatus of claim 1, wherein the frequency controller is further configured to provide the control signal in response to the second signal to maintain a substantially constant center frequency within the predetermined frequency range over the predetermined temperature variation.

24. An apparatus comprising:
a reference oscillator configured to provide a first signal having a first frequency, the reference oscillator comprising at least one variable capacitor having a capacitance set by a control signal;

a temperature sensor configured to generate a second signal in response to measuring a temperature in the apparatus;

a frequency controller coupled to the temperature sensor and to the reference oscillator, the frequency controller configured to generate the control signal in response to the second signal to maintain the first frequency within a first frequency range over a first variation in the temperature; and a plurality of switchable controlled reactance modules coupled to the reference oscillator, each switchable controlled reactance module responsive to a corresponding coefficient of a first plurality of coefficients to switch a corresponding reactance to the reference oscillator.

25. The apparatus of claim 24, wherein the frequency controller is further configured to select or determine the corresponding coefficients from the first plurality of coefficients in response to the second signal to maintain the first frequency substantially constant over the first variation in the temperature.

26. The apparatus of claim 25, wherein the corresponding coefficients are stored in a memory as a look up table.

27. The apparatus of claim 24, wherein the frequency controller is further configured, in response to the second signal, to switch at least one of the plurality of controlled reactance modules to or from the reference oscillator or to switch the at least one variable capacitor to a control voltage.

28. An apparatus comprising:
a reference oscillator configured to provide a first signal having a first frequency, the reference oscillator comprising at least one variable capacitor having a capacitance set by a control signal;

a temperature sensor configured to generate a second signal in response to measuring a temperature in the apparatus; and a frequency controller coupled to the temperature sensor and to the reference oscillator, the frequency controller configured to generate the control signal in response to the second signal to maintain the first frequency within a first frequency range over a first variation in the temperature;

wherein the reference oscillator further comprises an inductor and at least one switchable capacitor having a fixed capacitance.

29. An apparatus comprising:
a reference oscillator configured to provide a first signal having a first frequency, the reference oscillator comprising at least one variable capacitor having a capacitance set by a control signal;
a temperature sensor configured to generate a second signal in response to measuring a temperature in the apparatus; and
a frequency controller coupled to the temperature sensor and to the reference oscillator, the frequency controller configured to generate the control signal in response to the second signal to maintain the first frequency within a first frequency range over a first variation in the temperature;
wherein the at least one variable capacitor is coupled through a switch to the frequency controller to receive the control signal.

30. An apparatus comprising:
a reference oscillator configured to provide a first signal having a first frequency, the reference oscillator comprising at least one variable capacitor having a capacitance set by a control signal;
a temperature sensor configured to generate a second signal in response to measuring a temperature in the apparatus; and
a frequency controller coupled to the temperature sensor and to the reference oscillator, the frequency controller configured to generate the control signal in response to the second signal to maintain the first frequency within a first frequency range over a first variation in the temperature;
wherein the temperature sensor comprises:
at least one resistive element; and
a current source coupled to the at least one resistive element, the current source configured to provide a temperature-dependent current to generate the second signal as a temperature-dependent voltage across the at least one resistive element.

31. The apparatus of claim 30, wherein the current source has a complementary to absolute temperature (CTAT) configuration, or a proportional to absolute temperature (PTAT) configuration, or a proportional to absolute temperature squared (PTAT$^2$) configuration, or a combination of CTAT, PTAT and PTAT$^2$ configurations.

32. An apparatus comprising:
a reference resonator configured to provide a first signal having a resonant frequency, the reference resonator comprising a plurality of capacitors, a first capacitor of the plurality of capacitors having a fixed capacitance and a second capacitor of the plurality of capacitors having a variable capacitance controlled by a control voltage;
a sensor configured to provide a second signal in response to a parameter of a plurality of parameters; and
a frequency controller coupled to the sensor and to the reference resonator, the frequency controller configured to modify a capacitance of the reference resonator in response to the second signal to maintain the resonant frequency within a predetermined frequency range over a predetermined variance of the parameter;
wherein the frequency controller is further configured to switch at least one of the first capacitor and the second capacitor to a ground potential or to a power supply or power rail voltage in response to a corresponding coefficient of a first plurality of coefficients to modify the capacitance of the reference resonator.

33. The apparatus of claim 32, wherein the parameter is at least one of the following parameters: temperature, fabrication process, voltage, and age.

34. The apparatus of claim 32, wherein the frequency controller is further configured to generate the control voltage in response to the second signal to modify the capacitance of the reference resonator.

35. The apparatus of claim 32, further comprising:
a first memory coupled to the frequency controller and configured to store the first plurality of coefficients.

36. The apparatus of claim 35, wherein the frequency controller comprises:
an analog-to-digital converter coupled to the sensor and configured to provide a digital value in response to the second signal;
a control circuit coupled to the analog-to-digital converter and configured to select corresponding coefficients from the first plurality of coefficients in response to the digital value; and
a control voltage generator configured to generate the control signal as an analog voltage level in response to the corresponding coefficients.

37. The apparatus of claim 35, wherein the frequency controller further comprises:
a plurality of resistive modules configured to generate a plurality of control voltages; and
wherein the frequency controller is further configured to switch a first control voltage of the plurality of control voltages to the second capacitor to modify the capacitance of the reference resonator.

38. The apparatus of claim 37, wherein at least one control voltage of the plurality of control voltages is temperature-dependent and wherein at least one control voltage of the plurality of control voltages is substantially temperature-independent.

39. The apparatus of claim 37, wherein the second signal is at least one control voltage of the plurality of control voltages.

40. The apparatus of claim 32, wherein the frequency controller is further configured to modify an inductance of the reference resonator in response to the second signal.

41. The apparatus of claim 32, wherein the frequency controller is further configured to modify a resistance of the reference resonator in response to the second signal.

42. The apparatus of claim 32, further comprising:
a process variation compensator coupled to the reference resonator and configured to modify the resonant frequency in response to a fabrication process parameter of the plurality of parameters.

43. The apparatus of claim 42, wherein the process variation compensator further comprises:
a coefficient register configured to store a plurality of coefficients; and
an array comprising a plurality of switchable capacitive modules coupled to the coefficient register and to the reference resonator, each switchable capacitive module having a first fixed capacitance and a second fixed capacitance, each switchable capacitive module responsive to a corresponding coefficient of the plurality of coefficients to switch between the first fixed capacitance and the second fixed capacitance.

44. The apparatus of claim 42, wherein the process variation compensator further comprises:
a coefficient register configured to store a plurality of coefficients; and a plurality of switchable variable capacitive modules coupled to the coefficient register and to the reference resonator, each switchable variable capacitive module responsive to a corresponding coefficient of the plurality of coefficients to switch between a first, control voltage and a second voltage.

45. The apparatus of claim 32, wherein the frequency controller further comprises:
a voltage variation compensator coupled to the reference resonator and configured to modify the resonant frequency in response to a voltage parameter of the plurality of parameters.

46. The apparatus of claim 32, wherein the frequency controller further comprises:
an age variation compensator coupled to the reference resonator and configured to compare a current value of a selected parameter of the plurality of parameters to an initial value of the selected parameter and to modify the resonant frequency in response to a difference between the current value and the initial value of the selected parameter.

47. An apparatus comprising:
a reference resonator configured to provide a first signal having a resonant frequency, the reference resonator comprising a plurality of capacitors, a first capacitor of the plurality of capacitors having a fixed capacitance and a second capacitor of the plurality of capacitors having a variable capacitance controlled by a control voltage;
a sensor configured to provide a second signal in response to a parameter of a plurality of parameters; and
a frequency controller coupled to the sensor and to the resonator, the frequency controller configured to modify a capacitance of the reference resonator in response to the second signal to maintain the resonant frequency within a predetermined frequency range over a predetermined variance of the parameter;
wherein the frequency controller is further configured to switch the second capacitor to the control voltage in response to a corresponding coefficient of the first plurality of coefficients to modify the capacitance of the reference resonator.

48. An apparatus comprising:
a reference resonator configured to provide a first signal having a resonant frequency, the reference resonator comprising a plurality of capacitors, a first capacitor of the plurality of capacitors having a fixed capacitance and a second capacitor of the plurality of capacitors having a variable capacitance controlled by a control voltage;
a sensor configured to provide a second signal in response to a parameter of a plurality of parameters; and
a frequency controller coupled to the sensor and to the resonator, the frequency controller configured to modify a capacitance of the reference resonator in response to the second signal to maintain the resonant frequency within a predetermined frequency range over a predetermined variance of the parameter;
wherein the plurality of capacitors further comprises:
a plurality of binary-weighted, switchable capacitive modules coupled to the resonator, each switchable capacitive module having a fixed capacitance and a variable capacitance, each switchable capacitive module responsive to a corresponding coefficient of the first plurality of coefficients to switch between the fixed capacitance and the variable capacitance and to switch each variable capacitance to the control voltage.

49. An apparatus comprising:
a reference resonator configured to provide a first signal having a resonant frequency, the reference resonator comprising a plurality of capacitors, a first capacitor of the plurality of capacitors having a fixed capacitance and a second capacitor of the plurality of capacitors having a variable capacitance controlled by a control voltage;
a sensor configured to provide a second signal in response to a parameter of a plurality of parameters; and
a frequency controller coupled to the sensor and to the reference resonator, the frequency controller configured to modify a capacitance of the reference resonator in response to the second signal to maintain the resonant frequency within a predetermined frequency range over a predetermined variance of the parameter;
wherein the sensor further comprises a current source responsive to temperature, and wherein the current source has a complementary to absolute temperature (CTAT) configuration, or a proportional to absolute temperature (PTAT) configuration, or a proportional to absolute temperature squared ($PTAT^2$) configuration, or a combination of CTAT, PTAT and $PTAT^2$ configurations.

50. An apparatus for frequency control of a reference oscillator, the reference oscillator having an open-loop configuration for providing a first signal having a first frequency, the apparatus comprising:
a coefficient register configured to store a first plurality of coefficients; and
a plurality of switchable reactance modules coupled to the coefficient register and to the reference oscillator, each switchable reactance module responsive to a corresponding coefficient of the first plurality of coefficients to switch a corresponding reactance to a corresponding voltage to modify the resonant frequency;
wherein said corresponding voltage is a control voltage, or is a power supply voltage, or is a power rail voltage or is a ground potential; and
wherein the control voltage is determined by a current source responsive to temperature.

51. The apparatus of claim 50, wherein the corresponding reactance is a fixed or variable inductance.

52. The apparatus of claim 50, wherein the corresponding reactance is a fixed or variable capacitance.

53. The apparatus of claim 50, wherein the first plurality of coefficients are calibrated to provide a selected first frequency.

54. The apparatus of claim 50, further comprising:
a sensor responsive to at least one parameter of a plurality of variable parameters, the plurality of variable parameters comprising temperature, fabrication process, voltage, and age.

55. The apparatus of claim 54, further comprising:
a control circuit configured to determine, modify or select the first plurality of coefficients in response to a signal from the sensor.

56. The apparatus of claim 50, further comprising:
a frequency divider coupled to the reference oscillator and configured to provide an output reference signal having an output frequency determined from the first frequency and a divide value.

* * * * *

UNITED STATES PATENT AND TRADEMARK OFFICE
CERTIFICATE OF CORRECTION

| | | |
|---|---|---|
| PATENT NO. | : 7,786,812 B2 | Page 1 of 1 |
| APPLICATION NO. | : 12/258216 | |
| DATED | : August 31, 2010 | |
| INVENTOR(S) | : McCorquodale et al. | |

It is certified that error appears in the above-identified patent and that said Letters Patent is hereby corrected as shown below:

Column 1, Line 41; Please insert the following language before FIELD OF INVENTION:

-- GOVERNMENT FUNDING

This invention was made with Government support under NSF Grant (EEC) 9986866 awarded by the National Science Foundation. The Government has certain rights in this invention. --

Signed and Sealed this
Sixteenth Day of October, 2012

David J. Kappos
*Director of the United States Patent and Trademark Office*